(12) United States Patent
Yagi et al.

(10) Patent No.: US 11,953,829 B2
(45) Date of Patent: Apr. 9, 2024

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Kazunari Yagi, Haibara-gun (JP); Takashi Kawashima, Haibara-gun (JP); Tomotaka Tsuchimura, Haibara-gun (JP); Hajime Furutani, Haibara-gun (JP); Michihiro Shirakawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 878 days.

(21) Appl. No.: 16/797,035

(22) Filed: Feb. 21, 2020

(65) Prior Publication Data
US 2020/0192220 A1 Jun. 18, 2020

Related U.S. Application Data

(63) Continuation of application No. PCT/JP2018/032598, filed on Sep. 3, 2018.

(30) Foreign Application Priority Data

Sep. 20, 2017 (JP) .................................. 2017-180108
Jan. 12, 2018 (JP) .................................. 2018-003463

(51) Int. Cl.
| | |
|---|---|
| *G03F 7/004* | (2006.01) |
| *C08F 212/14* | (2006.01) |
| *C08F 220/28* | (2006.01) |
| *G03F 7/038* | (2006.01) |
| *G03F 7/039* | (2006.01) |
| *G03F 7/16* | (2006.01) |
| *G03F 7/20* | (2006.01) |
| *G03F 7/32* | (2006.01) |
| *G03F 7/38* | (2006.01) |

(52) U.S. Cl.
CPC .......... *G03F 7/0045* (2013.01); *C08F 212/24* (2020.02); *C08F 220/282* (2020.02); *G03F 7/0046* (2013.01); *G03F 7/038* (2013.01); *G03F 7/039* (2013.01); *G03F 7/168* (2013.01); *G03F 7/2004* (2013.01); *G03F 7/322* (2013.01); *G03F 7/38* (2013.01)

(58) Field of Classification Search
CPC .................................................... G03F 7/0045
See application file for complete search history.

(56) References Cited

U.S. PATENT DOCUMENTS

| | | | | |
|---|---|---|---|---|
| 2004/0053160 | A1* | 3/2004 | Takahashi | G03F 7/0397 430/921 |
| 2005/0277059 | A1 | 12/2005 | Kanda | |
| 2014/0072905 | A1 | 3/2014 | Tsuchimura et al. | |
| 2015/0086912 | A1* | 3/2015 | Kawabata | G03F 7/0397 526/287 |
| 2016/0147147 | A1* | 5/2016 | Hirano | G03F 7/0046 430/311 |
| 2016/0363859 | A1* | 12/2016 | Namai | G03F 7/0045 |
| 2017/0037167 | A1* | 2/2017 | Domon | G03F 7/2059 |
| 2017/0108774 | A1 | 4/2017 | Hatakeyama et al. | |

FOREIGN PATENT DOCUMENTS

| | | |
|---|---|---|
| CN | 106432574 A | 2/2017 |
| EP | 1 621 931 A1 | 2/2006 |
| JP | 2004-310004 A | 11/2004 |
| JP | 2012-237906 A | 12/2012 |
| JP | 2017-003927 A | 1/2017 |
| JP | 2017-031378 A | 2/2017 |
| JP | 2017-076049 A | 4/2017 |
| KR | 10-2016-0147644 A | 12/2016 |
| KR | 10-2017-0017790 A | 2/2017 |
| TW | 201643546 A | 12/2016 |

OTHER PUBLICATIONS

Forgan, Ross S. "Modulated Self-Assembly of Metal-Organic Framework" (2020), The Royal Society of Chemistry, Electronic Supplementary Material (ESI) for Chemical Science, p. S4 (Year: 2020).*
609-54-1(2,5-Dimethylbenzenesulfonic acid dihydrate) Product Description, 2017, ChemicalBook (Year: 2017).*
4-tert-Butylbenzoic acid, 2017, ChemicalBook (Year: 2017).*
Lide, David R. "Appendix C: Dissociation Constants and pKa Values for Acids at 25° C", 2003, CRC Press (Year: 2003).*
Notice of Reasons for Refusal dated Apr. 27, 2021 from the Japanese Patent Office in JP Application No. 2019-543527.
International Search Report dated Nov. 13, 2018 from the International Searching Authority in International Application No. PCT/JP2018/032598.
Written Opinion dated Nov. 13, 2018 from the International Bureau in International Application No. PCT/JP2018/032598.
International Preliminary Report on Patentability dated Mar. 24, 2020 from the International Bureau in International Application No. PCT/JP2018/032598.
Office Action dated Sep. 6, 2021 in Korean Application No. 10-2020-7004922.
Office Action dated Apr. 28, 2022 issued by the Taiwanese Patent Office in Taiwanese Application No. 107130859.

* cited by examiner

*Primary Examiner* — Mark F. Huff
*Assistant Examiner* — Nicholas E Brown
(74) *Attorney, Agent, or Firm* — Sughrue Mion, PLLC

(57) ABSTRACT

An actinic ray-sensitive or radiation-sensitive resin composition includes a resin having a repeating unit having a group in which a phenolic hydroxyl group is protected with an acid-leaving group; a first photoacid generator that generates an acid having a pKa of −2.00 to 2.00, in which in a case where the acid thus generated is a carboxylic acid, a pKa of the carboxylic acid is −2.00 or more and less than 1.00; and a second photoacid generator that generates a carboxylic acid having a pKa of 1.00 or more.

13 Claims, No Drawings

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2018/032598 filed on Sep. 3, 2018, which claims priority under 35 U.S.C § 119(a) to Japanese Patent Application No. 2017-180108 filed on Sep. 20, 2017, and Japanese Patent Application No. 2018-003463 filed on Jan. 12, 2018. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using an actinic ray-sensitive or radiation-sensitive resin composition has been performed. In recent years, formation of an ultrafine pattern in a submicron region or a quarter-micron region has been demanded in accordance with realization of a high degree of integration for integrated circuits. With such a demand, a tendency that an exposure wavelength has been shifted from g-rays to i-rays, and further, as with KrF excimer laser light, the exposure wavelength becomes shorter is observed. Moreover, developments in lithography with electron beams. X-rays, or extreme ultraviolet (EUV) rays, in addition to the excimer laser light, have also been currently proceeding.

For example, JP2012-237906A discloses a positive-tone resist composition containing a polymer compound having a structure in which a hydrogen atom of a phenolic hydroxyl group is substituted with an acid-labile group as an actinic ray-sensitive or radiation-sensitive resin composition.

SUMMARY OF THE INVENTION

A group in which a phenolic hydroxyl group is protected with an acid-leaving group has high reactivity and a resist film including a resin having a repeating unit with such a structure tends to have good sensitivity to exposure.

On the other hand, due to the high reactivity, there are problems in that an unintended reaction is likely to proceed for a waiting period until a transition to the next step after exposure, and the line width and the like of a pattern obtained are likely to be changed.

Hereinafter, the waiting until a transition to the next step after exposure is also referred to as "post-exposure delay".

The present inventors have conducted studies on a change in the line width of a pattern by post-exposure delay, and have thus found that in an attempt to solve such the problem, the line edge roughness (LER) performance of a pattern formed is likely to be deteriorated on the other hand.

Therefore, an object of the present invention is to provide an actinic ray-sensitive or radiation-sensitive resin composition which provides a pattern having excellent LER performance and is capable of suppressing a change in the line width of a pattern due to post-exposure delay.

In addition, another object of the present invention is to provide a resist film, a pattern forming method, and a method for manufacturing an electronic device, each using the actinic ray-sensitive or radiation-sensitive resin composition.

The present inventors have conducted extensive studies in order to accomplish the objects, and as a result, have found that the objects can be accomplished by incorporating two kinds of photoacid generators that generate an acid exhibiting a predetermined pKa into an actinic ray-sensitive or radiation-sensitive resin composition, thereby completing the present invention.

More specifically, the present inventors have found that the objects can be accomplished by the following configurations.

[1] An actinic ray-sensitive or radiation-sensitive resin composition comprising:
  a resin having a repeating unit having a group in which a phenolic hydroxyl group is protected with an acid-leaving group;
  a first photoacid generator that generates an acid having a pKa of −2.00 to 2.00, in which in a case where the acid thus generated is a carboxylic acid, a pKa of the carboxylic acid is −2.00 or more and less than 1.00; and
  a second photoacid generator that generates a carboxylic acid having a pKa of 1.00 or more.

[2] The actinic ray-sensitive or radiation-sensitive resin composition as described in [1],
  in which the repeating unit is a repeating unit represented by General Formula (1) which will be described later.

[3] The actinic ray-sensitive or radiation-sensitive resin composition as described in [1] or 121,
  in which the repeating unit is a repeating unit represented by General Formula (2) which will be described later.

[4] The actinic ray-sensitive or radiation-sensitive resin composition as described in any one of [1] to [3],
  in which the resin further has a repeating unit having a fluorine atom.

[5] The actinic ray-sensitive or radiation-sensitive resin composition as described in [4],
  in which the repeating unit having a fluorine atom has a hexafluoroisopropanol group.

[6] The actinic ray-sensitive or radiation-sensitive resin composition as described in any one of [1] to [5],
  in which the resin further has a repeating unit having a lactone structure.

[7] The actinic ray-sensitive or radiation-sensitive resin composition as described in any one of [1] to [6],
  in which the first photoacid generator is a photoacid generator that generates benzenesulfonic acid which may have a substituent.

[8] The actinic ray-sensitive or radiation-sensitive resin composition as described in any one of [1] to [7],
  in which the first photoacid generator is formed of an anion and a cation, and the anion has a cyclic acetal structure.

[9] The actinic ray-sensitive or radiation-sensitive resin composition as described in any one of [1] to [8],
  in which the second photoacid generator is a photoacid generator that generates benzenecarboxylic acid which may have a substituent.

[10] The actinic ray-sensitive or radiation-sensitive resin composition as described in [9],
  in which the benzenecarboxylic acid has the substituent which is a fluorine atom or a group including a fluorine atom.

[11] The actinic ray-sensitive or radiation-sensitive resin composition as described in [9] or [10],
  in which the second photoacid generator is a compound represented by General Formula (F) which will be described later, the compound formed of an anion and a cation.

[12] The actinic ray-sensitive or radiation-sensitive resin composition as described in [11],
  in which in General Formula (F) which will be described later, M$^+$ is a sulfonium cation or an iodonium cation.

[13] The actinic ray-sensitive or radiation-sensitive resin composition as described in [12],
  in which in General Formula (F) which will be described later, M$^+$ is a triarylsulfonium cation.

[14] The actinic ray-sensitive or radiation-sensitive resin composition as described in any one of [11] to [13],
  in which in General Formula (F) which will be described later, Rp represents a fluorine atom or a perfluoroalkyl group, and Rq represents an alkyl group having 1 to 20 carbon atoms, an alkoxy group having 1 to 20 carbon atoms, a carboxyl group, a hydroxyl group, or a halogen atom other than a fluorine atom.

[15] A resist film formed with the actinic ray-sensitive or radiation-sensitive resin composition as described in any one of [1] to [14].

[16] A pattern forming method comprising:
  a step of forming a resist film with the actinic ray-sensitive or radiation-sensitive resin composition as described in any one of [1] to [14];
  exposing the resist film;
  heating the exposed resist film; and
  developing the heated resist film with a developer.

[17] A method for manufacturing an electronic device, the method comprising the pattern forming method as described in [16].

According to the present invention, it is possible to provide an actinic ray-sensitive or radiation-sensitive resin composition which provides a pattern having excellent LER performance and is capable of suppressing a change in the line width of a pattern due to post-exposure delay.

In addition, according to the present invention, it is possible to provide a resist film, a pattern forming method, and a method for manufacturing an electronic device, each using the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, EUV rays, X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, extreme ultraviolet rays (EUV rays), X-rays, or the like, but also lithography by particle rays such as electron beams and ion beams.

In the present specification, "to" is used to mean a range that includes the preceding and succeeding numerical values of "to" as the lower limit value and the upper limit value, respectively.

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

The acid dissociation constant pKa indicates an acid dissociation constant pKa in an aqueous solution, and is defined, for example, in Chemical Handbook (II) (Revised 4$^{th}$ Edition, 1993, compiled by the Chemical Society of Japan, Maruzen Company, Ltd.). A lower value of the acid dissociation constant pKa indicates higher acid strength. Specifically, the acid dissociation constant pKa in an aqueous solution can be measured using an infinite-dilution aqueous solution and measuring an acid dissociation constant at 25° C. Alternatively, the value based on a Hammett substituent constant below and the database of publicly known literature values can also be determined by computation using the following software package 1. All of the values of pKa described in the present specification indicate values determined by computation using this software package.

Software Package 1: Advanced Chemistry Development (ACD/Labs) Software V 8.14 for Solaris (1994-2007 ACD/Labs).

In the present specification, the weight-average molecular weight (Mw), the number-average molecular weight (Mn), and the dispersity (also referred to as a molecular weight distribution) (Mw/Mn) of a resin are each defined as values in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

Moreover, in a case where "which may have a substituent", "which has a substituent", and the like are simply referred to in the present specification, the type of substituent, the position of the substituent, and the number of the substituents are not particularly limited. The number of the substituents may be, for example, one, or two or more. Examples of the substituent include a monovalent non-metal atomic group from which a hydrogen atom has been removed, and the substituent can be selected from, for example, the following substituent T.

(Substituent T)

Examples of the substituent T include halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

[Resist Composition]

In the actinic ray-sensitive or radiation-sensitive resin composition of an embodiment of the present invention (hereinafter also referred to as a "resist composition"), a combination of a first photoacid generator and a second photoacid generator are used in combination.

The present inventors have presumed that since the type of an acid generated from each of the photoacid generators and the pKa are appropriately adjusted, a pattern having excellent LER performance is obtained and a change in the line width of a pattern by post-exposure delay can be suppressed.

In addition, the present inventors have also discovered that in a case where a repeating unit in which a phenolic hydroxyl group is protected with an acid-leaving group has a specific structure, the sensitivity of a resist film can be improved.

Hereinafter, the components included in the resist composition of the embodiment of the present invention will be described in detail. Furthermore, the resist composition of the embodiment of the present invention is a so-called resist composition, and may be either a positive-tone resist composition or a negative-tone resist composition. In addition, the composition of the embodiment of the present invention may be either a resist composition for alkali development or a resist composition for organic solvent development. Among those, the positive-tone resist composition which is the resist composition for alkali development is preferable.

The resist composition of the embodiment of the present invention is typically a chemically amplified resist composition.

<Resin (A)>

The resist composition of the embodiment of the present invention includes a resin (hereinafter also referred to as a "resin (A)") which has a repeating unit having a group in which a phenolic hydroxyl group is protected with an acid-leaving group.

(Repeating Unit Having Group in which Phenolic Hydroxyl Group is Protected with Acid-Leaving Group)

The resin (A) has a repeating unit having a group in which a phenolic hydroxyl group is protected with an acid-leaving group. The acid-leaving group is a group that leaves by the action of an acid. The acid-leaving group substitutes a hydrogen atom contained in the phenolic hydroxyl group to form an acid-decomposable group.

Typically, the resin (A) is a resin which is sparingly soluble or insoluble in an alkali, and the acid-leaving group leaves from the resin by the action of an acid to increase the solubility in the alkali.

Examples of the acid-leaving group include groups represented by (A) to (E) shown below.

(A) —C($R_{36}$)($R_{37}$)($R_{38}$)
(B) —C(=O)—O—C($R_{36}$)($R_{37}$)($R_{38}$)
(C) —C($R_{01}$)($R_{02}$)(O$R_{39}$)
(D) —C($R_{01}$)($R_{02}$)—C(=O)—O—C($R_{36}$)($R_{37}$)($R_{38}$)
(E) —CH($R_{36}$)(Ar)

In the formulae, $R_{36}$ to $R_{39}$ each independently represent an alkyl group, a cycloalkyl group, an aromatic ring group, a group formed by combination of an alkylene group and an aromatic ring group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aromatic ring group, a group formed by combination of an alkylene group and an aromatic ring group, or an alkenyl group.

Ar represents an aromatic ring group.

The alkyl group of each of $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of each of $R_{36}$ to $R_{39}$, $R_{01}$, and $R_{02}$ may be either a monocycle or a polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an α-pinel group, a tricyclodecanyl group, a tetracyclododecyl group and an androstanyl group. Incidentally, some of carbon atoms in the cycloalkyl group may be substituted with heteroatoms such as an oxygen atom.

The aromatic ring group of each of $R_{36}$ to $R_{39}$, $R_{01}$, $R_{02}$, and Ar is preferably a monovalent aromatic ring group having 6 to 10 carbon atoms, and examples thereof include an aril group such as a phenyl group, a naphthyl group, and an anthryl group, and an aromatic ring group including a heterocycle, such as thiophene, furan, pyrrole, benzothiophene, benzofuran, benzopyrrole, triazine, imidazole, benzimidazole, triazole, thiadiazole, and thiazole.

As the group formed by combination of an alkylene group and an aromatic ring group of each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

An alkenyl group as each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

A ring formed by the bonding of $R_{36}$ and $R_{37}$ may be either a monocycle or a polycycle. As the monocycle, a cycloalkyl ring having 3 to 8 carbon atoms is preferable, and examples thereof include a cyclopropane ring, a cyclobutane ring, a cyclopentane ring, a cyclohexane ring, a cycloheptane ring, and a cyclooctane ring. As the polycycle, a cycloalkyl ring having 6 to 20 carbon atoms is preferable, and examples thereof include an adamantane ring, a norbornane ring, a dicyclopentane ring, a tricyclodecane ring, and a tetracyclododecane ring. Further, some of carbon atoms of the cycloalkyl ring may be substituted with a heteroatom such as an oxygen atom.

Each of the groups as $R_{36}$ to $R_{39}$, $R_{01}$, $R_{02}$, and Ar may have a substituent, and the number of carbon atoms of the substituent is preferably 8 or less.

General Formula (A)

The repeating unit having a group in which a phenolic hydroxyl group is protected with an acid-leaving group is preferably a repeating unit represented by General Formula (A).

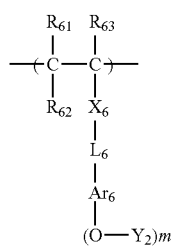

In General Formula (A), $R_{61}$, $R_{62}$, and $R_{63}$ each independently represent a hydrogen atom, an alkyl group, a cycloalkyl group, a halogen atom, a cyano group, or an alkoxycarbonyl group.

Among those, $R_{61}$, $R_{62}$, and $R_{63}$ are each preferably the hydrogen atom.

As the alkyl group of each of $R_{61}$, $R_{62}$ and $R_{63}$, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, is preferable, and an alkyl group having 8 or less carbon atoms is more preferable.

As the alkyl group included in the alkoxycarbonyl group, the same group as the alkyl group in each of $R_{61}$, $R_{62}$, and $R_{63}$ is preferable.

The cycloalkyl group may be either a monocycle or a polycycle, and is preferably a monocyclic cycloalkyl group having 3 to 8 carbon atoms, such as a cyclopropyl group, a cyclopentyl group, and a cyclohexyl group.

As the halogen atom, a fluorine atom is preferable.

$R_{62}$ may be bonded to $Ar_6$ or $L_6$ which will be described later to form a ring, and in this case, $R_{62}$ represents a single bond or an alkylene group.

Examples of the alkylene group include an alkylene group having 1 to 8 carbon atoms, such as a methylene group, an ethylene group, a propylene group, butylene group, a hexylene group, and octylene group.

$X_6$ represents a single bond, —COO—, or —CONR—.

$R_{64}$ represents a hydrogen atom or an alkyl group.

As the alkyl group, the same alkyl group as the alkyl group in each of $R_{61}$ to $R_{63}$ is preferable.

As $X_6$, the single bond, —COO—, or —CONH— is preferable, the single bond or —COO— is more preferable, and the single bond is still more preferable.

$L_6$ represents a single bond or a divalent linking group, and in a case where $L_6$ is bonded to $R_{62}$ to form a ring, $L_6$ represents a trivalent linking group.

Examples of the divalent linking group include an ether group, a carbonyl group, an ester group, a thioether group, —SO$_2$—, —NR— (R represents a hydrogen atom or an alkyl group), a divalent hydrocarbon group (for example, an alkylene group, an alkenylene group (for example, —CH═CH—), an alkynylene group (for example, —C≡C—), and an arylene group), and a group formed by combination thereof.

Among those, as the divalent linking group, the alkylene group is preferable, and as the alkylene group, an alkylene group having 1 to 8 carbon atoms, such as a methylene group, an ethylene group, a propylene group, a butylene group, a hexylene group, and an octylene group, is more preferable.

The ring formed by the bonding of $R_{62}$ and $L_6$ is preferably a 5- or 6-membered ring.

Among those, $L_6$ is preferably the single bond.

$Ar_6$ represents an (m+1)-valent aromatic ring group, and in a case where $Ar_6$ is bonded to $R_{62}$ to form a ring, $Ar_e$ represents an (m+2)-valent aromatic ring group.

As the aromatic ring group, an aromatic hydrocarbon ring group having 6 to 18 carbon atoms, such as a phenylene ring group, a tolylene ring group, a naphthylene ring group, and an anthracenylene ring group, or an aromatic heterocyclic group including a heterocycle, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group, is preferable.

Among those, $Ar_6$ is preferably the aromatic hydrocarbon ring group having 6 to 18 carbon atoms, and more preferably a benzene ring group not having a substituent other than a group represented by —(O—Y$_2$)m.

$Y_2$ represents a hydrogen atom or an acid-leaving group. In a case where m is 2 or more, $Y_2$'s which are present in plural number may be the same as or different from each other.

Examples of the acid-leaving group include the above-mentioned acid-leaving groups.

It should be noted that at least one of $Y_2$'s represents an acid-leaving group.

m represents an integer of 1 to 4.

m is preferably 1 or 2, and more preferably 1.

Examples of a substituent which can be contained in the above-mentioned alkyl group, cycloalkyl group, alkoxycarbonyl group, alkylene group, aromatic ring group, and aromatic hydrocarbon group include the above-mentioned substituent T. Further, the number of carbon atoms described in the above-mentioned alkyl group, cycloalkyl group, alkoxycarbonyl group, alkylene group, aromatic ring group, and aromatic hydrocarbon group, and the like do not include the number of carbon atoms contained in the substituent.

General Formula (1)

From the viewpoint that the sensitivity of the resist film is excellent, it is more preferable that the repeating unit having a group in which a phenolic hydroxyl group is protected with an acid-leaving group is a repeating unit represented by General Formula (1).

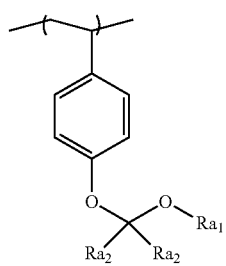

In General Formula (1), $Ra_1$ represents an alkyl group which may have a substituent.

$Ra_2$'s each independently represent a hydrogen atom, or an alkyl group which may have a substituent.

The alkyl group which can be represented by each of $Ra_1$ and $Ra_2$ may be linear or branched, or may have a cyclic structure. The cyclic structure may be either a monocycle or a polycycle.

The number of carbon atoms of the alkyl group of $Ra_1$ is preferably 1 to 10, more preferably 1 to 6, and still more preferably 3. The alkyl group of $Ra_1$ is preferably linear.

In a case where two $Ra_2$'s are present, it is preferable that one of the two alkyl groups is an alkyl group. The number of carbon atoms of the alkyl group of $Ra_2$ is preferably 1 to 10, more preferably 1 to 6, and still more preferably 4. The alkyl group of $Ra_2$ is preferably branched, and more preferably a tert-butyl group.

General Formula (2)

From the viewpoint that the sensitivity of the resist film is excellent, it is still more preferable that the repeating unit having a group in which a phenolic hydroxyl group is protected with an acid-leaving group is a repeating unit represented by General Formula (2).

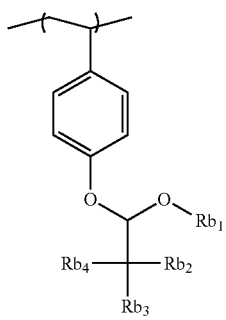

(2)

In General Formula (2), $R_{b1}$ to $R_{b4}$ each independently represent an alkyl group which may have a substituent.

The alkyl group may be linear or branched, or may have a cyclic structure. The cyclic structure may be either a monocycle or a polycycle.

$Rb_1$ is preferably an alkyl group. The number of carbon atoms of the alkyl group of $Rb_1$ is preferably 1 to 10, more preferably 1 to 6, and still more preferably 3. The alkyl group of $Rb_1$ is preferably linear.

The numbers of carbon atoms of the alkyl groups of $Rb_2$ to $Rb_4$ are each independently preferably 1 to 4, more preferably 1 or 2, and still more preferably 1. The total number of carbon atoms of the alkyl groups of $Rb_2$ to $Rb_4$ is preferably 3 to 9, more preferably 3 to 5, and still more preferably 3.

The repeating units having a group in which a phenolic hydroxyl group is protected with an acid-leaving group may be used singly or in combination of two or more kinds thereof. Further, the resin (A) may have a repeating unit having an acid-decomposable group, in addition to the repeating unit having a group in which a phenolic hydroxyl group is protected with an acid-leaving group.

The content of the repeating unit having a group in which a phenolic hydroxyl group (a total content thereof in a case where a plurality of kinds of the repeating units are present) is protected with an acid-leaving group (preferably a repeating unit represented by General Formula (A), more preferably a repeating unit represented by General Formula (1), and still more preferably a repeating unit represented by General Formula (2)) in the resin (A) is preferably 10% to 60% by mole, more preferably 20% to 50% by mole, and still more preferably 25% to 45% by mole, with respect to all the repeating units of the resin (A).

(Repeating Unit Having Lactone Structure)

From the viewpoint that the LER performance of a pattern is more excellent, it is also preferable that the resin (A) further has a repeating unit having a lactone structure.

As the lactone structure, a 5- to 7-membered ring lactone structure is preferable, and a 5- to 7-membered ring lactone structure to which another ring structure is fused in the form of forming a bicyclo structure or a spiro structure is more preferable. The resin (A) more preferably has a repeating unit having a lactone structure represented by any one of General Formulae (LC1-1) to (LC1-22). Further, the lactone structure may be bonded directly to the main chain. As the lactone structure, the structure represented by General Formula (LC1-1), General Formula (LC1-4), General Formula (LC1-5), General Formula (LC1-6), General Formula (LC1-13), General Formula (LC1-14), or General Formula (LC1-22) is preferable.

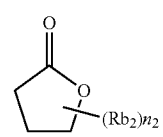

LC1-1

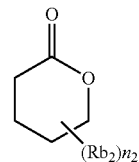

LC1-2

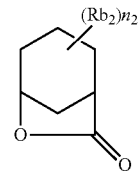

LC1-3

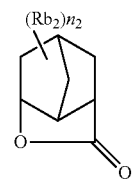

LC1-4

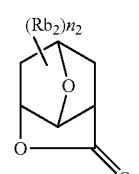

LC1-5

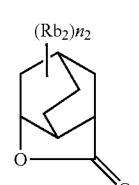

LC1-6

-continued

LC1-7
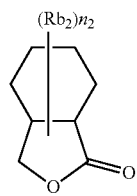

LC1-8
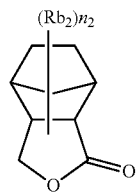

LC1-9
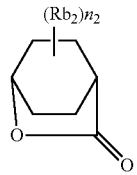

LC1-10
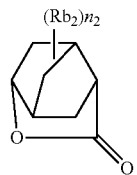

LC1-11
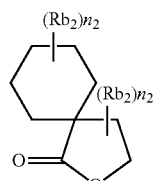

LC1-12
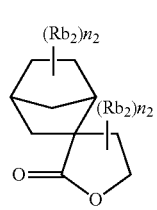

LC1-13
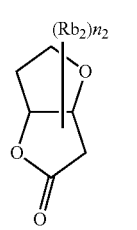

LC1-14
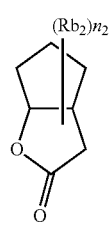

LC1-15
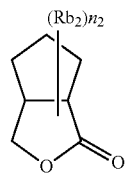

LC1-16
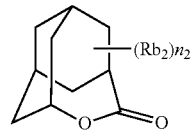

LC1-17
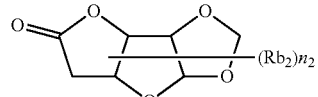

LC1-18
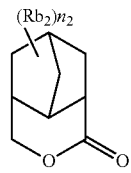

LC1-19
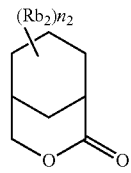

LC1-20
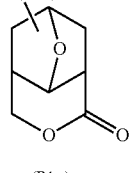

LC1-21
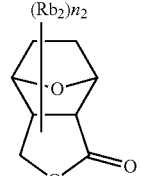

LC1-22
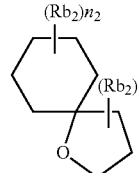

The lactone structural moiety may have a substituent ($Rb_2$). As the substituent ($Rb_2$), an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom (excluding a fluorine atom), a hydroxyl group, a cyano group, and an acid-decomposable group (more preferably a group in which a polar group is protected with an acid-leaving group) are preferable. $n_2$ represents an integer of 0 to 4. In a case where $n_2$ is 2 or more, $Rb_2$'s which are present in plural number may be different from each other, and $Rb_2$'s which are present in plural number may be bonded to each other to form a ring.

General Formula (AI)

Examples of the repeating unit having a lactone structure include a repeating unit represented by General Formula (AI).

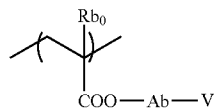
(AI)

In General Formula (AI), $Rb_0$ represents a hydrogen atom or an alkyl group having 1 to 4 carbon atoms.

As the substituent which may be contained in the alkyl group of $Rb_0$, a hydroxyl group is preferable.

$Rb_0$ is preferably a hydrogen atom or a methyl group.

Ab represents a single bond, an alkylene group, a divalent linking group having a monocyclic or polycyclic alicyclic hydrocarbon group, an ether group, an ester group, a carbonyl group, a carboxyl group, or a divalent group formed by combination thereof. Among those, the single bond or the linking group represented by -$Ab_1$-COO— is preferable. $Ab_1$ is a linear or branched alkylene group, or a monocyclic or polycyclic cycloalkylene group, and preferably a methylene group, an ethylene group, a cyclohexylene group, an adamantylene group, or a norbornylene group.

V represents a group formed by removing any one hydrogen atom from the lactone structure represented by any one of General Formula (LC1-1), . . . , or General Formula (LC1-22).

The repeating unit having a lactone structure usually has optical isomers, but any of the optical isomers may be used. In addition, one optical isomer may be used singly or a mixture of a plurality of the optical isomers may be used. In a case where one optical isomer is mainly used, an optical purity (ee) thereof is preferably 90 or more, and more preferably 95 or more.

Examples of the repeating unit having a lactone structure (or a monomer corresponding to the repeating unit) are shown below. In the formulae, Rx represents a hydrogen atom. $CH_3$, or $CH_2OH$.

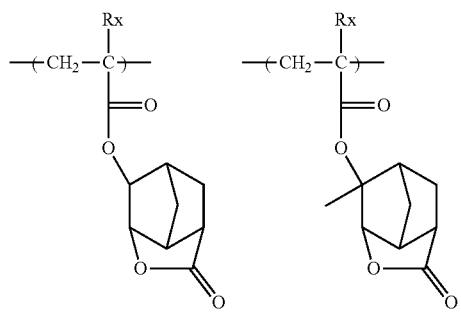

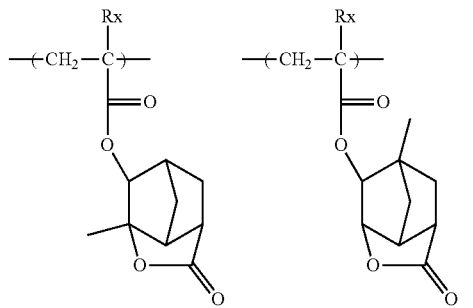

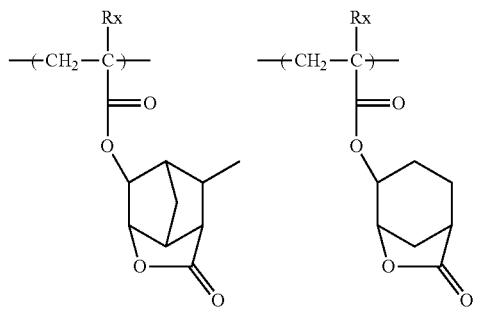

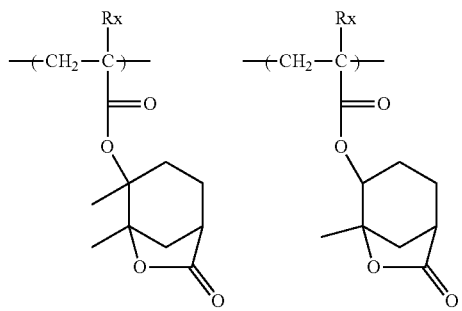

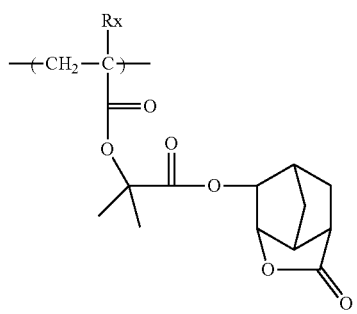

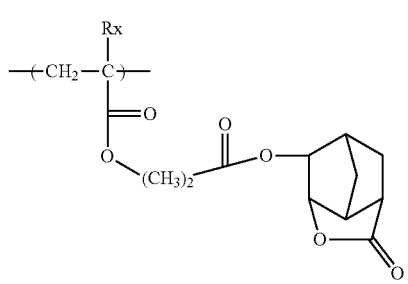

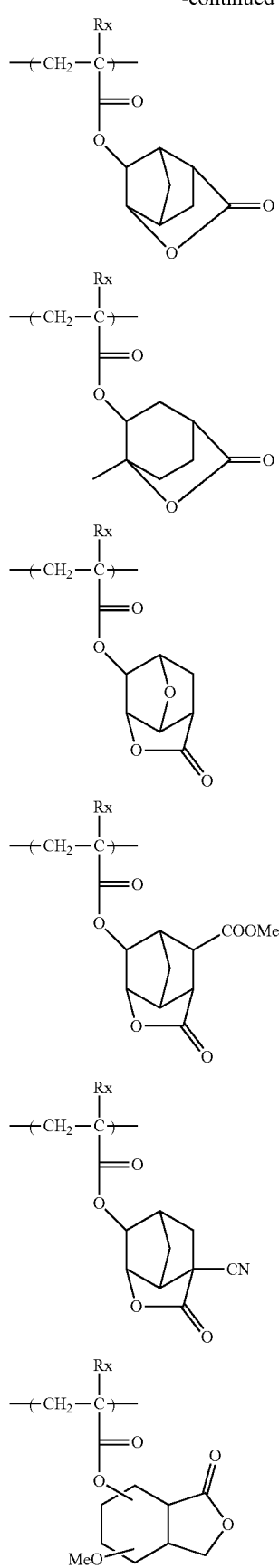
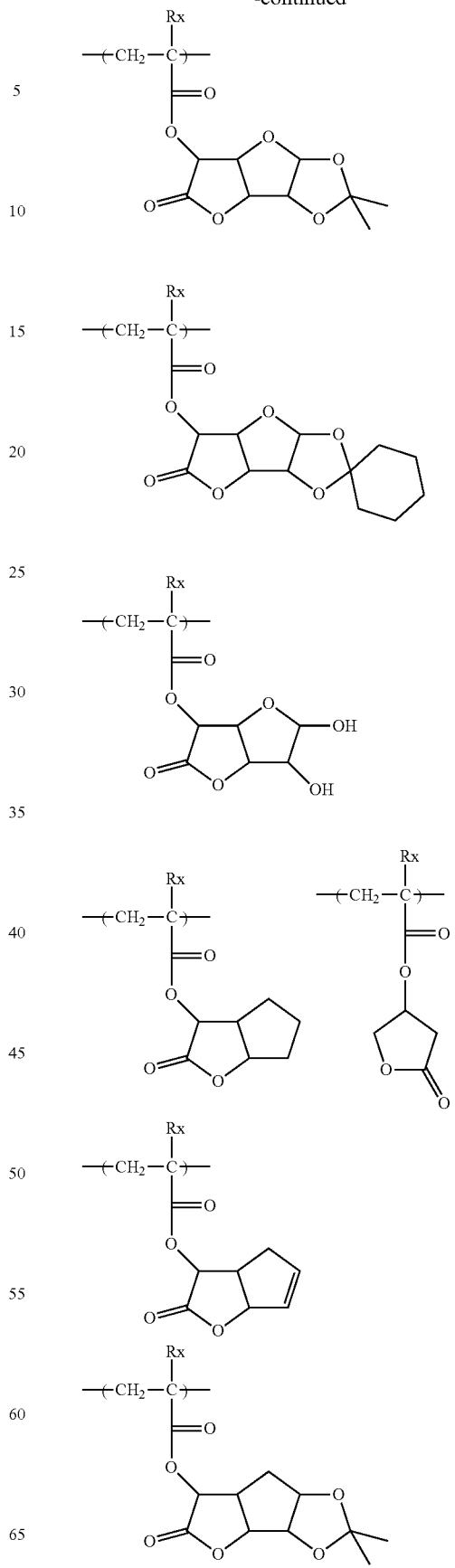

-continued

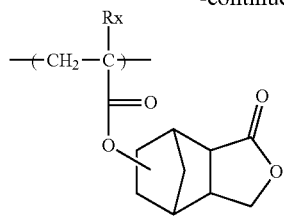

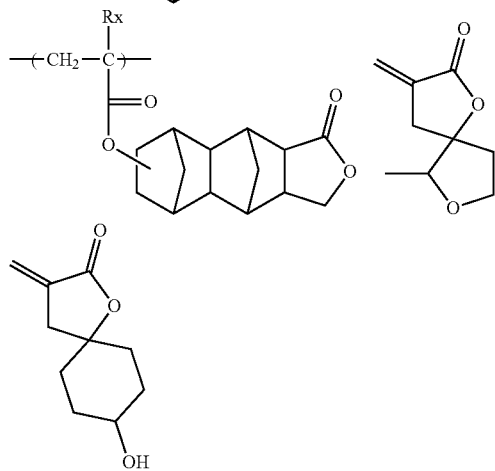

The repeating units having a lactone structure may be used singly or in combination of two or more kinds thereof.

In a case where the resin (A) has the repeating unit having a lactone structure, the content of the repeating unit having a lactone structure (a total content thereof in a case where a plurality of kinds of the repeating units are present) is preferably 5% to 35% by mole, more preferably 10% to 30% by mole, and still more preferably 20% to 30% by mole, with respect to all the repeating units of the resin (A).

(Repeating Unit Having Fluorine Atom)

From the viewpoint that the LER performance of a pattern is more excellent, it is preferable that the resin (A) further has a repeating unit having a fluorine atom, in addition to the above-mentioned repeating unit.

The repeating unit is not particularly limited as long as it has a fluorine atom, and for example, it may have an acid group, a group whose solubility in an alkali developer increases through decomposition by the action of an alkali developer, or an acid-leaving group.

In addition, the fluorine atom may be contained in the main chain or a side chain of the repeating unit.

The repeating unit having a fluorine atom preferably has an alkyl group having a fluorine atom, a cycloalkyl group having a fluorine atom, or an aryl group having a fluorine atom.

Moreover, from the viewpoint that the LER performance of a pattern is more excellent, the fluorine atom preferably forms an acid group, more preferably forms a fluorinated alcohol group, and still more preferably forms a hexafluoroisopropanol group, together with another atom.

Examples of the group whose solubility in an alkali developer increases through decomposition by the action of an alkali developer include the above-mentioned group having a lactone structure.

For example, the repeating unit having a fluorine atom preferably has a group having a structure represented by any one of General Formula (LC1-1), . . . , or General Formula (LC1-22), in which the substituent ($Rb_2$) has a fluorine atom.

Among those, as the repeating unit having a fluorine atom, the above-mentioned repeating unit represented by General Formula (AI), in which V is a group formed by removing any one hydrogen atom from the lactone structure represented by any one of General Formula (LC1-1), . . . , or General Formula (LC1-22) and having a fluorine atom as the substituent ($Rb_2$) is more preferable.

Examples of the repeating unit having a fluorine atom (or a monomer corresponding to the repeating unit) are shown below.

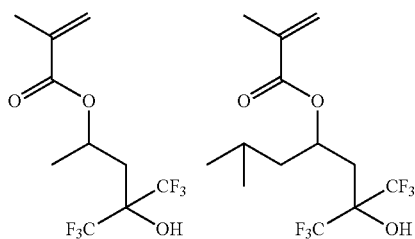

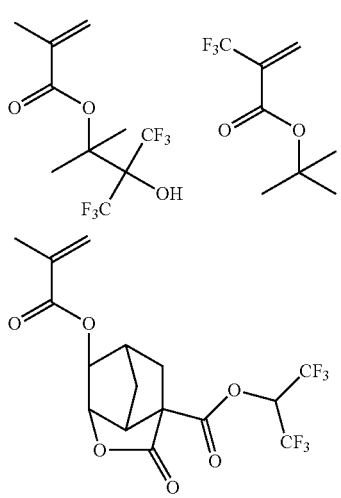

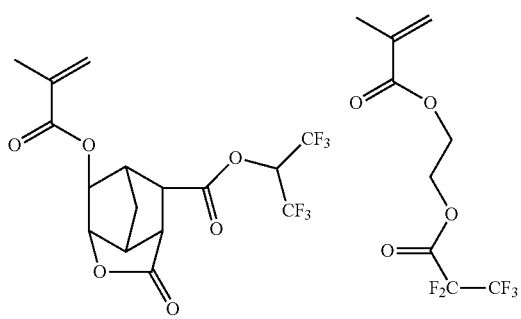

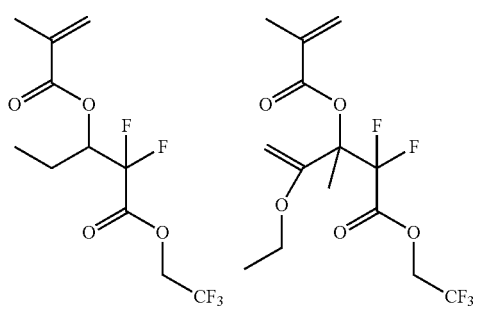

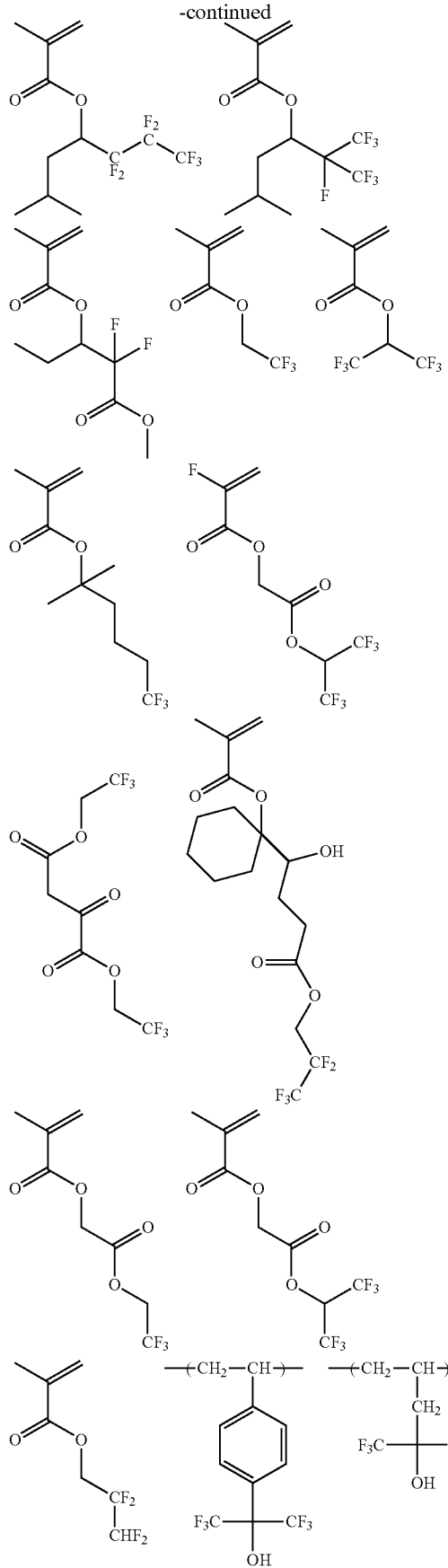
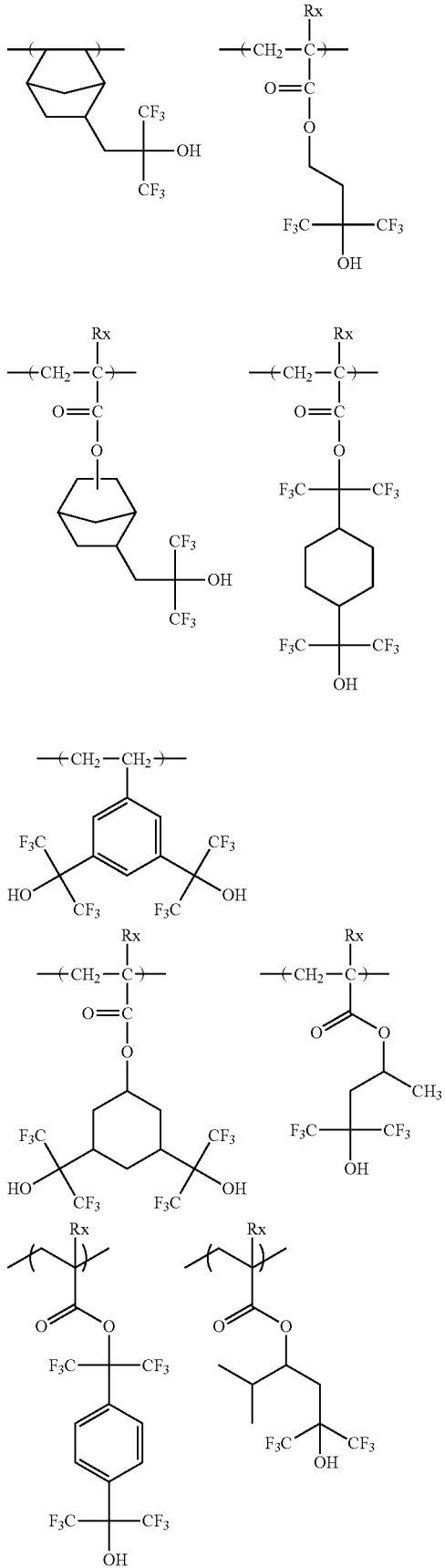

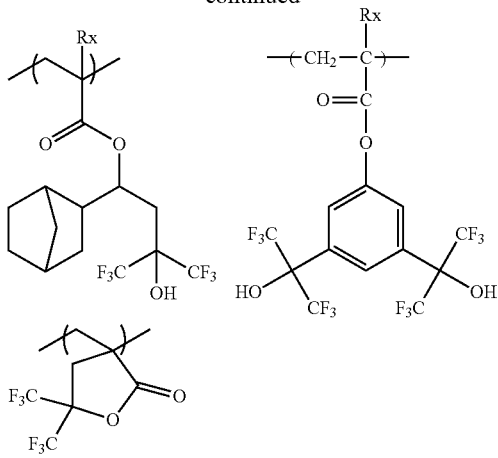

In the formulae, Rx represents a hydrogen atom. CH₃, CF₃, or CH₂OH.

The repeating unit having a fluorine atom may be used singly or in combination of two or more kinds thereof.

In a case where the resin (A) has a repeating unit having a fluorine atom, the content of the repeating unit having a fluorine atom is preferably 5% to 70% by mole, more preferably 10% to 65% by mole, and still more preferably 20% to 60% by mole, with respect to all the repeating units of the resin (A).

(Repeating Unit Having Phenolic Hydroxyl Group)

From the viewpoint of a balance in performance, it is also preferable that the resin (A) has a repeating unit having a phenolic hydroxyl group, in addition to the above-mentioned repeating unit.

General Formula (I)

The repeating unit having a phenolic hydroxyl group is preferably a repeating unit represented by General Formula (I).

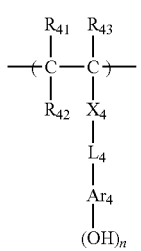

(I)

n represents an integer of 1 to 5.

$R_{41}$, $R_{42}$, and $R_{43}$ each independently represent a hydrogen atom, an alkyl group, a cycloalkyl group, a halogen atom, a cyano group, or an alkoxycarbonyl group.

Among those, $R_{41}$, $R_{42}$, and $R_{43}$ are each preferably a hydrogen atom.

As the alkyl group of each of $R_{41}$, $R_{42}$, and $R_{43}$, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, and an alkyl group having 8 or less carbon atoms is more preferable.

It is preferable that the alkyl group included in the alkoxycarbonyl group is the same group as the alkyl group in each of $R_{41}$, $R_{42}$, and $R_{43}$.

The cycloalkyl group may be either a monocycle or a polycycle, and is preferably a monocyclic cycloalkyl group having 3 to 8 carbon atoms, such as a cyclopropyl group, a cyclopentyl group, and a cyclohexyl group.

As the halogen atom, a fluorine atom is preferable.

$R_{42}$ may be bonded to $Ar_4$ or $L_4$ which will be described later to form a ring, and in this case, $R_{42}$ represents a single bond or an alkylene group.

Examples of the alkylene group include an alkylene group having 1 to 8 carbon atoms, such as a methylene group, an ethylene group, a propylene group, butylene group, a hexylene group, and octylene group.

$X_4$ represents a single bond, —COO—, or —CONR₄₄—.

$R_{44}$ represents a hydrogen atom or an alkyl group.

As the alkyl group, the same alkyl group as the alkyl group in each of $R_{41}$ to $R_{43}$ is preferable.

As $X_4$, the single bond. —COO—, or —CONH— is preferable, the single bond or —COO— is more preferable, and the single bond is still more preferable.

$L_4$ represents a single bond or a divalent linking group, and in a case where $L_4$ is bonded to $R_{42}$ to form a ring, $L_4$ represents a trivalent linking group.

Examples of the divalent linking group include an ether group, a carbonyl group, an ester group, a thioether group, —SO₂—, —NR— (R represents a hydrogen atom or an alkyl group), a divalent hydrocarbon group (for example, an alkylene group, an alkenylene group (for example, —CH=CH—), an alkynylene group (for example, —C≡C—), and an arylene group), and a group formed by combination thereof.

Among those, as the divalent linking group, the alkylene group is preferable, and as the alkylene group, an alkylene group having 1 to 8 carbon atoms, such as a methylene group, an ethylene group, a propylene group, a butylene group, a hexylene group, and an octylene group, is more preferable.

The ring formed by the bonding of $R_{42}$ and $L_4$ is preferably a 5- or 6-membered ring.

Among those, $L_4$ is preferably the single bond.

$Ar_4$ represents an (n+1)-valent aromatic ring group, and in a case where $Ar_4$ is bonded to $R_{42}$ to form a ring, $Ar_4$ represents an (n+2)-valent aromatic ring group.

As the aromatic ring group, an aromatic hydrocarbon ring group having 6 to 18 carbon atoms, such as a phenylene ring group, a tolylene ring group, a naphthylene ring group, and an anthracenylene ring group, or an aromatic heterocyclic group including a heterocyclic group, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group, is preferable.

Among those, $Ar_4$ is preferably the aromatic hydrocarbon ring group having 6 to 18 carbon atoms, and more preferably a benzene ring group.

n represents an integer of 1 to 4.

n is preferably 1 or 2, and more preferably 1.

Examples of a substituent which can be contained in the above-mentioned alkyl group, cycloalkyl group, alkoxycarbonyl group, alkylene group, aromatic ring group, and aromatic hydrocarbon group, and the like include the above-mentioned substituent T. Further, the number of carbon atoms described in the above-mentioned alkyl group, cycloalkyl group, alkoxycarbonyl group, alkylene group, aromatic ring group, and aromatic hydrocarbon group, and the like do not include the number of carbon atoms contained in the substituent.
Examples of the repeating unit having a phenolic hydroxyl group are shown below. In the formulae, a represents 1 or 2.
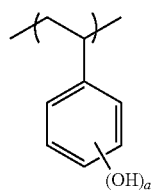
(B-1)
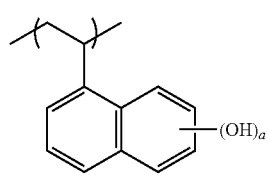
(B-2)
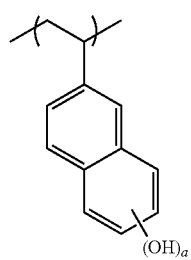
(B-3)
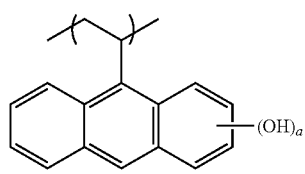
(B-4)
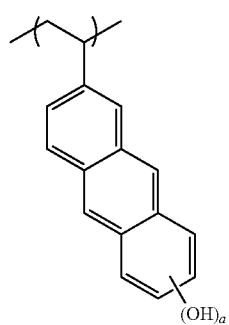
(B-5)
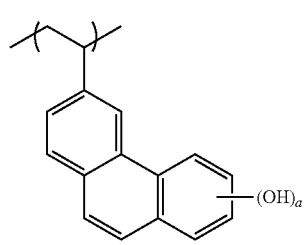
(B-6)
-continued
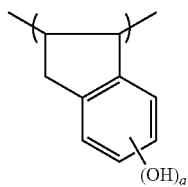
(B-7)
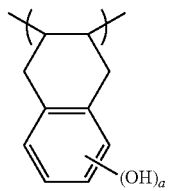
(B-8)
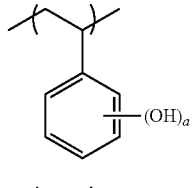
(B-9)
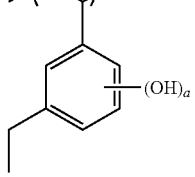
(B-10)
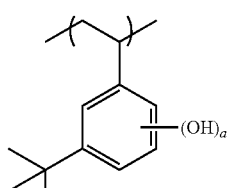
(B-11)
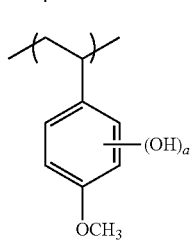
(B-12)
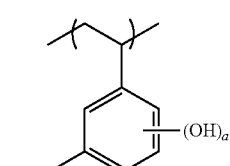
(B-13)
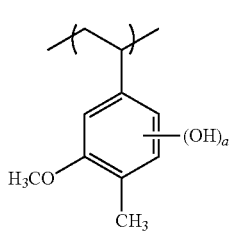
(B-14)

(B-15)
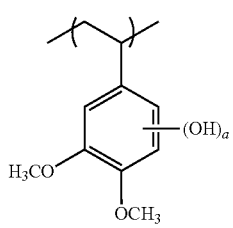
(B-16)
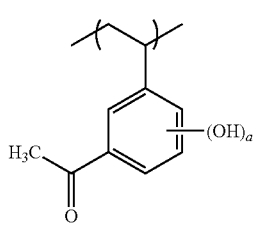
(B-17)
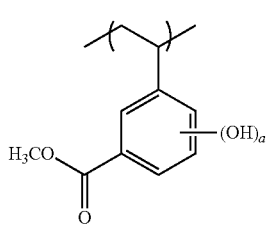
(B-18)
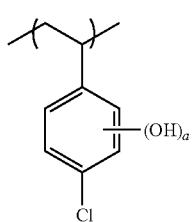
(B19)
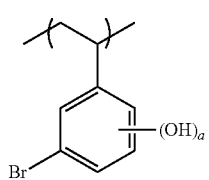
(B-20)
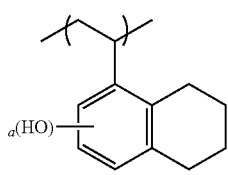
(B-21)
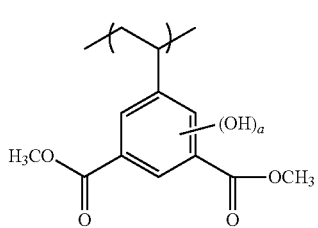
(B-22)
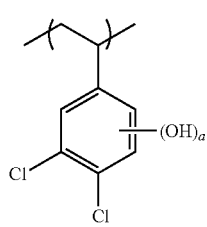
(B-23)
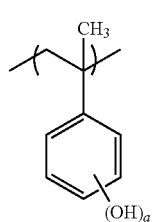
(B-24)
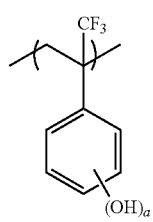
(B-25)
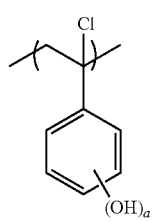
(B-26)
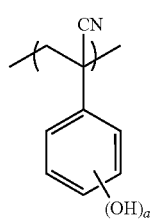
(B-27)
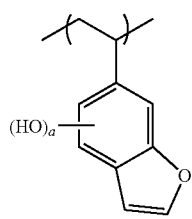
(B-28)
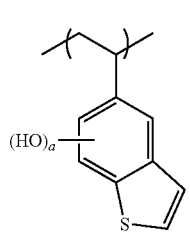

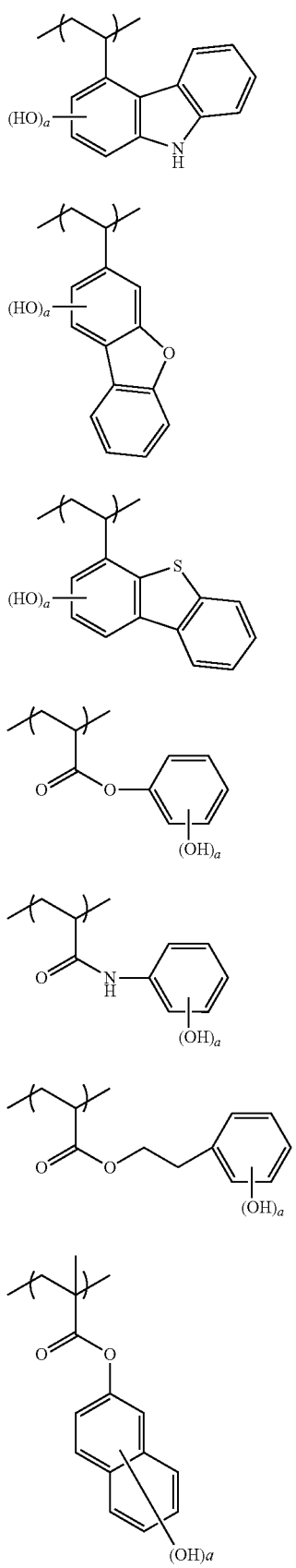
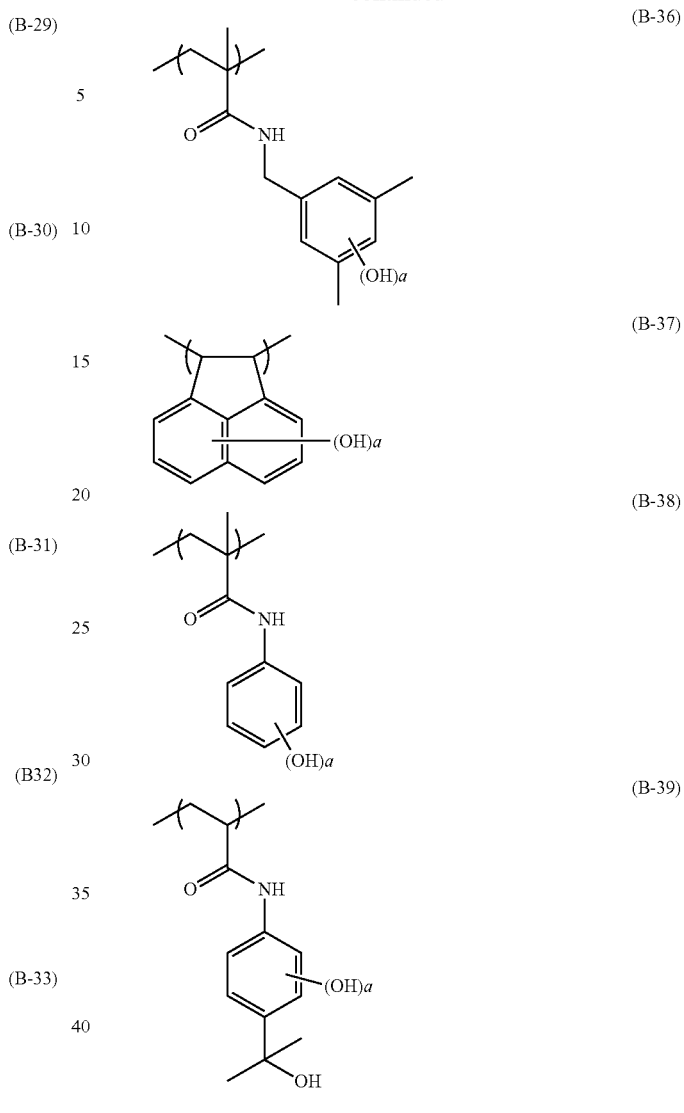

In a case where the resin (A) has a repeating unit having a phenolic hydroxyl group, the content of the repeating unit having a phenolic hydroxyl group is preferably 30% to 75% by mole, more preferably 4010 to 70 by mole, and still more preferably 45% to 65% by mole, with respect to all the repeating units of the resin (A).

(Tg)

From the viewpoint that it is possible to suppress excessive diffusion of an acid generated from a first photoacid generator which will be described later and/or a second photoacid generator which will be described later or patter collapse upon development, it is preferable that the resin (A) has a high glass transition temperature (Tg). The Tg is preferably 90° C. or higher, more preferably 100° C. or higher, still more preferably 110° C. or higher, and particularly preferably of 125° C. or higher. Further, since an extreme increase in the Tg causes a decrease in a dissolution rate in a developer, the Tg is preferably 400° C. or lower, and more preferably 350° C. or lower.

Furthermore, in the present specification, the glass transition temperature (Tg) of a polymer such as the resin (A) is calculated, by the following method. First, the Tg of a homopolymer consisting only of each repeating unit included in the polymer is each calculated by a Bicerano method. Hereinafter, the calculated Tg is referred to as "Tg of a repeating unit". Next, a mass ratio (%) of each repeating unit to all the repeating units in the polymer is calculated. Next, products of the Tg of each repeating unit and the mass ratio of the repeating unit are each calculated, and they are summed to obtain the Tg (° C.) of the polymer.

The Bicerano method is described in Prediction of polymer properties, Marcel Dekker Inc, New York (1993), and the like. In addition, calculation of Tg by the Bicerano method can be performed using MDL Polymer (MDL Information Systems, Inc.) for approximating the physical properties of a polymer.

In order to set the Tg of the resin (A) to 90° C. or higher, it is preferable to reduce the mobility of the main chain of the resin (A). Examples of a method for decreasing the mobility of the main chain of the resin (A) include the following methods (a) to (e).

(a) Introduction of a bulky substituent to the main chain (b) Introduction of a plurality of substituents to the main chain (c) Introduction of a substituent to induce an interaction between the resins (A) in the vicinity of the main chain (d) Formation of the main chain in a cyclic structure (e) Linking of a cyclic structure to the main chain In addition, it is preferable that resin (A) has a repeating unit allowing a homopolymer thereof to exhibit a Tg of 130° C. or higher.

In addition, the kind of the repeating unit allowing a homopolymer thereof to exhibit a Tg of 130° C. or higher is not particularly limited, and only needs to be a repeating unit allowing a homopolymer to exhibit a Tg thereof calculated by the Bicerano method of 130° C. or higher. Incidentally, depending on the kind of a functional group in the repeating unit represented by each of Formula (A) to Formula (E) which will be described later, the repeating unit corresponds to a repeating unit allowing a homopolymer thereof to exhibit a Tg of 130° C. or higher.

A repeating unit that is preferably introduced to the resin (A) from the viewpoint of enhancing the Tg of the resin (A) will be described below.

Specific examples of a means for accomplishing (a) above include a method in which a repeating unit represented by Formula (A) is introduced to the resin (A).

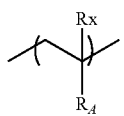
(A)

In Formula (A), $R_A$ represents a group having a polycyclic structure. $R_x$ represents a hydrogen atom, a methyl group, or an ethyl group. The group having a polycyclic structure is a group having a plurality of ring structures, and the plurality of ring structures may or may not be fused.

Specific examples of the repeating unit represented by Formula (A) include the following repeating units.

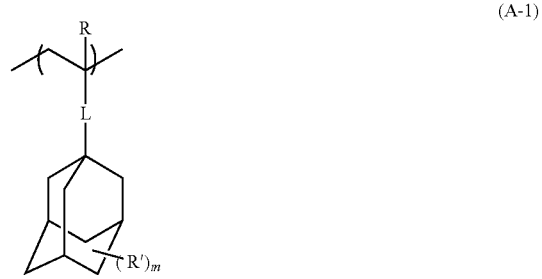
(A-1)

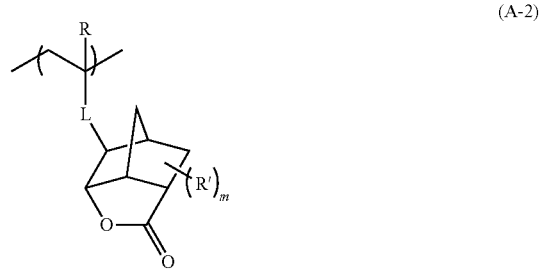
(A-2)

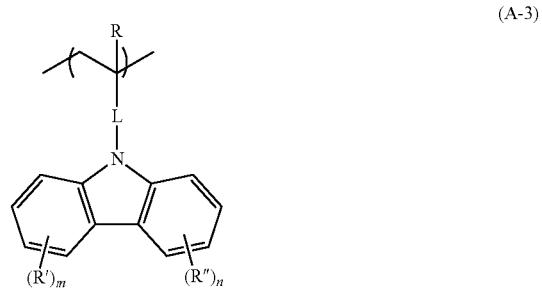
(A-3)

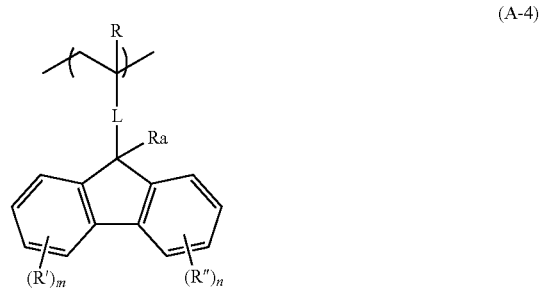
(A-4)

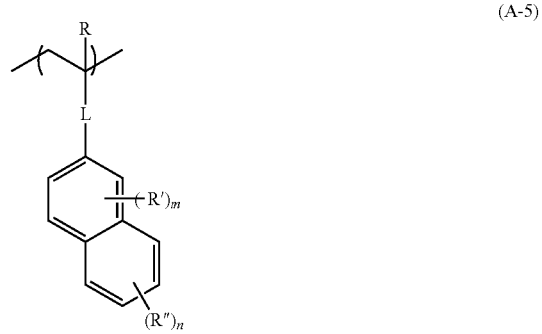
(A-5)

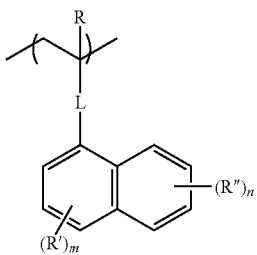
(A-6)

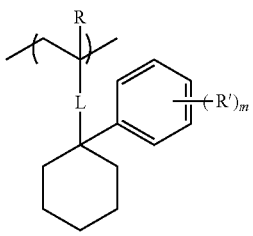
(A-7)

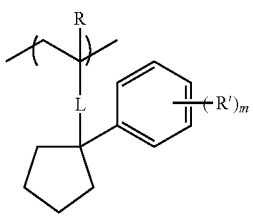
(A-8)

In the formulae, R represents a hydrogen atom, a methyl group, or an ethyl group. Ra, R', and R" each independently represent an alkyl group, a cycloalkyl group, an aryl group, an aralkyl group, an alkenyl group, a hydroxyl group, an alkoxy group, an acyloxy group (provided that a group having an ester group described below is excluded), the group having an ester group (—OCOR' or —COOR''': R''' represents an alkyl group having 1 to 20 carbon atoms), a cyano group, a nitro group, an amino group, a halogen atom, or a carboxyl group. These groups may further have a substituent as possible. For example, a hydrogen atom bonded to carbon may be substituted with a fluorine atom or an iodine atom. It is also preferable that R''' is a fluorinated alkyl group. In addition, $R_a$ may be a hydrogen atom.

L represents a single bond or a divalent linking group. Examples of the divalent linking group include —COO—, —CO—, —O—, —S—, —SO—, —SO$_2$—, an alkylene group, a cycloalkylene group, an alkenylene group, and a linking group formed with a plurality of the groups.

m and n each represent an integer of 0 or more.

Specific examples of a means for accomplishing (b) above include a method in which a repeating unit represented by Formula (B) is introduced to the resin (A).

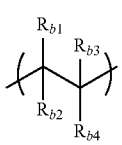
(B)

In Formula (B), $R_{b1}$ to $R_{b4}$ each independently represent a hydrogen atom or an organic group, and at least two or more of $R_{b1}$, . . . , or $R_{b4}$ represent an organic group.

Furthermore, in a case where at least one of the organic groups is a group in which a ring is directly linked to the main chain in the repeating unit, the kind of the other organic group is not particularly limited.

In addition, in a case where none of the organic groups is a group in which a ring structure is directly linked to the main chain in the repeating unit, at least two or more of the organic groups are substituents having 3 or more constituent atoms excluding hydrogen atoms.

Specific examples of the repeating unit represented by Formula (B) include the following repeating units.

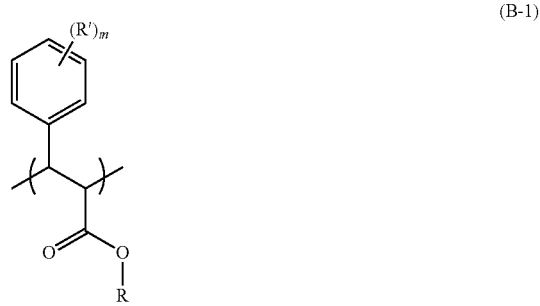
(B-1)

(B-2)

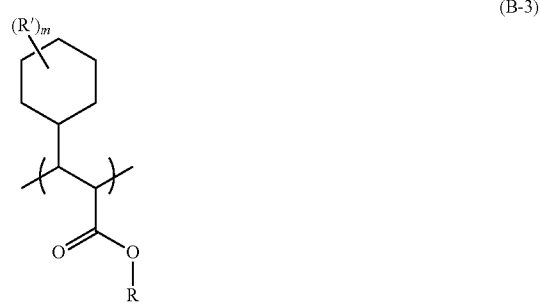
(B-3)

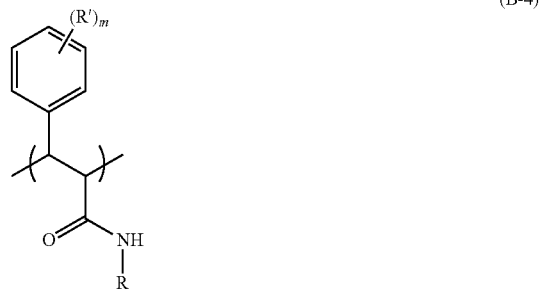
(B-4)

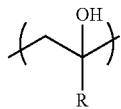 (B-5)

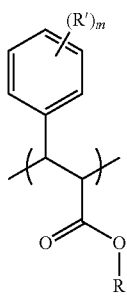

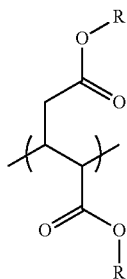 (B-6)

In the formulae, R's each independently represent a hydrogen atom or an organic group. Examples of the organic group include an organic group such as an alkyl group, a cycloalkyl group, an aryl group, an aralkyl group and an alkenyl group, each of which may have a substituent.

R''s each independently represent an alkyl group, a cycloalkyl group, an aryl group, an aralkyl group, an alkenyl group, a hydroxyl group, an alkoxy group, an acyloxy group (provided that a group having an ester group described below is excluded), the group having an ester group (—OCOR" or —COOR": R" represents an alkyl group having 1 to 20 carbon atoms), a cyano group, a nitro group, an amino group, a halogen atom, or a carboxyl group. These groups may further have a substituent as possible. For example, a hydrogen atom bonded to carbon may be substituted with a fluorine atom or an iodine atom. It is also preferable that R" is a fluorinated alkyl group.

m represents an integer of 0 or more.

Specific examples of a means for accomplishing (c) above include a method in which a repeating unit represented by Formula (C) is introduced to the resin (A).

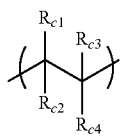 (C)

In Formula (C), $R_{c1}$ to $R_{c4}$ each independently represent a hydrogen atom or an organic group, and at least one of $R_{c1}$, . . . or $R_{c4}$ is a group having a hydrogen-bonding hydrogen atom within three atoms from the main chain carbon. Among those, in order to induce an interaction between the main chains of the resins (A), it is preferable to have a hydrogen-bonding hydrogen atom within two atoms (closer to the main chain).

Specific examples of the repeating unit represented by Formula (C) include the following repeating units.

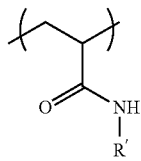 (C-1)

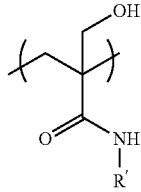 (C-2)

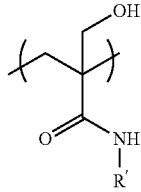 (C-3)

In the formulae, R represents an organic group. Examples of the organic group include an alkyl group, a cycloalkyl group, an aryl group, an aralkyl group, an alkenyl group, and a group having an ester group (—OCOR" or —COOR": R" represents an alkyl group or fluorinated alkyl group having 1 to 20 carbon atoms), each of which may have a substituent.

R' represents a hydrogen atom or an organic group. Examples of the organic group include an organic group such as an alkyl group, a cycloalkyl group, an aryl group, an aralkyl group, and an alkenyl group. Further, a hydrogen atom in the organic group may be substituted with a fluorine atom or an iodine atom.

Specific examples of a means for accomplishing (d) above include a method in which a repeating unit represented by Formula (D) is introduced to the resin (A).

 (D)

In Formula (D), "Cyclic" represents a group that forms the main chain in a cyclic structure. The number of constituent atoms of the ring is not particularly limited.

Specific examples of the repeating unit represented by Formula (D) include the following repeating units.

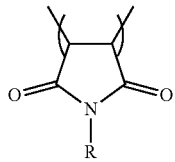 (D-1)

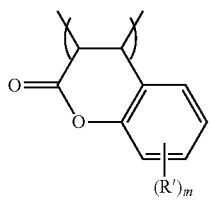 (D-2)

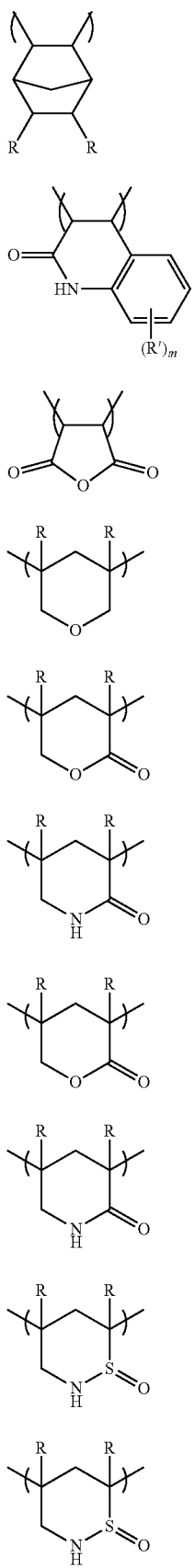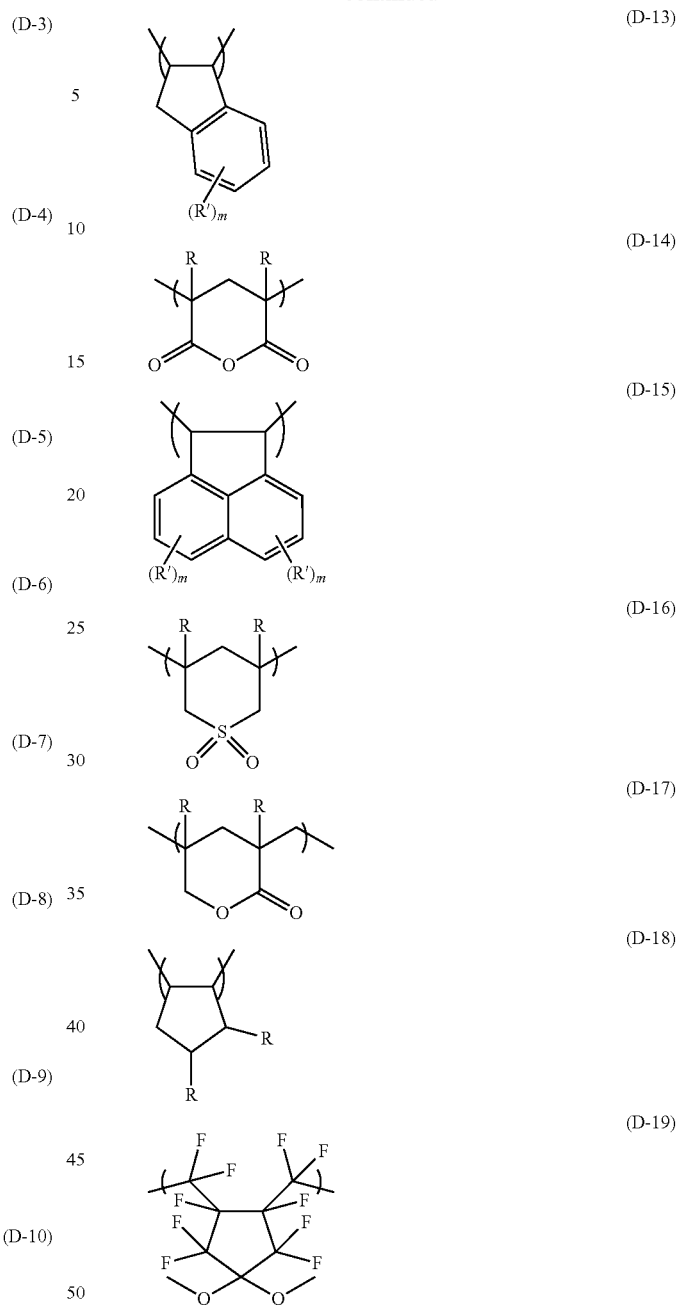

In the formulae, R's and R'''s each independently represent a hydrogen atom, an alkyl group, a cycloalkyl group, an aryl group, an aralkyl group, an alkenyl group, a hydroxyl group, an alkoxy group, an acyloxy group (provided that a group having an ester group described below is excluded), a group having an ester group (—OCOR" or —COOR": R" represents an alkyl group having 1 to 20 carbon atoms), a cyano group, a nitro group, an amino group, a halogen atom, or a carboxyl group. These groups may further have a substituent as possible. For example, a hydrogen atom in the organic group may be substituted with a fluorine atom or an iodine atom. It is also preferable that R" is a fluorinated alkyl group.

m represents an integer of 0 or more.

Specific examples of a means for accomplishing (e) above include a method in which a repeating unit represented by Formula (E) is introduced to the resin (A).

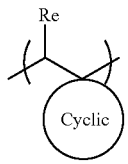

(E)

In Formula (E) Re's each independently represent a hydrogen atom or an organic group. As an organic group, an alkyl group, a cycloalkyl group, an aryl group, an aralkyl group, and an alkenyl group, each of which may have a substituent.

"Cyclic" is a cyclic group including a carbon atom of the main chain. The number of atoms included in the cyclic group is not particularly limited.

Specific examples of the repeating unit represented by Formula (E) include the following repeating units.

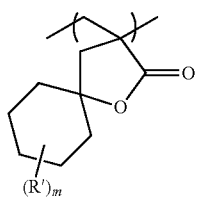
(E-1)

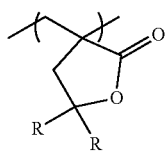
(E-2)

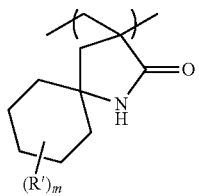
(E-3)

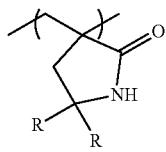
(E-4)

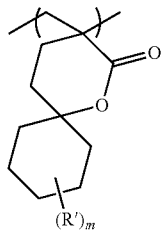
(E-5)

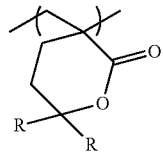
(E-6)

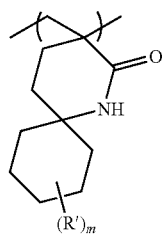
(E-7)

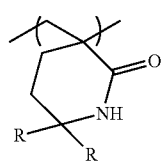
(E-8)

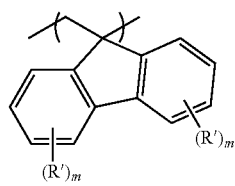
(E-9)

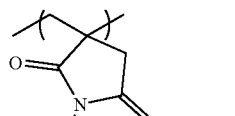
(E-10)

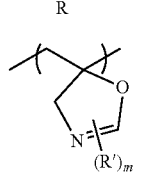
(E-11)

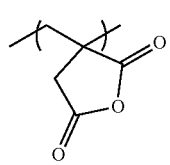
(E-12)

In the formulae, R's and R''s each independently represent a hydrogen atom, an alkyl group, a cycloalkyl group, an aryl group, an aralkyl group, an alkenyl group, a hydroxyl group, an alkoxy group, an acyloxy group (provided that a group having an ester group described below is excluded), a group having an ester group (—OCOR''' or —COOR'': R'' represents an alkyl group having 1 to 20 carbon atoms), a cyano group, a nitro group, an amino group, a halogen atom, or a carboxyl group. These groups may further have a substituent as possible. For example, a hydrogen atom in the organic group may be substituted with a fluorine atom or an iodine atom. It is also preferable that R'' is a fluorinated alkyl group. It is also preferable that the alkyl group has a fluorine atom and a hydroxyl group as the substituent and may form a fluorinated alcohol group (preferably a hexafluoroisopropanol group).

m represents an integer of 0 or more, and preferably 1 to 3.

In addition, in Formula (E-2), Formula (E-4), Formula (E-6), and Formula (E-8), R and R' may be bonded to each other to form a ring.

The resin (A) may further have other repeating units, in addition to the above-mentioned repeating units.

For example, from the viewpoint of adjusting the developability of the resist film, the resin (A) may have a repeating unit formed by removing a phenolic hydroxyl group from the above-mentioned repeating unit having the phenolic hydroxyl group.

The resin (A) can be synthesized in accordance with an ordinary method (for example, radical polymerization).

The weight-average molecular weight (Mw) of the resin (A) as a value in terms of polystyrene as measured using a GPC method is preferably 1,000 to 20,000, more preferably 3,000 to 10,000, and still more preferably 4,000 to 8,000.

The dispersity (Mw/Mn, molecular weight distribution) of the resin (A) is not particularly limited, and generally, it is preferably 1.0 to 3.0, more preferably 1.0 to 2.0, and still more preferably 1.0 to 1.4. In a case where the dispersity is small, the resolution of a pattern is excellent, the side wall of the pattern is smooth, and thus, the LER performance is more excellent.

The resin (A) may be used singly or in combination of a plurality of kinds thereof.

The content of the resin (A) (a total content thereof in a case where a plurality of kinds of the resins (A) are present) in the resist composition of the embodiment of the present invention is preferably 50.0% to 99.9% by mass, and more preferably 70% to 90% by mass, with respect to the total solid content of the resist composition.

<First Photoacid Generator>

The resist composition of the embodiment of the present invention includes a first photoacid generator which is a compound generating an acid upon irradiation with actinic rays or radiation (photoacid generator) and generates an acid having a pKa of −2.00 to 2.00 (provided that in a case where the acid is a carboxylic acid, it is a carboxylic acid having a pKa of −2.00 or more and less than 1.00).

The first photoacid generator may be in a form of a low-molecular-weight compound or in a form incorporated into a part of a polymer. Further, the form of a low-molecular-weight compound and the form incorporated into a part of a polymer may also be used in combination.

In a case where the first photoacid generator is in the form of the low-molecular-weight compound, the molecular weight is preferably 3,000 or less, more preferably 2,000 or less, and still more preferably 1,000 or less.

The volume of an acid generated from the first photoacid generator is not particularly limited, but from the viewpoint of suppressing the diffusion of an acid generated to the unexposed area upon exposure and improving the resolution, the volume is preferably 240 Å$^3$ or more, more preferably 305 Å$^3$ or more, still more preferably 350 Å$^3$ or more, and particularly preferably 400 Å$^3$ or more. Further, from the viewpoints of the sensitivity or the solubility in an application solvent, the volume of the acid generated from the photoacid generator is preferably 1,500 Å$^3$ or less, more preferably 1,000 Å$^3$ or less, and still more preferably 700 Å$^3$ or less.

The value of this volume is determined using "Win-MOPAC" manufactured by Fujitsu Limited. That is, first, a chemical structure of an acid according to each example is input, next, using this structure as an initial structure, the most stable conformation of each acid is determined with a molecular force field calculation using a Molecular Mechanics (MM) 3 method, and thereafter, the most stable conformation is subjected to molecular orbital calculation using a Parameterized Model number (PM) 3 method, whereby an "accessible volume" of each acid can be computed.

By way of an example, the volumes of acids generated from photoacid generators having an anion are shown below:

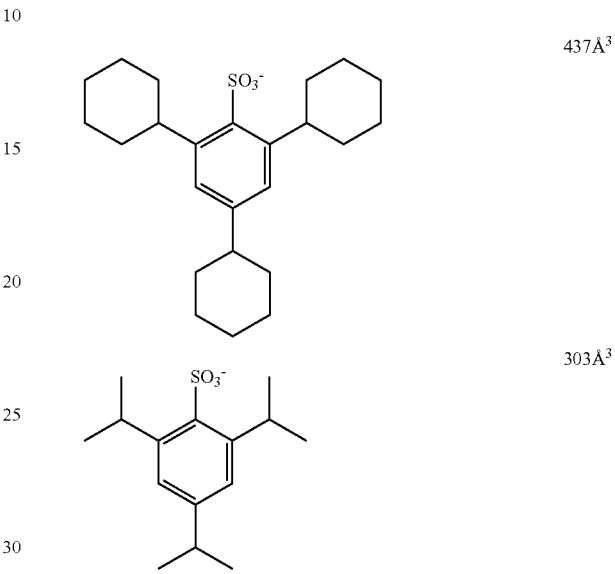

In a case where the first photoacid generator is in the form incorporated into a part of a polymer, it may be incorporated into a part of the resin (A) or incorporated in a resin different from the resin (A).

Among those, the first photoacid generator is preferably in the form of the low-molecular-weight compound.

The first photoacid generator is not particularly limited as long as it generates an acid having a pKa within the range, and is preferably a compound that generates an acid upon irradiation with electron beams or EUV rays.

In a case where the acid generated from the first photoacid generator is an acid other than a carboxylic acid, the pKa is −2.00 to 2.00, preferably −1.00 to 2.00, and more preferably −1.00 to 1.00.

In a case where the acid generated is a carboxylic acid, the pKa is −2.00 or more and less than 1.00, and preferably −1.00 or more and less than 1.00.

A difference in the pKa range by such the acid generated is resulted from a difficulty in deprotection of the phenolic hydroxyl group protected with an acid-leaving group in the carboxylic acid having a pKa of 1.00 to 2.00.

In addition, the type of an acid generated from the first photoacid generator is not particularly limited as long as it satisfies the pKa. and examples of the acid include sulfonic acids (an aliphatic sulfonic acid, an aromatic sulfonic acid, a camphor sulfonic acid, and the like), carboxylic acids (an aliphatic carboxylic acid, an aromatic carboxylic acid, an aralkylcarboxylic acid, and the like), and sulfonimide.

As an acid generated from the first photoacid generator, the sulfonic acid or the carboxylic acid is preferable, the aliphatic or aromatic sulfonic acid, or the aliphatic or aromatic carboxylic acid is more preferable, the aliphatic or aromatic sulfonic acid is still more preferable, the aromatic sulfonic acid is particularly preferable, and the benzenesulfonic acid is the most preferable.

General Formula (BS') Moreover, the acid generated from the first photoacid generator is preferably an acid represented by General Formula (BS').

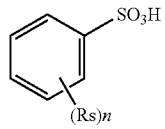

n represents an integer of 0 to 5.

Rs represents a substituent. In a case where there are a plurality of Rs's, Rs's may be the same as or different from each other.

The type of the substituent is not particularly limited, and examples of the substituent include a nitro group, a halogen atom such as a fluorine atom, a carboxyl group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an aryloxy group (preferably having 6 to 20 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), and a combination thereof.

Among those, as the substituent, the fluorine atom, the hydroxyl group, the alkoxy group (more preferably the alkoxy group in which an alkyl group moiety is a cycloalkyl group, still more preferably the alkoxy group in which an alkyl group moiety is a cyclohexyl group), the alkyl group (more preferably an isopropyl group), the cycloalkyl group (more preferably a cyclohexyl group), the aryloxy group (more preferably a phenyloxy group further having 1 to 5 alkyl groups having 1 to 3 carbon atoms as the substituent), or the alkoxycarbonyl group (more preferably the alkoxycarbonyl group in which an alkyl group moiety is a cycloalkyl group, and still more preferably the alkoxycarbonyl group in which an alkyl group moiety is a cyclohexyl group) is preferable.

In addition, in a case where n is an integer of 2 or more, the substituents may be bonded to each other to form a ring. It is also preferable that a ring formed by mutual bonding of the substituents has a cyclic acetal structure, and it is more preferable that the cyclic acetal structure has a group represented by General Formula (CA) which will be described later.

The first photoacid generator may be ionic or non-ionic, but is preferably ionic. Further, the term, ionic, is intended to mean that the first photoacid generator is formed of an anion and a cation.

The first photoacid generator is preferably a photoacid generator formed of an anion and a cation.

The anion is not particularly limited as long as the pKa of an acid generated is within the range, and is typically a non-nucleophilic anion (an anion having an extremely low ability to cause a nucleophilic reaction).

Examples of the non-nucleophilic anion include a sulfonate anion (an aliphatic sulfonate anion, an aromatic sulfonate anion, a camphor sulfonate anion, and the like); a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be either an alkyl group or a cycloalkyl group, and is preferably a linear or branched alkyl group having 1 to 30 carbon atoms (a propyl group, a butyl group, a pentyl group, and the like), or a monocyclic or polycyclic cycloalkyl group having 3 to 30 carbon atoms (a cyclohexyl group, a norbornyl group, adamantyl group, and the like). Further, the alkyl group and the like which will be described later may have a substituent, and for example, it is also preferable that the alkyl group is a perfluoroalkyl group (preferably having 3 to 6 carbon atoms).

As the aryl group in each of the aromatic sulfonate anion and the aromatic carboxylate anion, an aryl group having 6 to 14 carbon atoms is preferable, examples thereof include a phenyl group, a tolyl group, and a naphthyl group, and the phenyl group is preferable.

The alkyl group, the cycloalkyl group, and the aryl group as mentioned above may have a substituent. The substituent which can be contained in the alkyl group, the cycloalkyl group, and the aryl group is not particularly limited, examples of the substituent include the above-mentioned substituents which can be represented by Rs, and a preferred range thereof is also the same.

Furthermore, the number of substituents may be 1 or may be 2 or more, and the substituents may be of one kind or of two or more kinds.

Moreover, from the viewpoint that the LER performance of a pattern is more excellent, it is also preferable that the anion (typically a non-nucleophilic anion) has a cyclic acetal structure. The position at which the cyclic acetal structure is present is not particularly limited, and the cyclic acetal structure may be directly bonded to an alkyl group, a cycloalkyl group, an aryl group, or the like in the above-mentioned aliphatic sulfonate anion, aromatic sulfonate anion, and the like, or may be bonded to a substituent (for example, the substituents which can be contained in the alkyl group, the cycloalkyl group, and the aryl group).

General Formula (CA)

The cyclic acetal structure preferably has a group represented by General Formula (CA).

In the formula. $R_1$ and $R_2$ each independently represent an alkyl group (which may be linear or branched, and preferably has 1 to 8 carbon atoms), a cycloalkyl group (preferably having 3 to 15 carbon atoms), an aralkyl group (preferably having 7 to 14 carbon atoms), or an aryl group (preferably having 6 to 14 carbon atoms), and are each preferably the cycloalkyl group, and more preferably a cyclohexyl group.

$R_1$ and $R_2$ may be bonded to each other to form a ring.

A ring formed by —O—C—O— denoted in the formula and another atom is preferably a 5- or 6-membered ring, and more preferably the 5-membered ring.

As the aralkyl group in the aralkyl carboxylate anion, an aralkyl group having 7 to 14 carbon atoms is preferable, and examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and the fluorine atom or the alkyl group substituted with a fluorine atom is preferable.

In addition, the alkyl groups in the bis(alkylsulfonyl) imide anion may be bonded to each other to form a ring. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

As the non-nucleophilic anion, an sulfonate anion or a carboxylate anion is preferable, an aliphatic or aromatic sulfonate anion, or an aliphatic or aromatic carboxylate anion is more preferable, the aliphatic or aromatic sulfonate anion is still more preferable, the aromatic sulfonate anion is particularly preferable, and a benzenesulfonate anion is the most preferable.

General Formula (BS)

Among those, from the viewpoint that the LER performance of a pattern is more excellent, it is preferable that the benzenesulfonate anion is represented by General Formula (BS).

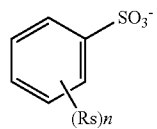

(BS)

In General Formula (BS), n and Rs each have the same definitions as in General Formula (BS'), and preferred ranges thereof are also the same.

General Formula (AN1)

Moreover, an anion represented by General Formula (AN1) is also preferable as the non-nucleophilic anion.

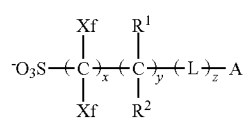

(AN1)

In the formula.

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are each present in plural number. $R^1$'s and $R^2$'s may be the same as or different from each other.

L represents a divalent linking group, and in a case where there are a plurality of L's, L's may be the same as or different from each other.

A represents a cyclic organic group.

x represents an integer of 1 to 20, y represents an integer of 0 to 10, and z represents an integer of 0 to 10.

General Formula (AN1) will be described in more detail.

In an alkyl group substituted with a fluorine atom of Xf, the number of carbon atoms of the alkyl group is preferably 1 to 10, and more preferably 1 to 4. Further, as the alkyl group substituted with a fluorine atom of Xf a perfluoroalkyl group is preferable.

As Xf, a fluorine atom or a perfluoroalkyl group having 1 to 4 carbon atoms is preferable. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom or $CF_3$ is preferable. In particular, it is preferable that both Xf's are fluorine atoms.

The alkyl group of each of $R^1$ and $R^2$ may contain a substituent (preferably a fluorine atom), and the number of carbon atoms is preferably 1 to 4. As the substituent, a perfluoroalkyl group having 1 to 4 carbon atoms is preferable. Specific examples of the alkyl group having a substituent of each of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_5$, $CH_2CH_2C_3F_7$, $CH_2C_4F_9$, and $CH_2CH_2C_4F_9$, and among these, $CF_3$ is preferable.

As $R^1$ and $R^2$, the fluorine atom or $CF_3$ is preferable.

x is preferably 1 to 10, and more preferably 1 to 5.

y is preferably 0 to 4, and more preferably 0.

z is preferably 0 to 5, and more preferably 0 to 3.

The divalent linking group of L is not particularly limited, examples thereof include —COO—, —CO—, —O—, —S—, —SO—, —SO₂—, an alkylene group, a cycloalkylene group, an alkenylene group, and a linking group formed by combination of a plurality of these groups, and a linking group having a total number of carbon atoms of 12 or less is preferable. Among those, —COO—, —CO—, or —O— is preferable, and —COO— is more preferable.

The cyclic organic group of A is not particularly limited as long as it has a cyclic structure, and examples thereof include an alicyclic group, an aromatic ring group, and a heterocyclic group (including not only those having aromaticity but also those having no aromaticity).

The alicyclic group may be either a monocycle or a polycycle, and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable from the viewpoint that the diffusibility of the photoacid generator in the film in a heating step after exposure can be suppressed and mask error enhancement factor (MEEF) is further improved.

Examples of the aromatic ring group include a benzene ring group, a naphthalene ring group, a phenanthrene ring group, and an anthracene ring group.

Examples of the heterocyclic group include groups derived from a furan ring group, a thiophene ring group, a benzofuran ring group, a benzothiophene ring group, a dibenzofuran ring group, a dibenzothiophene ring group, a pyridine ring group. Among those, the heterocyclic group derived from a furan ring group, a thiophene ring group, or a pyridine ring group is preferable.

Moreover, examples of the cyclic organic group also include a group having a lactone structure, and specific examples thereof include groups having the above-mentioned structures represented by General Formulae (LC1-1) to (LC1-22).

The cyclic organic group may have a substituent. Examples of the substituent include an alkyl group (which may be linear or branched, and preferably has 1 to 12 carbon atoms), a cycloalkyl group (which may be either a monocycle or a polycycle, and in a case of the polycycle, may be a spiro ring and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

General Formula (AN2)

Furthermore, an anion represented by General Formula (AN2) is also preferable as the non-nucleophilic anion.

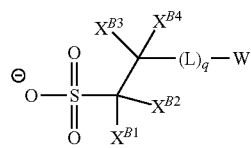

(AN2)

In General Formula (AN2), $X^{B1}$ and $X^{B2}$ each independently represent a hydrogen atom, or a monovalent organic group having no fluorine atom. $X^{B1}$ and $X^{B2}$ are each preferably a hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom is preferable, and it is more preferable that both of $X^{B3}$ and $X^{B4}$ are fluorine atoms or monovalent organic groups having a fluorine atom. It is still more preferable that both of $X^{B3}$ and $X^{B4}$ are alkyl groups substituted with fluorine.

q represents an integer of 0 to 10.

W is the same as A in General Formula (AN1).

L is the same as L in General Formula (AN1).

As such other non-nucleophilic anions, for example, a trisulfonecarbo anion or a disulfonamide anion is also preferable.

The trisulfonecarbo anion is, for example, an anion represented by $C^-(SO_2-R^p)_3$.

Here, $R^p$ represents an alkyl group which may have a substituent, and is preferably a fluoroalkyl group, more preferably a perfluoroalkyl group, and still more preferably a trifluoromethyl group.

The disulfonamide anion is, for example, an anion represented by $N^-(SO_2-R^q)_2$.

Here, $R^q$ represents an alkyl group which may have a substituent, and is preferably a fluoroalkyl group, and more preferably a perfluoroalkyl group. Two $R^q$'s may be bonded to each other to form a ring. The group formed by mutual bonding of the two $R^q$'s is preferably an alkylene group which may have a substituent, more preferably a fluoroalkylene group, and still more preferably a perfluoroalkylene group. The number of carbon atoms of the alkylene group is preferably 2 to 4.

General Formula (ZI) and General Formula (ZII)

In a case where the first photoacid generator is a photoacid generator formed of an anion and a cation, the kind of the cation is not particularly limited, and examples of the cation include a cation represented by General Formula (ZI) or a cation represented by General Formula (ZII).

In General Formula (ZI), $R_{201}$, $R_{202}$, and $R_{203}$ each independently represent an organic group.

The number of carbon atoms of the organic group as each of $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group. Examples of the group formed by mutual bonding of two of $R_{201}$ to $R_{203}$ include a single bond, an ether group, an alkylene group (for example, a butylene group and a pentylene group).

As the organic group of each of $R_{201}$, $R_{202}$, and $R_{203}$, an aryl group (preferably having 6 to 15 carbon atoms), a linear or branched alkyl group (preferably having 1 to 10 carbon atoms), or a cycloalkyl group (preferably having 3 to 15 carbon atoms) is preferable.

It is preferable that at least one of $R_{201}$, $R_{202}$, or $R_{203}$ is an aryl group, and it is more preferable that all of $R_{201}$, $R_{202}$, and $R_{203}$ are aryl groups. That is, the cation represented by General Formula (ZI) is preferably a triarylsulfonium cation. The aryl group may be a heteroaryl group such as an indole residue and a pyrrole residue, in addition to a phenyl group, a naphthyl group, or the like.

The aryl group, the alkyl group, and the cycloalkyl group of each of $R_{201}$, $R_{202}$, and $R_{203}$ may each further have a substituent.

Examples of the substituent include, but are not limited to, a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkylsulfonyl group, a cycloalkylsulfonyl group, a group having an acid-leaving group (preferably a group having the above-mentioned acid-leaving group represented by each of General Formulae (A) to (E)), and an alkoxycarbonyloxy group (preferably having 2 to 7 carbon atoms).

In addition, examples of the substituent which is contained in the aryl group and the cycloalkyl group further include an alkyl group (preferably having 1 to 15 carbon atoms), in addition to the above-mentioned substituent group.

Two selected from $R_{201}$, $R_{202}$, and $R_{203}$ may be bonded through a single bond or a linking group. Examples of the linking group include, but are not limited to, an alkylene group (preferably having 1 to 3 carbon atoms), —O—, —S—, —CO—, and —$SO_2$—.

Examples of the preferred structure in a case where at least one of $R_{201}$, $R_{202}$, or $R_{203}$ is not an aryl group include cationic structures such as the compounds exemplified in paragraphs 0046 and 0047 of JP2004-233661A, paragraphs 0040 to 0046 of JP2003-035948A, the compounds exemplified as Formulae (1-1) to (1-70) in US2003/0224288A1, and the compounds exemplified as Formulae (IA-1) to (IA-54), and Formulae (IB-1) to (IB-24) in US2003/0077540A1.

Preferred examples of the cation represented by General Formula (ZI) include a cation represented by General Formula (ZI-3) or (ZI-4) which will be described below.

First, the cation represented by General Formula (ZI-3) will be described.

(ZI-3)

In General Formula (ZI-3), $R_1$ represents an alkyl group, a cycloalkyl group, an alkoxy group, a cycloalkoxy group, an aryl group, or an alkenyl group, $R_2$ and $R_3$ each independently represent a hydrogen atom, an alkyl group, a cycloalkyl group, or an aryl group, and $R_2$ and $R_3$ may be linked to each other to form a ring, $R_1$ and $R_2$ may be linked to each other to form a ring, $R_x$ and $R_y$ each independently represent an alkyl group, a cycloalkyl group, an alkenyl group, an aryl group, a 2-oxoalkyl group, a 2-oxocycloalkyl group, an alkoxycarbonylalkyl group, or an alkoxycarbonylcycloalkyl group. $R_x$ and $R_y$ may be linked to each other to form a ring, and this ring structure may include an oxygen atom, a nitrogen atom, a sulfur atom, a ketone group, an ether bond, an ester bond, or an amide bond.

The alkyl group as $R_1$ preferably a linear or branched alkyl group having 1 to 20 carbon atoms, and may have an oxygen atom, a sulfur atom, or a nitrogen atom in the alkyl chain. Specific examples of the alkyl group include a linear alkyl group such as a methyl group, an ethyl group, an n-propyl group, an n-butyl group, an n-pentyl group, an n-hexyl group, an n-octyl group, an n-dodecyl group, an n-tetradecyl group, and an n-octadecyl group, and a branched alkyl group such as an isopropyl group, an isobutyl group, a t-butyl group, a neopentyl group, and a 2-ethylhexyl group. The alkyl group of $R_1$ may have a substituent, and examples of the alkyl group having the substituent include a cyanomethyl group, a 2,2,2-trifluoroethyl group, a methoxycarbonylmethyl group, and an ethoxycarbonylmethyl group.

The cycloalkyl group as $R_1$ is preferably a cycloalkyl group having 3 to 20 carbon atoms, and may have an oxygen atom or a sulfur atom in the ring. Specific examples of the cycloalkyl group include a cyclopropyl group, a cyclopentyl group, a cyclohexyl group, a norbornyl group, and an adamantyl group. The cycloalkyl group of $R_1$ may have a substituent, and examples of the substituent include an alkyl group and an alkoxy group.

The alkoxy group as $R_1$ is preferably an alkoxy group having 1 to 20 carbon atoms. Specific examples of the alkoxy group include a methoxy group, an ethoxy group, an isopropyloxy group, a t-butyloxy group, a t-amyloxy group, and an n-butyloxy group. The alkoxy group of $R_1$ may have a substituent, and examples of the substituent include an alkyl group and a cycloalkyl group.

The cycloalkoxy group as $R_1$ preferably a cycloalkoxy group having 3 to 20 carbon atoms, and more preferably a cyclohexyloxy group, a norbornyloxy group, or an adamantyloxy group. The cycloalkoxy group of $R_1$ may have a substituent, and examples of the substituent include an alkyl group and a cycloalkyl group.

The aryl group as $R_1$ is preferably an aryl group having 6 to 14 carbon atoms, and more preferably a phenyl group, a naphthyl group, or biphenyl group. The aryl group of $R_1$ may have a substituent, and examples of the substituent include an alkyl group, a cycloalkyl group, an alkoxy group, a cycloalkoxy group, an aryloxy group, an alkylthio group, and an arylthio group. In a case where the substituent is the alkyl group, the cycloalkyl group, the alkoxy group, or the cycloalkoxy group, examples of the substituent include the same ones as the above-mentioned alkyl group, cycloalkyl group, alkoxy group, or cycloalkoxy group as $R_1$.

Examples of the alkenyl group as $R_1$ include a vinyl group and an allyl group.

$R_2$ and $R_3$ represent a hydrogen atom, an alkyl group, a cycloalkyl group, or an aryl group, and $R_2$ and $R_3$ may be linked to each other to form a ring. It is preferable that at least one of $R_2$ or $R_3$ represents an alkyl group, a cycloalkyl group, or an aryl group. Specific and preferred examples of the alkyl group, the cycloalkyl group, and the aryl group for $R_2$ or $R_3$ are the same specific and preferred examples as described above for $R_1$. In a case where $R_2$ and $R_3$ are linked to each other to form a ring, the total number of carbon atoms contributing to formation of a ring included in $R_2$ and $R_3$ is preferably 4 to 7, and particularly preferably 4 or 5.

$R_1$ and $R_2$ may be linked to each other to form a ring. In a case where $R_1$ and $R_2$ are linked to each other to form a ring, it is preferable that $R_1$ is an aryl group (preferably a phenyl group having a substituent or a naphthyl group having a substituent) and $R_2$ is an alkylene group having 1 to 4 carbon atoms (preferably a methylene group or an ethylene group), and preferred examples of the substituent include the same ones as the substituent which the aryl group as $R_1$ may have. In another aspect of a case where $R_1$ and $R_2$ are linked to each other to form a ring, it is also preferable that $R_1$ is a vinyl group and $R_2$ is an alkylene group having 1 to 4 carbon atoms.

Examples of the alkyl group represented by each of $R_x$ and $R_y$ include an alkyl group having 1 to 15 carbon atoms, such as a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group.

The cycloalkyl group represented by each of $R_x$ and $R_y$ is preferably a cycloalkyl group having 3 to 20 carbon atoms, and examples thereof include a cyclopropyl group, a cyclopentyl group, a cyclohexyl group, a norbornyl group, and an adamantyl group.

The alkenyl group represented by each of $R_x$ and $R_y$ is preferably an alkenyl group having 2 to 30 carbon atoms, and examples thereof include a vinyl group, an allyl group, and a styryl group.

As the aryl group represented by each of $R_x$ and $R_y$, for example, an aryl group having 6 to 20 carbon atoms is preferable, and examples thereof include a phenyl group, a naphthyl group, an azulenyl group, an acenaphthylenyl group, a phenanthrenyl group, a phenalenyl group, a phenanthracenyl group, a fluorenyl group, an anthracenyl group, a pyrenyl group, and a benzopyrenyl group. Among those, the phenyl group or the naphthyl group is preferable, and the phenyl group is more preferable.

Examples of the alkyl group moiety of the 2-oxoalkyl group and the alkoxycarbonylalkyl group represented by each of $R_x$ and $R_y$ include those enumerated above as each of $R_x$ and $R_y$.

Examples of the cycloalkyl group moiety in the 2-oxo-cycloalkyl group and the alkoxycarbonylcycloalkyl group represented by each of $R_x$ and $R_y$ include those enumerated above as each of $R_x$ and $R_y$.

The cation represented by General Formula (ZI-3) is preferably a cation represented by General Formula (ZI-3a) or (ZI-3b).

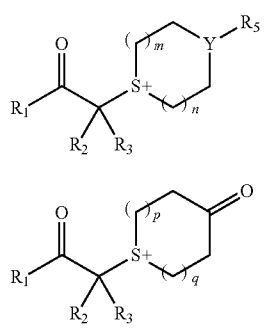

(ZI-3a)

(ZI-3b)

In General Formulae (ZI-3a) and (ZI-3b), $R_1$, $R_2$, and $R_3$ have the same definitions as in General Formula (ZI-3).

Y represents an oxygen atom, a sulfur atom, or a nitrogen atom, and is preferably the oxygen atom or the nitrogen atom. m, n, p, and q each mean an integer, and are preferably 0 to 3, more preferably 1 or 2, and still more preferably 1. The alkylene group linking $S^+$ and Y may have a substituent, and as the substituent, an alkyl group is preferable.

$R_5$ represents a monovalent organic group in a case where Y is a nitrogen atom, and is not present in a case where Y is an oxygen atom or a sulfur atom. $R_5$ is preferably a group including an electron-withdrawing group, and more preferably a group represented by each of General Formulae (ZI-3a-1) to (ZI-3a-4).

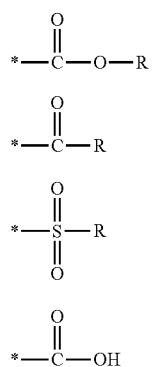

(ZI-3a-1)

(ZI-3a-2)

(ZI-3a-3)

(ZI-3a-4)

In (ZI-3a-1) to (ZI-3a-3), R represents a hydrogen atom, an alkyl group, a cycloalkyl group, or an aryl group, and is preferably the alkyl group. Specific examples and preferred examples of the alkyl group, the cycloalkyl group, and the aryl group for R are the same as the above-mentioned specific examples and preferred examples recited above for $R_1$ in General Formula (ZI-3).

In (ZI-3a-1) to (ZI-3a-4), * represents a bond linked to the nitrogen atom as Y in the compound represented by General Formula (ZI-3a).

In a case where Y is a nitrogen atom, $R_5$ is preferably a group represented by —$SO_2$—$R_4$. $R_4$ represents an alkyl group, a cycloalkyl group, or an aryl group, and is preferably the alkyl group. Specific examples and preferred examples of the alkyl group, the cycloalkyl group, and the aryl group of $R_4$ are the same as the specific examples and preferred examples recited above for $R_1$.

The cation represented by General Formula (ZI-3) is preferably a cation represented each of by General Formulae (ZI-3a') and (ZI-3b').

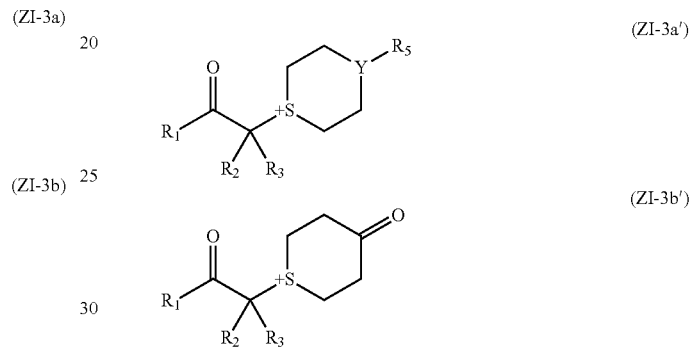

(ZI-3a')

(ZI-3b')

In General Formulae (ZI-3a') and (ZI-3b'), $R_1$, $R_2$, $R_3$, Y, and $R_5$ have the same definitions as in General Formulae (ZI-3a) and (ZI-3b).

Specific examples of the cation represented by General Formula (ZI-3) are shown below. In the following formulae, Me represents a methyl group and "Bu represents an n-butyl group.

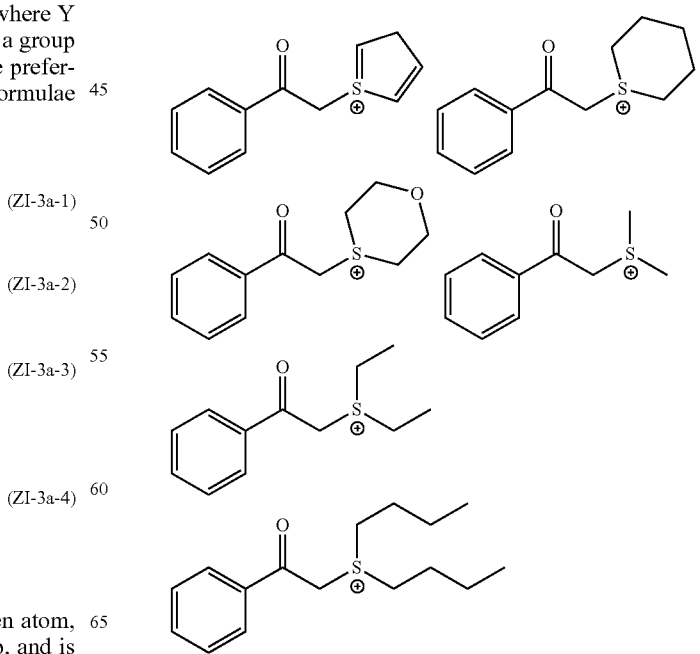

51
-continued
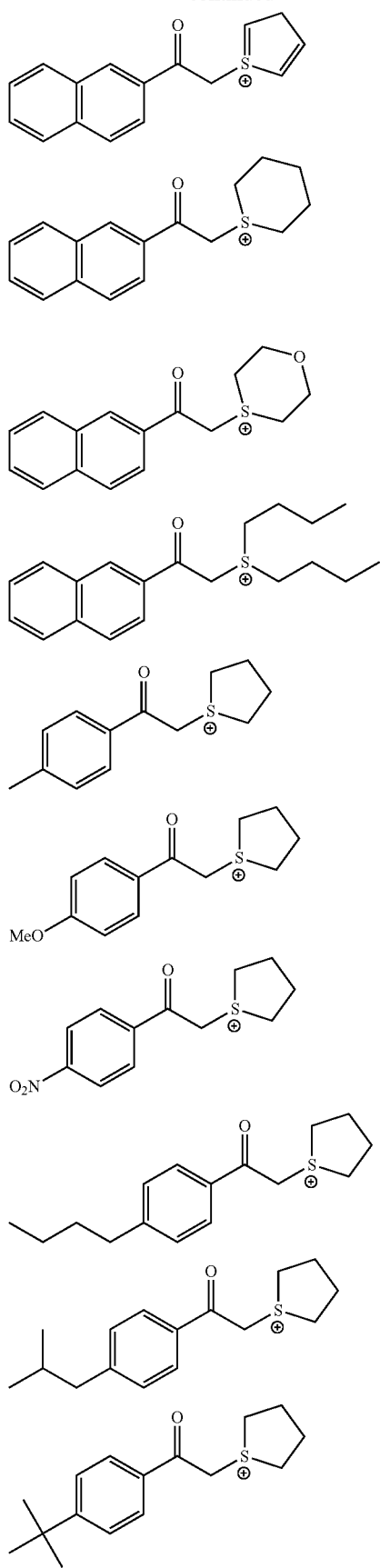
52
-continued
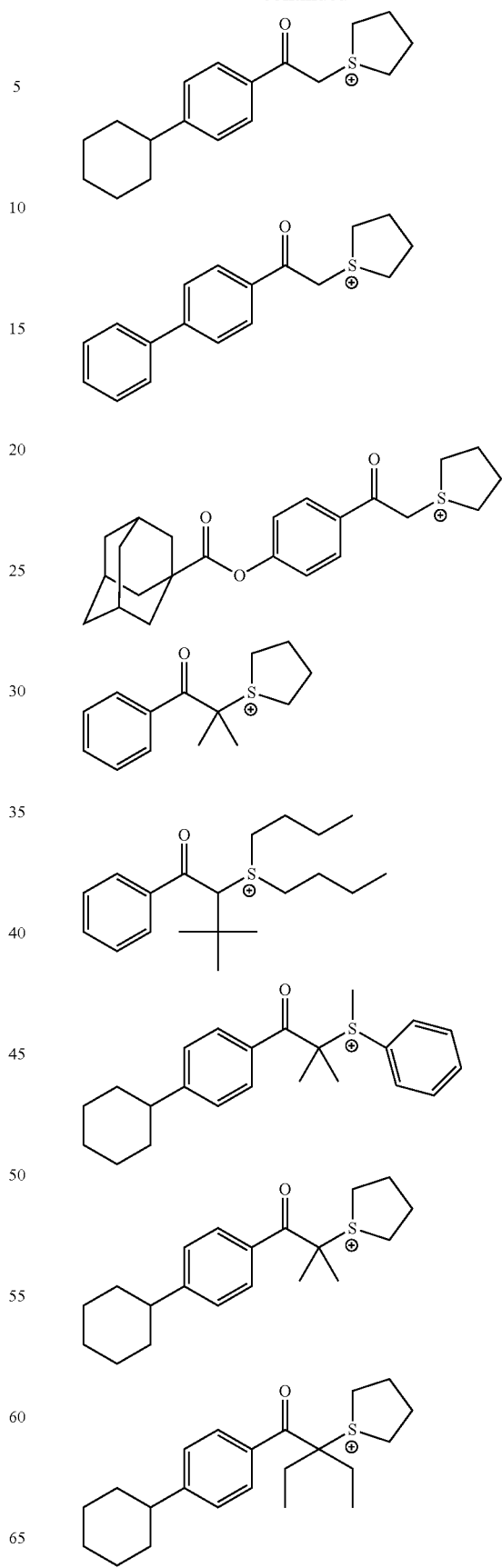

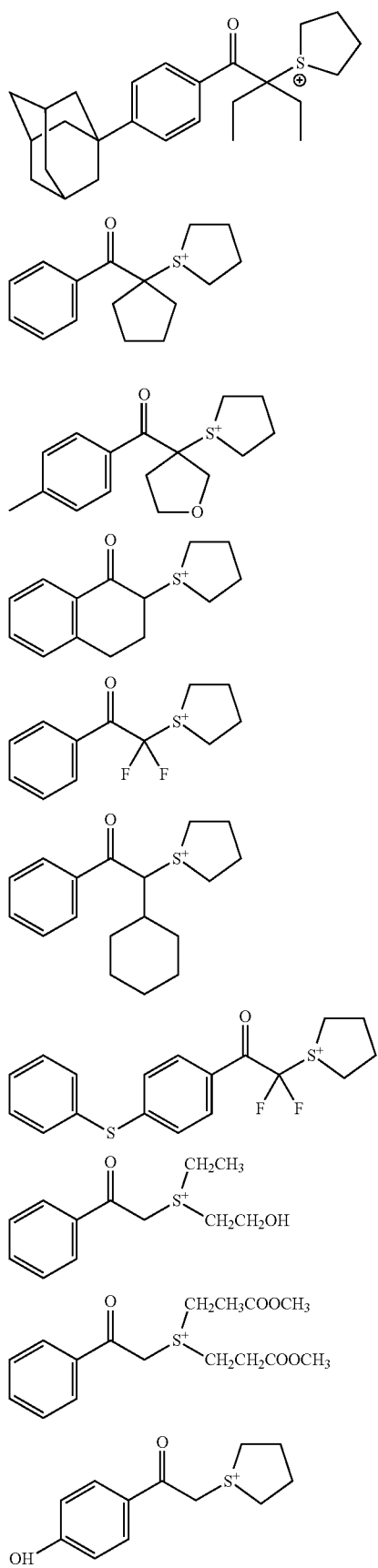
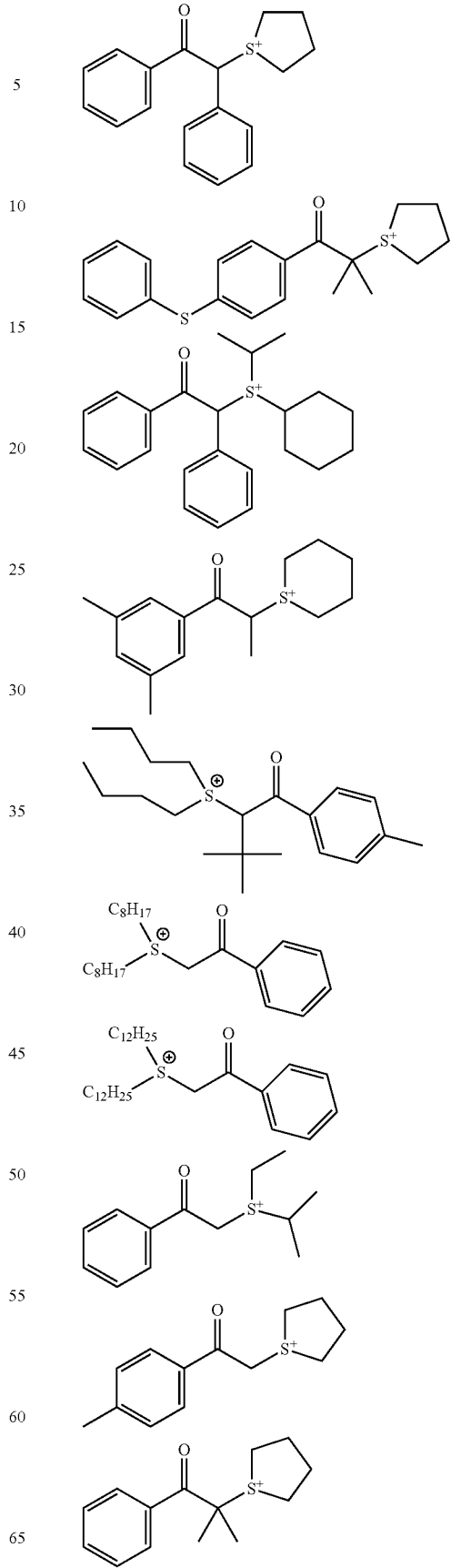

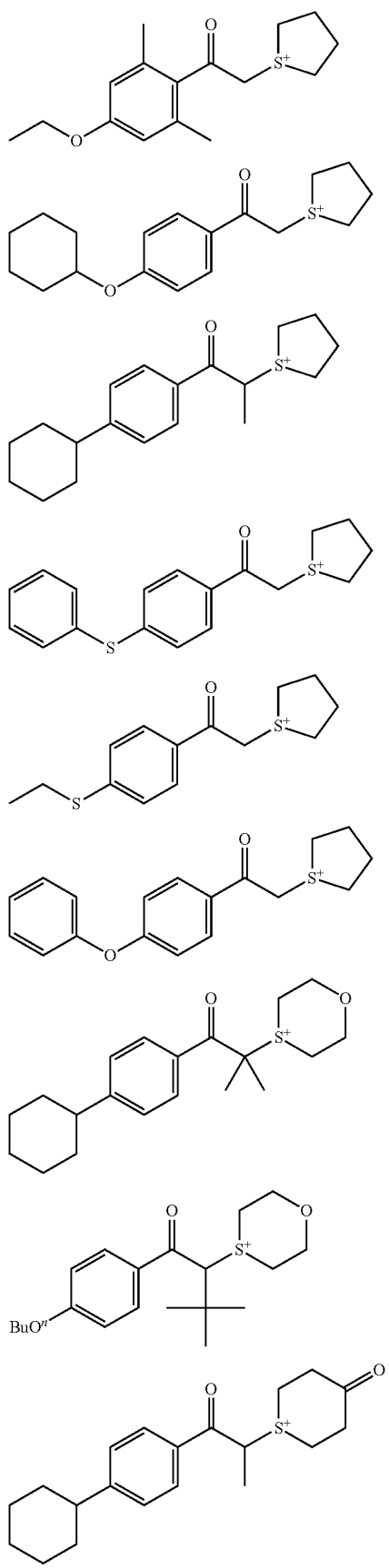
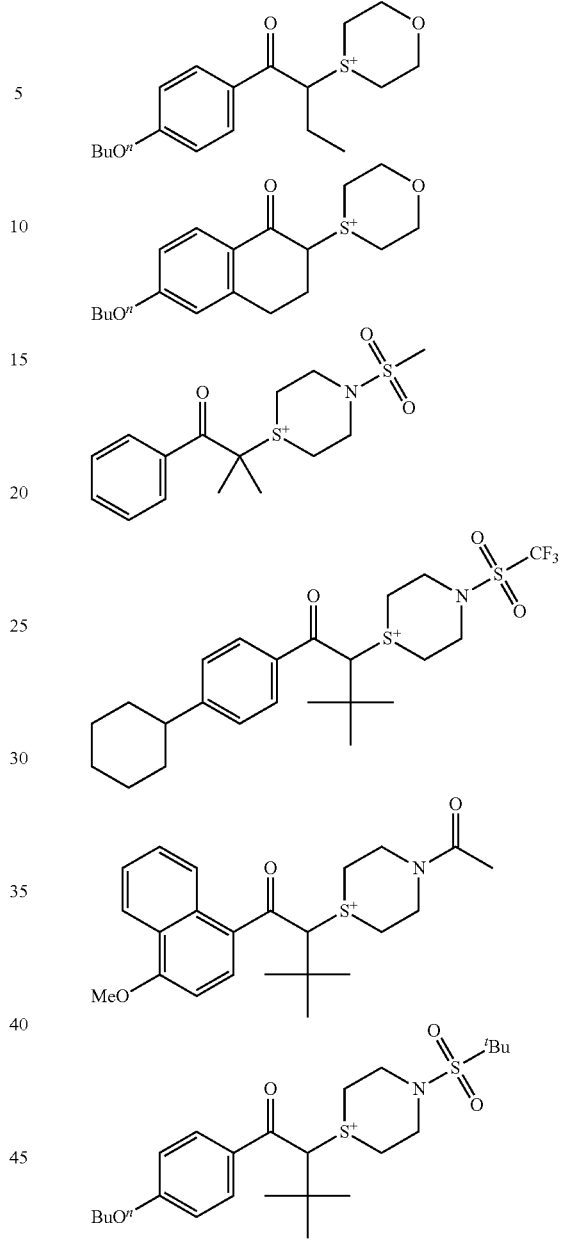
Next, a cation represented by General Formula (ZI-4) will be described.
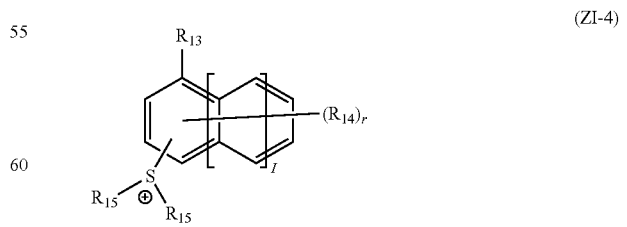
(ZI-4)
In General Formula (ZI-4),
$R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have substituents.

In a case where there are a plurality of $R_{14}$'s, $R_{14}$'s each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have substituents.

$R_{15}$'s each independently represent an alkyl group, a cycloalkyl group or a naphthyl group. Two $R_{15}$'s may be bonded to each other to form a ring, and may contain a heteroatom as an atom constituting the ring such as an oxygen atom, a sulfur atom and a nitrogen atom. These groups may have substituents.

l represents an integer of 0 to 2.

r represents an integer of 0 to 8.

In General Formula (ZI-4), the alkyl group of each of $R_{13}$, $R_{14}$, and $R_{15}$ is linear or branched, and preferably has 1 to 10 carbon atoms.

Examples of the cycloalkyl group of each of $R_{13}$, $R_{14}$, and $R_{15}$ include a monocyclic or polycyclic cycloalkyl group.

The alkoxy group of each of $R_{13}$ and $R_{14}$ is linear or branched, and preferably has 1 to 10 carbon atoms.

The alkoxycarbonyl group of each of $R_{13}$ and $R_{14}$ is linear or branched, and preferably has 2 to 11 carbon atoms.

Examples of a group having the cycloalkyl group of each of $R_{13}$ and $R_{14}$ include a group having a monocyclic or polycyclic cycloalkyl group. These groups may further have a substituent.

Examples of the alkyl group in the alkylcarbonyl group of $R_{14}$ include the same specific examples as mentioned for the alkyl groups as each of $R_{13}$ to $R_{15}$.

The alkylsulfonyl group and the cycloalkylsulfonyl group of $R_{14}$ are linear, branched, or cyclic, and preferably have 1 to 10 carbon atoms.

Examples of a substituent which may be contained in each of the groups include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the ring structure which may formed by the mutual bonding of two $R_{15}$'s include a 5- or 6-membered ring formed by two $R_{15}$'s together with a sulfur atom in General Formula (ZI-4), and particularly preferably a 5-membered ring (that is, a tetrahydrothiophene ring or a 2,5-dihydrothiophene ring) and may be fused with an aryl group or a cycloalkyl group. Two $R_{15}$'s may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. The substituents for the ring structure may be present in plural number and may be bonded to each other to form a ring.

As $R_{15}$ in General Formula (ZI-4), a methyl group, an ethyl group, a naphthyl group, a divalent group that forms a tetrahydrothiophene ring structure together with a sulfur atom by mutual bonding of two $R_{15}$'s, or the like is preferable, and the divalent group that forms a tetrahydrothiophene ring structure together with the sulfur atom by mutual bonding of two $R_{15}$'s is more preferable.

The substituent which may be contained in each of $R_{13}$ and $R_{14}$ is preferably a hydroxyl group, an alkoxy group, an alkoxycarbonyl group, or a halogen atom (particularly a fluorine atom).

l is preferably 0 or 1, and more preferably 1.

r is preferably 0 to 2.

Specific examples of the cationic structure in the compound represented by General Formula (ZI-3) or (ZI-4) as described above include cationic structures in the chemical structures and the like exemplified in paragraphs <0046>, <0047>, <0072> to <0077>, and <0107> to <0110> of JP2011-053360A. and the cationic structures in the chemical structures and the like exemplified in paragraphs <0135> to <0137>, <0151>, <0196> to <0199> of JP2011-053430A, and the like, in addition to the cationic structures such as the compounds exemplified in JP2004-233661A, JP2003-035948A, US2003/0224288A1, and US2003/0077540A1, as described above.

Next, General Formula (ZII) will be described.

In General Formula (ZII), $R_{204}$ and $R_{205}$ each independently represent an aryl group, an alkyl group, or a cycloalkyl group.

The aryl group, the alkyl group, and the cycloalkyl group of each of $R_{204}$ and $R_{205}$ are the same as the aryl group, the alkyl group, and the cycloalkyl group of each of $R_{201}$ to $R<_3$ in the above-mentioned compound (ZI).

Among those, as the aryl group of each of $R_{204}$ and $R_{205}$, a phenyl group or a naphthyl group is preferable, and the phenyl group is more preferable. The aryl group of each of $R_{204}$ and $R_{205}$ may be an aryl group having a heterocyclic structure having an oxygen atom, a nitrogen atom, a sulfur atom, or the like. Examples of the skeleton of the aryl group having a heterocyclic structure include a pyrrole ring, a furan ring, a thiophene ring, an indole ring, a benzofuran ring, and a benzothiophene ring.

As the alkyl group and the cycloalkyl group of each of $R_{204}$ and $R_{205}$, a linear or branched alkyl group having 1 to 10 carbon atoms (for example, a methyl group, an ethyl group, a propyl group, a butyl group, and a pentyl group), or a cycloalkyl group having 3 to 10 carbon atoms (a cyclopentyl group, a cyclohexyl group, and a norbornyl group) is preferable.

The aryl group, the alkyl group, and the cycloalkyl group of each of $R_{204}$ and $R_{205}$ may have a substituent. Examples of the substituent which may be contained in the aryl group, the alkyl group, and the cycloalkyl group of each of $R_{204}$ and $R_{205}$ include the substituents which may be contained in the aryl group, the alkyl group, and the cycloalkyl group of each of $R_{204}$ and $R_{205}$ in the compound (ZI) as described above, and for example, an alkyl group (for example, an alkyl group having 1 to 15 carbon atoms), a cycloalkyl group (for example, a cycloalkyl group having 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group, and a phenylthio group.

Specific examples of the cation represented by General Formula (ZII) are shown below.

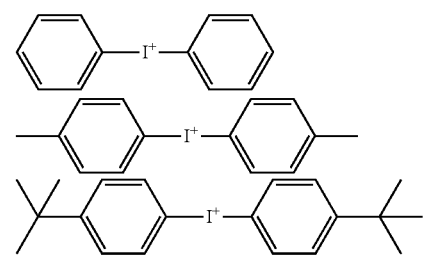

-continued

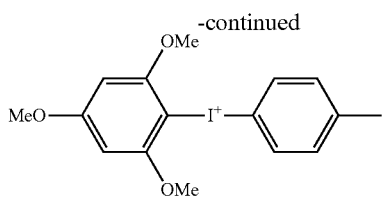

Preferred examples of the cation represented by General Formula (ZI) also include a cation represented by General Formula (7) as described below.

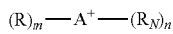

(7)

In the formula. A represents a sulfur atom.

m represents 1 or 2, and n represents 1 or 2. It should be noted that in a case where A is a sulfur atom, m+n=3 is satisfied, and in a case where A is an iodine atom, m+n=2 is satisfied.

R represents an aryl group.

$R_N$ represents an aryl group substituted with a proton-accepting functional group.

The proton-accepting functional group refers to a functional group having a group or an electron which is capable of electrostatically interacting with a proton, and means, for example, a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following general formula.

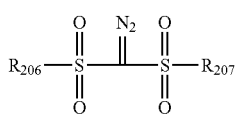

Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

General Formula (ZIII)

Other examples of the first photoacid generator include a compound represented by General Formula (ZIII).

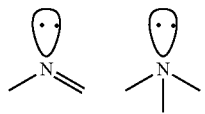

(ZIII)

In General Formula (ZIII), $R_{206}$ and $R_{207}$ each independently represent an aryl group, an alkyl group, or a cycloalkyl group.

The aryl group, the alkyl group, and the cycloalkyl group of each of $R_{206}$ and $R_{207}$ are the same as the groups described as the aryl group, the alkyl group, and the cycloalkyl group of each of $R_{201}$ and $R_{203}$ in General Formula (ZI) as described above.

The first photoacid generators may be used singly or in combination of two or more kinds thereof.

The content of the first photoacid generator (a total content thereof in a case where a plurality of kinds of the first photoacid generators are present) in the resist composition of the embodiment of the present invention is preferably 1% to 50% by mass, more preferably 5% to 30% by mass, and still more preferably 6% to 20% by mass, with respect to the total solid content of the resist composition.

<Second Photoacid Generator>

The resist composition of the embodiment of the present invention further includes a second photoacid generator which is a photoacid generator and generates a carboxylic acid having a pKa of 1.00 or more.

The second photoacid generator may be in a form of a low-molecular-weight compound or in a form incorporated into a part of a polymer. Further, the form of a low-molecular-weight compound and the form incorporated into a part of a polymer may also be used in combination.

In a case where the second photoacid generator is in the form of the low-molecular-weight compound, the molecular weight is preferably 3,000 or less, more preferably 2,000 or less, and still more preferably 1,000 or less.

In a case where the second photoacid generator is incorporated into a part of a polymer, it may be incorporated into a part of the resin (A) or in a resin different from the resin (A).

Among those, the second photoacid generator is preferably in the form of the low-molecular-weight compound.

The second photoacid generator is not particularly limited as long as it generates an acid having a pKa within the range, and is preferably a compound that generates an acid upon irradiation with electron beams or EUV rays.

Furthermore, the second photoacid generator exhibits basicity in an unexposed area, and is preferably acts as a so-called acid diffusion control agent. The acid diffusion control agent traps an acid generated from a photoacid generator or the like upon exposure and suppresses an reaction of the acid-decomposable group of the resin (A) in the unexposed area by the extra generated acid from proceeding.

The pKa of the carbon acid generated from the second photoacid generator is 1 or more, preferably 1 to 8, and more preferably 1 to 4.

The kind of a carboxylic acid generated from the second photoacid generator is not particularly limited as long as it satisfies the pKa.

Among those, as the carboxylic acid generated from the second photoacid generator, an aliphatic or aromatic carboxylic acid is preferable, and a benzenecarboxylic acid is more preferable.

In addition, it is also preferable that the carboxylic acid generated from the second photoacid generator has a fluorine atom. Further, an expression, "the carboxylic acid has a fluorine atom" as mentioned herein is intended to mean, for example, that the carboxylic acid (preferably an aliphatic or aromatic carboxylic acid, and more preferably a benzenecarboxylic acid) has a fluorine atom or a group including a fluorine atom (for example, a group including a fluorine atom as a part of the group, such as in a fluoroalkyl group) as a substituent.

General Formula (BC')

From the viewpoint that the LER performance of a pattern is more excellent, it is preferable that the carboxylic acid generated from the second photoacid generator is an acid represented by General Formula (BC').

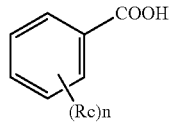
(BC')

n represents an integer of 0 to 5.

Rc represents a substituent. In a case where there are a plurality of Rc's, Rc's may be the same as or different from each other.

The kind of the substituent is not particularly limited, and examples thereof include the substituents which can be represented by Rs in General Formula (BS') as described above.

It should be noted that from the viewpoint that the LER performance of a pattern is more excellent, it is preferable that the substituent represented by Rc is a substituent having a fluorine atom. The substituent having a fluorine atom is not particularly limited, examples of the substituent include a fluorine atom itself and a group including a fluorine atom (for example, a group including a fluorine atom as a part of the group, such as in a fluoroalkyl group), and the fluorine atom or an organic group substituted with a fluorine atom, having 1 to 20 carbon atoms (preferably having 1 to 10 carbon atoms, and more preferably 1 to 6 carbon atoms) is preferable. Examples of the organic group include an alkyl group (which may be linear or branched), a cycloalkyl group, an alkenyl group, an alkynyl group, an aryl group, and a heterocyclic group.

As the organic group, the alkyl group, the cycloalkyl group, or the aryl group is preferable, and the alkyl group is more preferable. The organic group is preferably an organic group whose hydrogen atoms are all substituted with fluorine atoms (for example, a perfluoroalkyl group such as a trifluoromethyl group) is preferable.

Rc may be a group having no fluorine atom, and examples of the group having no fluorine atom include a halogen atom excluding fluorine, a hydroxyl group, a carboxyl group, an alkyl group (preferably having 1 to 20 carbon atoms), a cyano group, a nitro group, an amino group which may have a substituent, a sulfamoyl group which may have a substituent, an alkoxy group (preferably having 1 to 20 carbon atoms), an aryloxy group, an alkylthio group, an arylthio group, an alkyloxycarbonyl group, an aryloxycarbonyl group, an alkylcarbonyloxy group, an arylcarbonyloxy group, a carbamoyl group, and a sulfamoyl group.

In a case where n is 2 or more, one kind or two or more kinds of the substituents may be present.

For example, the hydroxyl group and the substituent having a fluorine atom may be present in combination.

Furthermore, in a case where n is 2 or more, it is preferable that at least one of Rc's representing a substituent having a fluorine atom (more preferably a fluoroalkyl group, and still more preferably a perfluoroalkyl group (for example, a trifluoromethyl group)) is present.

A total number of fluorine atoms contained in the acid represented by General Formula (BC') is preferably 6 or more, more preferably 6 to 16, and still more preferably 6 to 9.

The second photoacid generator may be ionic or non-ionic, and is preferably ionic.

That is, the second photoacid generator is preferably a photoacid generator formed of an anion and a cation.

The anion is not particularly limited as long as the pKa of a carboxylic acid generated is within the range, and is typically a non-nucleophilic anion (an anion having an extremely low ability to cause a nucleophilic reaction).

General Formula (d1-1)

Among those, the anion of the second photoacid generator is preferably represented by General Formula (d1-1).

(d1-1)

In the formulae, $R^{5'}$ is a hydrocarbon group, and examples thereof include an aliphatic hydrocarbon group and an aromatic hydrocarbon group.

The aliphatic hydrocarbon group may be, for example, either an alkyl group or a cycloalkyl group, and is preferably a linear or branched alkyl group having 1 to 30 carbon atoms (a propyl group, a butyl group, a pentyl group, and the like), or a monocyclic or polycyclic cycloalkyl group having 3 to 30 carbon atoms (a cyclopentyl group, a cyclohexyl group, a cyclooctyl group, a norbornyl group, a tricyclodecanyl group, a tetracyclodecanyl group, a tetracyclododecanyl group, an adamantyl group, and the like) is preferable.

As the aromatic hydrocarbon group, an aryl group having 6 to 14 carbon atoms is preferable, and examples thereof include a phenyl group, a tolyl group, and a naphthyl group.

The hydrocarbon group of $R^5$ may have a substituent, the substituent is not particularly limited, and examples of the substituent include the substituents which can be represented by Rs in General Formula (BS') as described above.

It should be noted that from the viewpoint that the LER performance of a pattern is more excellent, as the substituent of the hydrocarbon group of $R^{51}$, a substituent having a fluorine atom is preferable. The substituent having a fluorine atom is not particularly limited, examples of the substituent include a fluorine atom itself and a group including a fluorine atom, and the fluorine atom or an organic group substituted with a fluorine atom, having 1 to 20 carbon atoms (preferably having 1 to 10 carbon atoms, and more preferably 1 to 6 carbon atoms) is preferable. Examples of the organic group include an alkyl group (which may be linear or branched), a cycloalkyl group, an alkenyl group, an alkynyl group, an aryl group, and a heterocyclic group.

As the organic group, the alkyl group, the cycloalkyl group, or the aryl group is preferable, and the alkyl group is more preferable. The organic group is preferably an organic group whose hydrogen atoms are all substituted with fluorine atoms (for example, a perfluoroalkyl group such as a trifluoromethyl group) is preferable.

The substituent may be a group having no fluorine atom, and examples of the group having no fluorine atom include a halogen atom excluding a fluorine atom, a hydroxyl group, a carboxyl group, an alkyl group (preferably having 1 to 20 carbon atoms), a cyano group, a nitro group, an amino group which may have a substituent, a sulfamoyl group which may have a substituent, an alkoxy group (preferably having 1 to 20 carbon atoms), an aryloxy group, an alkylthio group, an arylthio group, an alkyloxycarbonyl group, an aryloxycarbonyl group, an alkylcarbonyloxy group, an arylcarbonyloxy group, a carbamoyl group, and a sulfamoyl group.

In addition, the number of the substituents may be 1 or 2 or more, and is preferably 1 to 5.

One kind or two or more kinds of the substituents may be present in combination.

For example, the hydroxyl group and the substituent having a fluorine atom may be present in combination.

Furthermore, in a case where there are a plurality of the substituents, it is preferable that at least one of substituents having a fluorine atom (more preferably a fluoroalkyl group, and still more preferably a perfluoroalkyl group (for example, a trifluoromethyl group)) is present.

A total number of fluorine atoms contained in the anion represented by General Formula (d1-1) is preferably 6 or more, more preferably 6 to 27, and still more preferably 6 to 9.

Among those, the hydrocarbon group of $R^{51}$ is preferably an aryl group, and more preferably a phenyl group. That is, among the compounds represented by General Formula (d1-1), the anion is preferably a benzenecarboxylic acid anion.

In other words, the second photoacid generator preferably has a benzenecarboxylic acid anion.

General Formula (BC)

Here, from the viewpoint that the LER performance of a pattern is more excellent, the benzenecarboxylic acid anion is preferably represented by General Formula (BC).

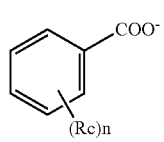

(BC)

In General Formula (BC), n and Rc each have the same definitions as in General Formula (BC'), and preferred ranges thereof are also the same.

In a case where the second photoacid generator is a photoacid generator formed of an anion and a cation, the kind of the cation is not particularly limited, and is, for example, preferably an ammonium cation, a sulfonium cation, or an iodonium cation, more preferably a sulfonium cation or an iodonium cation, and still more preferably a triarylsulfonium cation.

In addition, with regard to examples of the cation, reference can be made to the cations mentioned in the description of the first photoacid generator.

The second photoacid generator is preferably the compound formed of an anion and a cation as described above.

Among those, the second photoacid generator is preferably a compound represented by General Formula (F) formed of an anion and a cation.

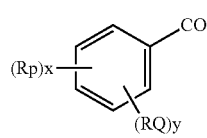

(F)

In General Formula (F), Rp represents a fluorine atom or a group including a fluorine atom (for example, a group including a fluorine atom as a part of the group, such as in a fluoroalkyl group). In a case where there are a plurality of Rp's, Rp's may be the same as or different from each other.

Among those. Rp is preferably a fluorine atom or an organic group having 1 to 20 carbon atoms (preferably having 1 to 10 carbon atoms, and more preferably having 1 to 6 carbon atoms), substituted with a fluorine atom. Examples of the organic group include an alkyl group (which may be linear or branched), a cycloalkyl group having 1 to 20 carbon atoms, substituted with a fluorine atom, an alkenyl group having 1 to 20 carbon atoms, substituted with a fluorine atom, an alkynyl group having 1 to 20 carbon atoms, substituted with a fluorine atom, an aryl group having 1 to 20 carbon atoms, substituted with a fluorine atom, and a heterocyclic group having 1 to 20 carbon atoms, substituted with a fluorine atom.

As the organic group, the alkyl group having 1 to 20 carbon atoms, substituted with a fluorine atom, the cycloalkyl group having 1 to 20 carbon atoms, substituted with a fluorine atom, or the aryl group having 1 to 20 carbon atoms, substituted with a fluorine atom is preferable, and the alkyl group having 1 to 20 carbon atoms, substituted with a fluorine atom, is more preferable. The organic group is preferably an organic group whose hydrogen atoms are all substituted with fluorine atoms (for example, a perfluoroalkyl group such as a trifluoromethyl group) is preferable.

Among those, Rp is preferably the fluorine atom or the perfluoroalkyl group.

Rq is a substituent other than Rp, and represents a group having no fluorine atom. In a case where there are a plurality of Rq's, Rq's may be the same as or different from each other.

Examples of Rq include a halogen atom excluding fluorine, a hydroxyl group, a carboxyl group, an alkyl group (preferably having 1 to 20 carbon atoms), a cyano group, a nitro group, an amino group which may have a substituent, a sulfamoyl group which may have a substituent, an alkoxy group (preferably having 1 to 20 carbon atoms), an aryloxy group, an alkylthio group, an arylthio group, an alkyloxycarbonyl group, an aryloxycarbonyl group, an alkylcarbonyloxy group, an arylcarbonyloxy group, a carbamoyl group, and a sulfamoyl group.

Among those, Rq is preferably the alkyl group having 1 to 20 carbon atoms, the alkoxy group having 1 to 20 carbon atoms, the carboxyl group, the hydroxyl group, or the halogen atom excluding fluorine atom.

x represents an integer of 1 to 5.

x is preferably 1 to 3.

y represents an integer of 0 to (5-x).

y is preferably 0 or 1.

$M^+$ represents a cation.

$M^+$ is preferably an ammonium cation, a sulfonium cation, or an iodonium cation, more preferably the sulfonium cation or the iodonium cation, and still more preferably a triarylsulfonium cation.

In addition, with regard to examples of the cation represented by $M^+$, reference can be made to the cations mentioned in the description of the first photoacid generator.

A total number of fluorine atoms contained in the anion (benzoate anion) having a moiety other than $M^+$ in the compound represented by General Formula (F) is 6 or more, preferably 6 to 27, and more preferably 6 to 9.

In other words, a total number of fluorine atoms contained in the group represented by Rp which may be present in plural number in the compound represented by General Formula (F) is 6 or more, preferably 6 to 27, and more preferably 6 to 9.

As an example of a method for calculating the total number of the fluorine atoms, in a case where the compound represented by General Formula (F) has one Rp which is a fluorine atom itself and two Rp's which are each a trifluoromethyl group, a total number of fluorine atoms contained in the anion in the compound represented by General Formula (F) is 7.

Examples of the anion contained in the compound represented by General Formula (F) are shown below.

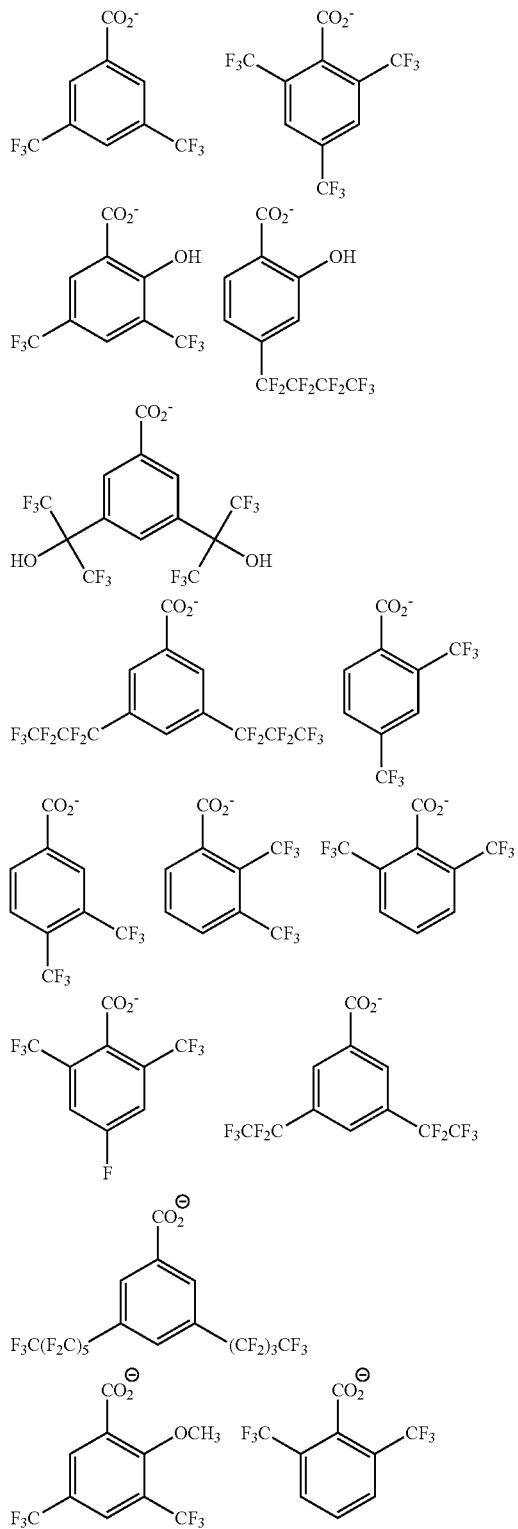

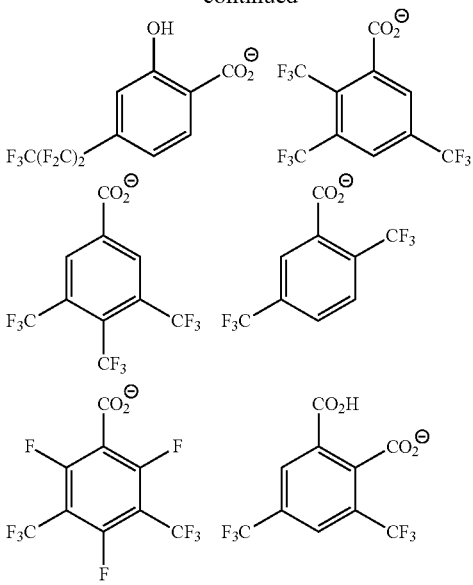

The second photoacid generator may be used singly or in combination of two or more kinds thereof.

The content of the second photoacid generator (a total content thereof in a case where a plurality of kinds of the second photoacid generators are present) in the resist composition of the embodiment of the present invention is preferably 1% to 30% by mass, more preferably 1% to 20% by mass, and still more preferably 1% to 10% by mass, with respect to the total solid content of the resist composition.

Moreover, a ratio of the content of the second photoacid generator to the content of the first photoacid generator (=(Content of second photoacid generator/Content of first photoacid generator)×100(% by mass)) in the resist composition of the embodiment of the present invention is preferably 10% to 100% by mass, more preferably 10% to 70% by mass, and still more preferably 10% to 50% by mass.

A total content of the first photoacid generator and the second photoacid generator (in a case where any one or more of the photoacid generators are present in plural number) is preferably 5% to 50% by mass, more preferably 6% to 40% by mass, and still more preferably 7% to 35% by mass, with respect to the total solid content of the resist composition.

<Surfactant>

The resist composition may include a surfactant. By incorporating the surfactant into the resist composition, it is possible to form a pattern having improved adhesiveness and less development defects with good sensitivity and resolution in a case where an exposure light source at a wavelength of 250 nm or less, and particularly 220 nm or less is used.

As the surfactant, fluorine-based and/or silicon-based surfactants are preferable.

Examples of the fluorine-based and/or silicon-based surfactants include the surfactants described in paragraph <0276> in US2008/0248425A. In addition, EFTOP EF301 and EF303 (manufactured by Shin-Akita Chemical Co., Ltd.); FLUORAD FC430, 431, and 4430 (manufactured by Sumitomo 3M Inc.); MEGAFACE F171, F173. F176, F189, F113, F110, F177, F120, and R08 (manufactured by DIC Corp.); SURFLON S-382, SC101, 102, 103, 104, 105, and 106 (manufactured by Asahi Glass Co., Ltd.), TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); KH-20 (manufactured by Asahi Kasei Co., Ltd.); or FTX-204G, 208G, 218G, 230G, 204D, 208D, 212D, 218D. and 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Moreover, in addition to the known surfactants as shown above, a surfactant may be synthesized using a fluoro aliphatic compound manufactured using a telomerization method (also referred to as a telomer method) or an oligomerization method (also referred to as an oligomer method). Specifically, a polymer including a fluoro aliphatic group derived from fluoro aliphatic compound may be used as the surfactant. This fluoro aliphatic compound can be synthesized, for example, by the method described in JP2002-090991A.

In addition, a surfactant other than the fluorine-based and/or silicon-based surfactants described in paragraph <0280> of US2008/0248425A may be used.

These surfactants may be used singly or in combination of two or more kinds thereof.

In a case where the resist composition contains a surfactant, the content of the surfactant is preferably 0.0001% to 2% by mass, and more preferably 0.0005% to 1% by mass, with respect to the total solid content of the resist composition.

<Crosslinking Agent>

In a case where a negative-tone resist composition is used as the resist composition of the embodiment of the present invention, it is also preferable that the resist composition of the embodiment of the present invention includes a crosslinking agent that crosslinks a resin by the action of an acid. The crosslinking agent is a compound having a crosslinkable group, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably the hydroxymethyl group, the alkoxymethyl group, the oxirane ring, or the oxetane ring.

The crosslinking agent is preferably a compound (also including a resin) having two or more crosslinkable groups.

Preferred examples of the crosslinking agent are shown below.

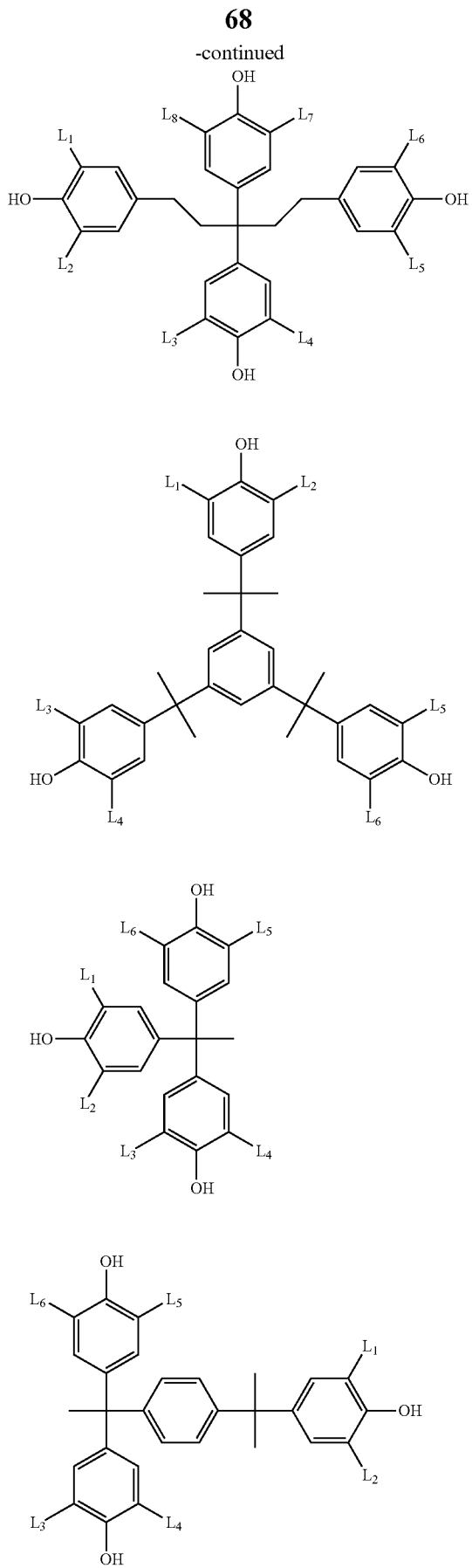

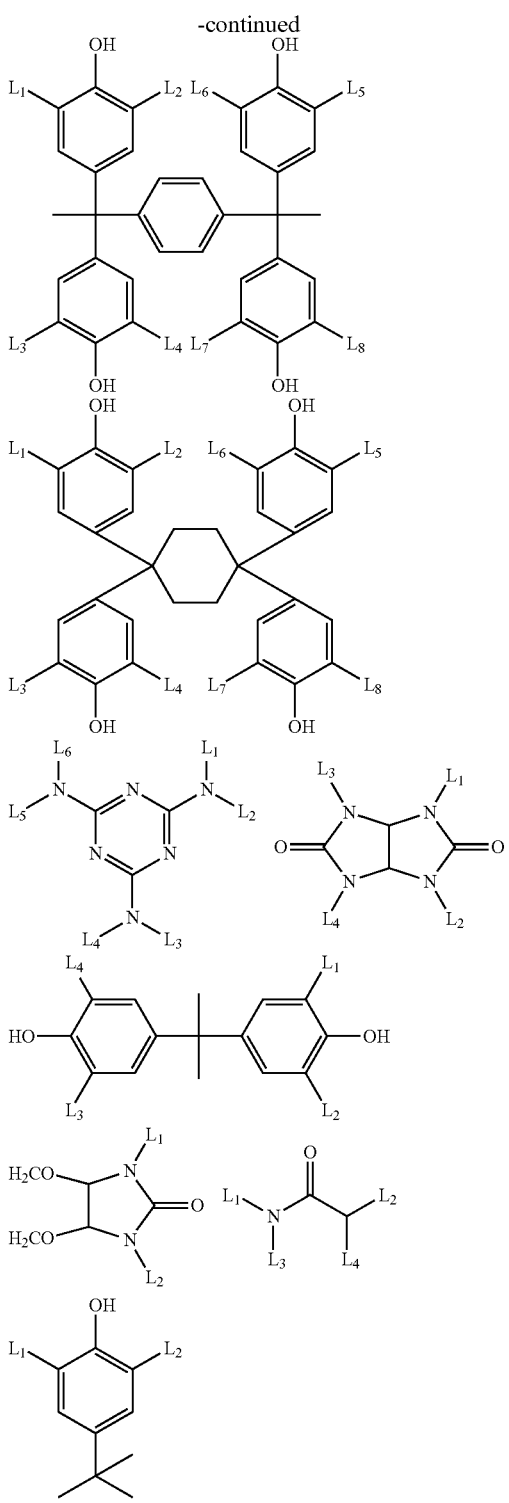

In the structural formulae, $L_1$ to $L_8$ each independently represent a hydrogen atom, a crosslinkable group (preferably a hydroxymethyl group, a methoxymethyl group, or an ethoxymethyl group), or an alkyl group having 1 to 6 carbon atoms.

Among those, $L_1$ to $L_8$ are each independently preferably the methoxymethyl group.

In a case where the resist composition includes a crosslinking agent, the content of the crosslinking agent is preferably 10% to 45% by mass, more preferably 15% to 40% by mass, and still more preferably 20% to 35% by mass, with respect to the total solid content of the resist composition.

<Solvent>

The resist composition of the embodiment of the present invention may include a solvent.

The solvent preferably includes at least any one of the following component (M1) or the following component (M2), and among these, the solvent more preferably includes the following component (M1).

In a case where the solvent includes the following component (M1), it is preferable that the solvent is substantially formed of the component (M1) or is a mixed solvent including at least the component (M1) and the component (M2).

Hereinafter, the component (M1) and the component (M2) will be shown.

Component (M1): Propylene glycol monoalkyl ether carboxylate

Component (M2): A solvent selected from the following component (M2-1) or a solvent selected from the following component (M2-2)

Component (M2-1): Propylene glycol monoalkyl ether, lactic acid ester, acetic acid ester, butyl butyrate, alkoxypropionic acid ester, chained ketone, cyclic ketone, lactone, or alkylene carbonate Component (M2-2): Another solvent having a flash point (hereinafter also referred to as fp) of 37° C. or higher.

In a case where the solvent and the above-mentioned resin (A) are used in combination, the coating property of the composition is improved and a pattern having a less number of development defects is obtained.

As the component (M1), at least one selected from the group consisting of propylene glycol monomethyl ether acetate (PGMEA), propylene glycol monomethyl ether propionate, and propylene glycol monoethyl ether acetate is preferable, and the propylene glycol monomethyl ether acetate (PGMEA) is more preferable.

As the component (M2-1), the following solvents are preferable.

As the propylene glycol monoalkyl ether, propylene glycol monomethyl ether (PGME) or propylene glycol monoethyl ether is preferable.

As the lactic acid ester, ethyl lactate, butyl lactate, or propyl lactate is preferable.

As the acetic acid ester, methyl acetate, ethyl acetate, butyl acetate, isobutyl acetate, propyl acetate, pentyl acetate, isoamyl acetate, methyl formate, ethyl formate, butyl formate, propyl formate, or 3-methoxybutyl acetate is preferable.

As the alkoxy propionic acid ester, methyl 3-methoxypropionate (MMP), or ethyl 3-ethoxypropionate (EEP) is preferable.

As the chained ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, γ-butyrolactone is preferable.

As the alkylene carbonate, propylene carbonate is preferable.

As the component (M2-1), propylene glycol monomethyl ether, ethyl lactate, ethyl 3-ethoxypropionate, methyl amyl ketone, cyclohexanone, butyl acetate, pentyl acetate, γ-butyrolactone, or propylene carbonate is more preferable.

Specific examples of the component (M2-2) include methyl 2-hydroxyisobutyrate (fp: 45° C.).

In addition, the "flash point" as mentioned herein means the value described in a reagent catalog of Tokyo Chemical Industry Co., Ltd. or Sigma-Aldrich Co. LLC.

From the viewpoint that the number of development defects is further decreased, a mixing ratio (mass ratio: M1/M2) of the component (M1) to the component (M2) is preferably 100/0 to 15/85, more preferably 100/0 to 40/60, and still more preferably 100/0 to 60/40.

Moreover, the solvent may include solvents other than the component (M1) and the component (M2). In this case, the content of the solvents other than the components (M1) and (M2) is preferably 5% to 30% by mass with respect to the total mass of the solvent.

Examples of such other solvents include ester-based solvents having 7 or more carbon atoms (preferably 7 to 14 carbon atoms, more preferably 7 to 12 carbon atoms, and still more preferably 7 to 10 carbon atoms) and 2 or less heteroatoms. Furthermore, the ester-based solvents having 7 or more carbon atoms and 2 or less heteroatoms do not include solvents corresponding to the above-mentioned component (M2).

As the ester-based solvents having 7 or more carbon atoms and 2 or less heteroatoms, amyl acetate, 2-methylbutyl acetate, 1-methylbutyl acetate, a hexyl acetate, pentyl propionate, a hexyl propionate, butyl propionate, isobutyl isobutyrate, heptyl propionate, butyl butanoate, or the like is preferable, and isoamyl acetate is more preferable.

<Other Additives>

The resist composition of the embodiment of the present invention may further include a hydrophobic resin, a dissolution inhibiting compound (a compound whose solubility in an organic developer decreases through decomposition by the action of an acid, with a molecular weight thereof being preferably 3,000 or less), a dye, a plasticizer, a light sensitizer, a light absorber, and/or a compound that accelerates dissolution in a developer (for example, a phenol compound having a molecular weight of 1,000 or less, or an alicyclic or aliphatic compound including a carboxyl group).

<A Value>

In a case where the resist composition is exposed using an EUV exposure machine, from the viewpoint that the LER performance of a pattern is more excellent, it is preferable that an A value defined by Formula (1) is high. The A value represents an EUV ray absorbing efficiency in terms of a mass ratio of the resist film, and the EUV ray absorbing efficiency of a resist film formed with the resist composition is increased.

$$A=([H]\times0.04+[C]\times1.0+[N]\times2.1+[O]\times3.6+[F]\times5.6+[S]\times0.04+[I]\times39.5)/([H]\times1+[C]\times12+[N]\times14+[O]\times16+[F]\times19+[S]\times32+[I]\times127)$$ Formula (1):

The A value is preferably 0.12 or more, more preferably 0.15 or more, and still more preferably 0.16 or more. An upper limit thereof is not particularly limited, and since in a case where the A value is extremely high, a transmittance to EUV rays of the resist film is reduced, the optical image profile in the resist film is deteriorated, and as a result, a good pattern profile is hardly obtained, the A value is preferably 0.24 or less, and more preferably 0.22 or less.

Since the EUV rays have a wavelength of 13.5 nm and have a shorter wavelength as compared with ArF (wavelength of 193 nm) light or the like, the number of incident photons is small upon exposure with the same sensitivity. With this, the effect of "photon shot noise" in which the number of photons disperses stochastically is significant, which causes deterioration in LER. In contrast, in a case where the A value is high, an EUV ray absorption of a resist film formed with the resist composition is high, the effect of the "photon shot noise" is reduced, and thus, the line edge roughness (LER) is reduced.

Moreover, in Formula (1), [H] represents a molar ratio of hydrogen atoms derived from the total solid content with respect to all the atoms of the total solid content in the resist composition, [C] represents a molar ratio of carbon atoms derived from the total solid content with respect to all the atoms of the total solid content in the resist composition, [N] represents a molar ratio of nitrogen atoms derived from the total solid content with respect to all the atoms of the total solid content in the resist composition, [O] represents a molar ratio of oxygen atoms derived from the total solid content with respect to all the atoms of the total solid content in the resist composition, [F] represents a molar ratio of fluorine atoms derived from the total solid content with respect to all the atoms of the total solid content in the resist composition, [S] represents a molar ratio of sulfur atoms derived from the total solid content with respect to all the atoms of the total solid content in the resist composition, and [I] represents a molar ratio of iodine atoms derived from the total solid content with respect to all the atoms of the total solid content in the resist composition.

For example, in a case where the resist composition of the embodiment of the present invention includes a resin having a repeating unit having a group in which a phenolic hydroxyl group is protected with an acid-leaving group, a first photoacid generator, a second photoacid generator, and a solvent, the resin, the first photoacid generator, and the second photoacid generator correspond to the solid content. That is, all the atoms in the total solid content correspond to a sum of all the atoms derived from the resin, all the atoms derived from the first photoacid generator, and all the atoms derived from the second photoacid generator. For example, [H] represents a molar ratio of hydrogen atoms derived from the total solid content with respect to all the atoms in the total solid content, and as described based on the above example, [H] represents a molar ratio of a sum of the hydrogen atom derived from the resin, the hydrogen atom derived from the first photoacid generator, and the hydrogen atom derived from the second photoacid generator, with respect to a sum of all the atoms derived from the resin, all the atoms derived from the first photoacid generator, and all the atoms derived from the second photoacid generator.

The A value can be calculated by computation of the structure of constituent components of the total solid content in the resist composition and the ratio of atoms contained in a case where the contents of the constituent components are already known. In addition, even in a case where the constituent components are unknown, it is possible to calculate the ratio of the number of constituent atoms according to an analytic approach such as elemental analysis, with regard to a resist film obtained after evaporating the solvent components of the resist composition.

<Preparation Method>

The concentration of the solid content in the resist composition of the embodiment of the present invention is preferably 0.5% to 30.0% by mass, and more preferably 1.0% to 20.0% by mass, from the viewpoint that the coating property is more excellent. The concentration of the solid content is a mass percentage of the mass (solid content) of other resist components excluding the solvent with respect to the total mass of the resist composition.

It is preferable that the resist composition of the embodiment of the present invention is used by dissolving the components in a predetermined organic solvent (preferably the mixed solvent), filtering the solution through a filter, and then applying it onto a predetermined support (substrate). The pore size of a filter for use in filtration using the filter is preferably 0.1 µm or less, more preferably 0.05 µm or less, and still more preferably 0.03 µm or less. The filter is preferably a polytetrafluoroethylene-made, polyethylene-made, or nylon-made filter. In the filtration using a filter, circulating filtration may be performed, or the filtration may be performed by connecting plural kinds of filters in series or in parallel, as disclosed in JP2002-062667A. In addition, the composition may be filtered in plural times. Furthermore, the composition may be subjected to a deaeration treatment or the like before or after filtration using a filter.

<Applications>

The resist composition of the embodiment of the present invention relates to an actinic ray-sensitive or radiation-sensitive resin composition whose properties change by undergoing a reaction upon irradiation with actinic rays or radiation. More specifically, the resist composition of the embodiment of the present invention relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Pattern Forming Method]

The present invention also relates to a pattern forming method using the resist composition. Hereinafter, the pattern forming method of an embodiment of the present invention will be described. Further, the resist film of an embodiment of the present invention will also be described together with the pattern forming method.

The pattern forming method of the embodiment of the present invention includes:
(i) a step of forming a resist film (actinic ray-sensitive or radiation-sensitive film) on a support with the above-mentioned actinic ray-sensitive or radiation-sensitive resin composition (resist composition) (film forming step),
(ii) a step of exposing the resist film (irradiating the resist film with actinic rays or radiation) (exposing step), and
(iii) a step of heating the exposed resist film (post-exposure baking (PEB) step)
(iv) a step of developing the heated resist film with a developer (developing step).

The pattern forming method of the embodiment of the present invention is not particularly limited as long as it includes the steps (i) to (iv), and may further have the following steps.

In the pattern forming method of the embodiment of the present invention, the exposing method in the exposing step (ii) is preferably liquid immersion exposure.

The pattern forming method of the embodiment of the present invention preferably includes a prebaking step (v) before the exposing step (ii).

The pattern forming method of the embodiment of the present invention may include the exposing step (ii) in plural times.

The pattern forming method of the embodiment of the present invention may include the pre-baking step (v) in plural times.

The pattern forming method of the embodiment of the present invention may include the post-exposure baking step (iii) in plural times.

In the pattern forming method of the embodiment of the present invention, the forming step (i), the exposing step (ii), the post-exposure baking step (iii), and the developing step (iv) as described above can be carried out by a method that is generally known.

The film thickness of the resist film (actinic ray-sensitive or radiation-sensitive film) of the embodiment of the present invention is preferably 200 nm or less, and more preferably 100 nm or less, from the viewpoint of improving resolving power. For example, in order to resolve a 1:1 line-and-space pattern having a line width of 20 nm or less, the film thickness of a resist film thus formed is preferably 80 nm or less. In a case where the film thickness is 80 nm or less, pattern collapse is less likely to occur upon application of a developing step which will be described later, and thus, more excellent resolution performance is obtained.

The film thickness is more preferably in the range of 15 to 60 nm. Such a film thickness can be obtained by setting the concentration of the solid content in the composition to an appropriate range to give an appropriate viscosity, and improving the coating property or the film forming property.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. The compositions for forming a protective film disclosed in, for example, US2007/0178407A, US2008/0085466A, US2007/0275326A, US2016/0299432A, US2013/0244438A, or WO2016/157988A can be suitably used. As the composition for forming a protective film, a composition including an acid diffusion control agent is also preferable.

The thickness of the protective film is preferably 10 to 200 nm, more preferably 20 to 100 nm, and still more preferably 40 to 80 nm.

The support is not particularly limited, and a substrate generally used in other photofabrication lithography processes or the like, in addition to a step of manufacturing a semiconductor such as an IC, or a step of manufacturing a circuit board for a liquid crystal, a thermal head, or the like, can be used. Specific examples of the support include inorganic substrates such as silicon, $SiO_2$, and SiN.

The heating temperature in the pre-baking step (v) is preferably 80° C. to 150° C., more preferably 80° C. to 140° C., and still more preferably 80° C. to 130° C. The heating time in the pre-baking step (v) is preferably 30 to 1,000 seconds, more preferably 60 to 800 seconds, and still more preferably 60 to 600 seconds. Heating can be carried out using a means comprised in an exposure device and a development device, or may also be performed using a hot plate or the like.

A light source wavelength used in the exposing step is not particularly limited, and examples thereof include infrared rays, visible light, ultraviolet rays, far ultraviolet rays. EUV rays, X-rays, and electron beams (EB). Among those, far ultraviolet rays are preferable, whose wavelength is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV rays (13 nm), and electron beams, and the KrF excimer laser, the ArF excimer laser, the EUV rays, or the electron beams are preferable.

The heating temperature in the post-exposure baking step I preferably 80° C. to 150° C., more preferably 80° C. to 140° C., and still more preferably 80° C. to 130° C.

The heating time is preferably 30 to 1,000 seconds, more preferably 60 to 800 seconds, and still more preferably 60 to 600 seconds.

Heating can be carried out using a means comprised in an exposure device and a development device, or may also be performed using a hot plate or the like.

In the developing step (iv), an alkali developer may be used or a developer including an organic solvent (hereinafter also referred to as an organic developer), but alkali development using an alkali developer is preferable.

As an alkali component included in the alkali developer, a quaternary ammonium salt typified by tetramethylammonium hydroxide (TMAH) is usually used. In addition to the developer, an aqueous alkali-solution such as an inorganic alkali, primary to tertiary amines, alcohol amine, and cyclic amine can also be used.

In addition, the alkali developer may include an appropriate amount of alcohols and/or a surfactant. The alkali concentration of the alkali developer is usually 0.1% to 20% by mass. The pH of the alkali developer is usually 10 to 15.

The time for performing development using the alkali developer is usually 10 to 300 seconds.

The alkali concentration, the pH, and the development time using the alkali developer can be appropriately adjusted depending on a pattern thus formed.

As the organic developer, a developer including at least one organic solvent selected from the group consisting of a ketone-based solvent, an ester-based solvent, an alcohol-based solvent, an amide-based solvent, an ether-based solvent, and hydrocarbon-based solvents is preferable.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs <0715> to <0718> of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass with respect to the total amount of the developer.

The developer may include an appropriate amount of a known surfactant, as desired.

The content of the surfactant is usually 0.001% to 5% by mass, preferably 0.005% to 2% by mass, and still more preferably 0.01% to 0.5% by mass with respect to the total amount of the developer.

The organic developer may include an acid diffusion control agent.

Examples of the developing method include a method in which a substrate is immersed in a tank filled with a developer for a certain period of time (a dip method), a method in which a developer is heaped up onto the surface of a substrate by surface tension, and then left to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method).

A combination of a step of performing development using an aqueous alkali-solution (an alkali developing step) and a step of performing development using a developer containing an organic solvent (an organic solvent developing step) may be used. Thus, a finer pattern can be formed since a pattern can be formed by keeping only a region with an intermediate exposure intensity from not being dissolved.

It is preferable that a step of performing washing using a rinsing liquid (a rinsing step) is included after the developing step (iv).

As the rinsing liquid used in the rinsing step after the developing step using an alkali developer, for example, pure water can be used. Pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step using a developer including an organic solvent is not particularly limited as long as the rinsing liquid does not dissolve the resist pattern, and a solution containing a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same solvents as those described for the developer including an organic solvent.

As the rinsing liquid used in the rinsing step in this case, a rinsing liquid including a monohydric alcohol is more preferable.

Examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol (MIBC).

A plurality of the respective components may be mixed or the respective components may be used in admixture with an organic solvent other than the above solvents.

In a case of using a solution including an organic solvent as the rinsing liquid, the moisture content in the rinsing liquid is preferably 10% by mass or less, more preferably 5% by mass or less, and still more preferably 3% by mass or less. By setting the moisture content to 10% by mass or less, good development characteristics are obtained.

In a case of using a solution including an organic solvent as the rinsing liquid, the rinsing liquid may include an appropriate amount of a surfactant.

In the rinsing step in such a case, the substrate which has been subjected to development using an organic developer is subjected to a washing treatment using a rinsing liquid including an organic solvent. A method for the washing treatment method is not particularly limited, and examples thereof include a method in which a rinsing liquid is continuously jetted on a substrate rotated at a constant rate (a rotation application method), a method in which a substrate is immersed in a tank filled with a rinsing liquid for a certain period of time (a dip method), a method in which a rinsing liquid is heaped up onto the surface of a substrate by surface tension, and then left to stand for a certain period of time (a puddle method), and a method in which a rinsing liquid is sprayed on the surface of a substrate (a spray method). Among those, it is preferable that a washing treatment is performed using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (post-baking). The developer and the rinsing liquid remaining between and inside the patterns are removed by the baking step. In the baking step after the rinsing step, the heating temperature is usually 40° C. to 160° C., and preferably 70° C. to 95° C., and the heating time is usually 10 seconds to 3 minutes, and preferably 30 to 90 seconds.

It is preferable that various materials (for example, a solvent, a developer, a rinsing liquid, a composition for forming an antireflection film, and a composition for forming a topcoat) used in the resist composition of the embodiment of the present invention, and the pattern forming method of the embodiment of the present invention do not include impurities such as metal components, isomers, and residual monomers. The content of the impurities included in the various materials is preferably 1 ppm by mass or less, more preferably 100 ppt by mass or less, and still more preferably 10 ppt by mass or less, and particularly preferably, the impurities are not substantially included (no higher than a detection limit of a measurement device).

Examples of a method for removing impurities such as metals from the various materials include filtration using a filter. As for the pore diameter of the filter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which had been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in JP2016-206500A.

In addition, as a method for reducing the impurities such as metals included in various materials, metal content selects the less material as a raw material constituting the various materials, performing filtering using a filter of the raw material constituting the various materials, equipment the inner and a method such as performing distillation under conditions suppressing as much as possible equal to contamination is lined with TEFLON (registered trademark). Preferred conditions in the filtering using a filter to be performed on the raw material constituting the various materials are similar to the above-mentioned conditions.

It is preferable that the inside of a device used in a step of producing a raw material (a resin, a photoacid generator, and the like) for the resist composition (a raw material synthesizing step and the like) is partially or wholly subjected to a glassing treatment since the content of metal impurities of the resist composition is reduced (for example, a ppt-by-mass order). Such a method is described in, for example, Japan Chemical Daily on Dec. 21, 2017.

In order to prevent impurities from being incorporated into the various materials, it is preferable that the various materials are preserved in the container described in US2015/0227049A, JP2015-123351A. or the like.

A method for improving the surface roughness of a pattern may be applied to a pattern formed by the pattern forming method of the embodiment of the present invention. Examples of the method for improving the surface roughness of a pattern include the method of treating a resist pattern by plasma of a hydrogen-containing gas disclosed in US2015/0104957A. In addition, known methods as described in JP2004-235468A, US2010/0020297A, and Proc. of SPIE Vol. 8328 83280N-1 "EUV Resist Curing Technique for LWR Reduction and Etch Selectivity Enhancement" may be applied.

In addition, a pattern formed by the method can be used as a core material (core) of the spacer process disclosed in JP1991-270227A (JP-H03-270227A) and US2013/0209941A, for example.

[Method for Manufacturing Electronic Device]

Moreover, the present invention also relates to a method for manufacturing an electronic device, including the above-mentioned pattern forming method. An electronic device manufactured by the method for manufacturing an electronic device of an embodiment of the present invention is suitably mounted on electric or electronic equipment (for example,

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to the Examples shown below.

Example X

In Example X, evaluation of the resist composition of the embodiment of the present invention was performed.

[Resist Composition]

Various components included in the resist compositions used in Examples or Comparative Examples are shown below.

<Resin>

Resins (P-1) to (P-18) and (RP-1) were synthesized using monomers shown below.

P-1

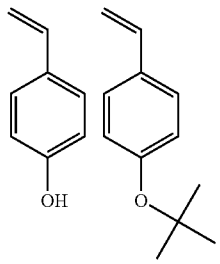

P-2

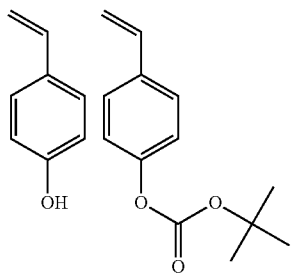

P-3

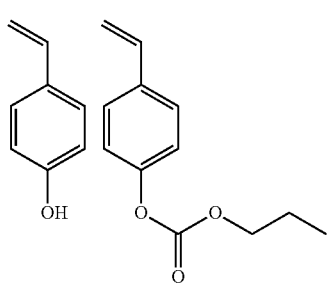

P-4

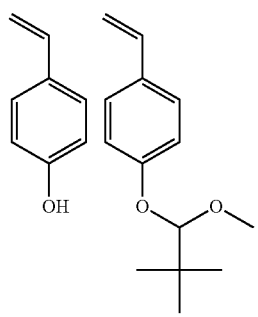

P-5

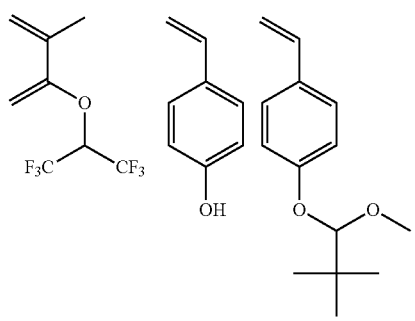

P-6

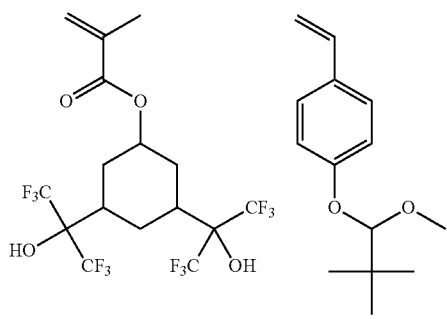

P-7

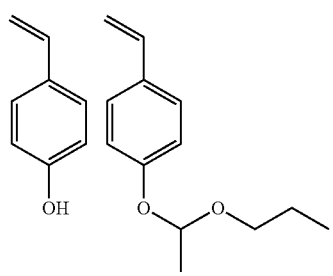

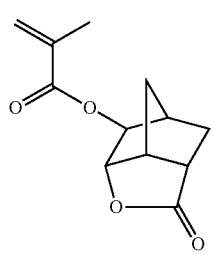

P-8
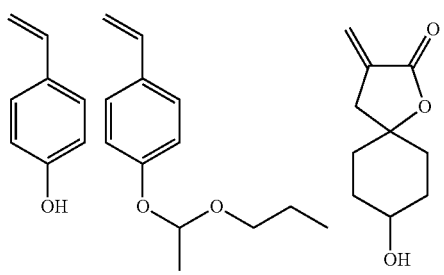
P-9
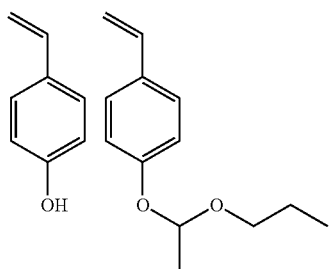
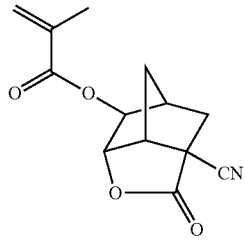
P-10
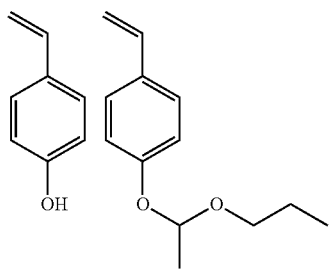
P-11
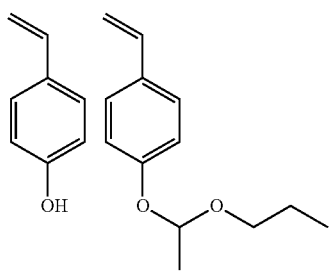
P-12
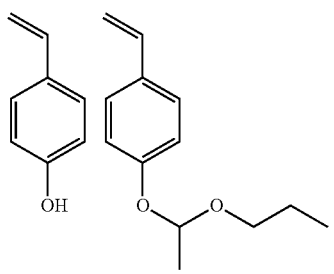
P-13
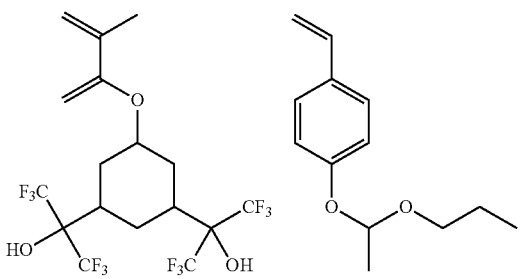
P-14
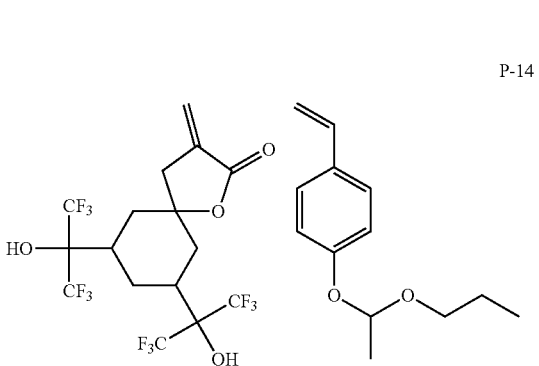
P-15
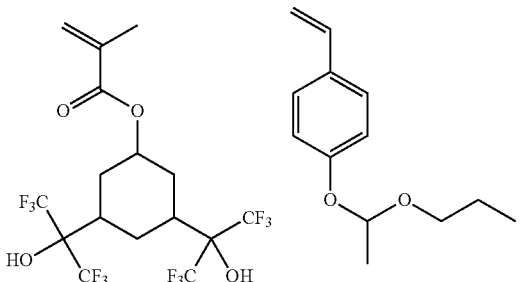
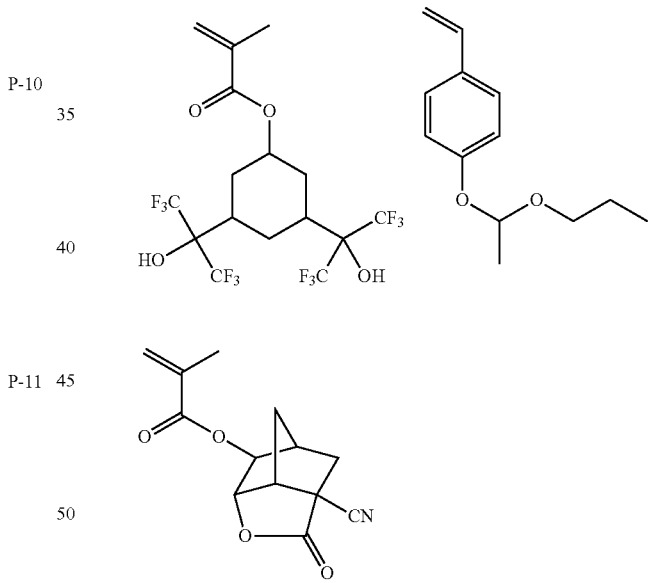
P-16
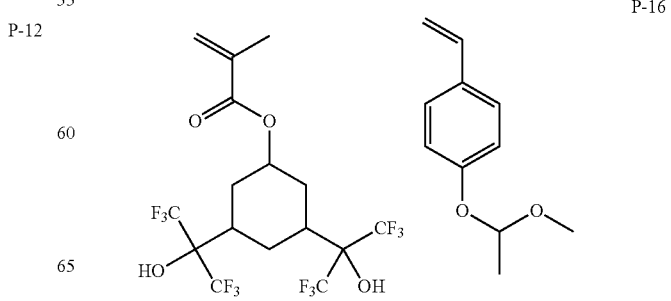

-continued

P-17
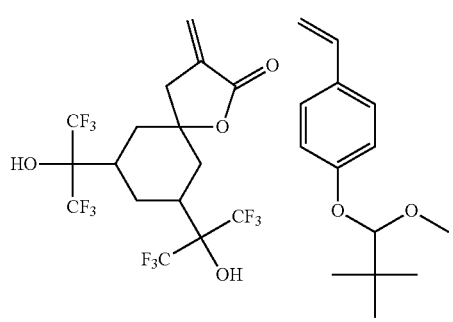

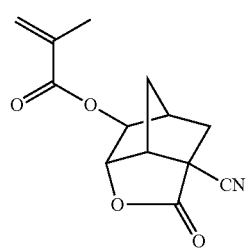

P-18
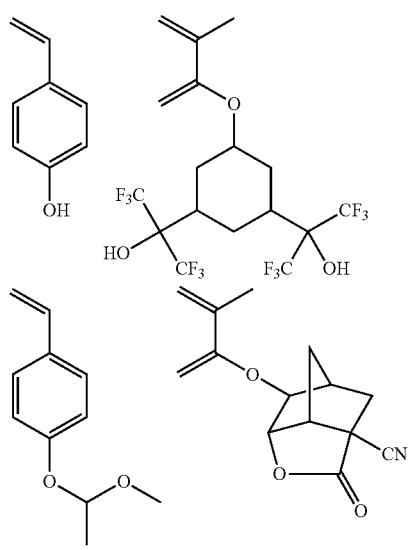

RP-1
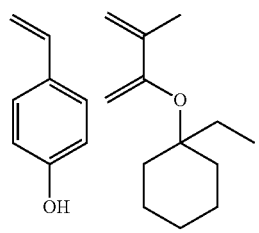

The compositional ratios (corresponding to the respective monomers in the order from the left side (molar ratios)), the weight-average molecular weights (Mw), and the dispersities (Mw/Mn) of the respective monomers in the resins are shown in Table 1.

TABLE 1

|  | Compositional ratio | Mw | Mw/Mn |
|---|---|---|---|
| P-1 | 60/40 | 5,000 | 1.6 |
| P-2 | 60/40 | 5,000 | 1.6 |
| P-3 | 60/40 | 5,000 | 1.6 |

TABLE 1-continued

|  | Compositional ratio | Mw | Mw/Mn |
|---|---|---|---|
| P-4 | 60/40 | 5,000 | 1.6 |
| P-5 | 10/50/40 | 5,000 | 1.7 |
| P-6 | 60/40 | 5,000 | 1.6 |
| P-7 | 40/40/20 | 5,000 | 1.5 |
| P-8 | 40/40/20 | 5,000 | 1.6 |
| P-9 | 40/40/20 | 5,000 | 1.6 |
| P-10 | 70/30 | 5,000 | 1.6 |
| P-11 | 60/40 | 9,000 | 1.6 |
| P-12 | 60/40 | 5,000 | 1.3 |
| P-13 | 40/60 | 5,000 | 1.6 |
| P-14 | 40/60 | 5,000 | 1.5 |
| P-15 | 25/50/25 | 5,000 | 1.6 |
| P-16 | 40/60 | 5,000 | 1.6 |
| P-17 | 10/50/40 | 5,000 | 1.7 |
| P-18 | 15/10/50/25 | 5,000 | 1.7 |
| RP-1 | 60/40 | 5,000 | 1.6 |

<First Photoacid Generator>

Compounds shown below were used as the first photoacid generator.

PAG-1
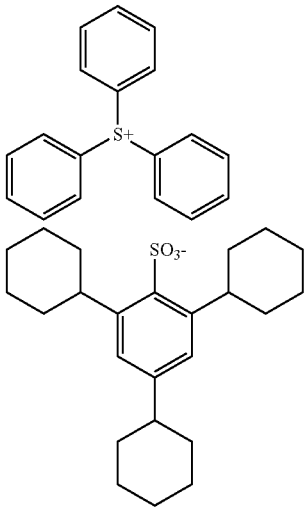

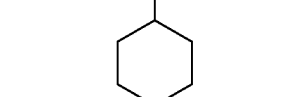

PAG-2
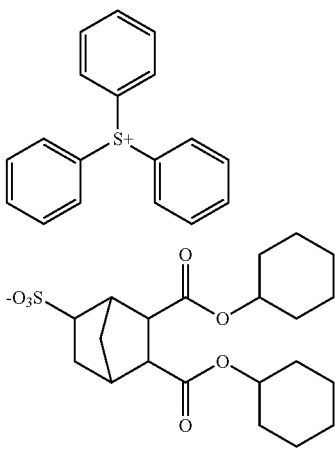

PAG-3
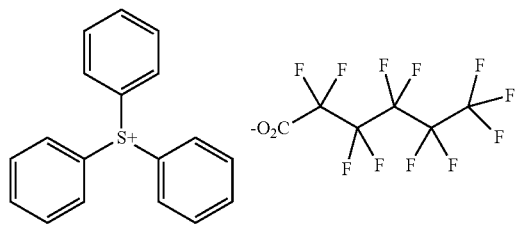
PAG-4
PAG-5
PAG-6
PAG-7
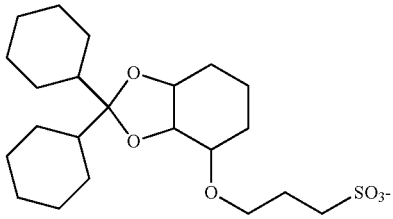
RPAG-1
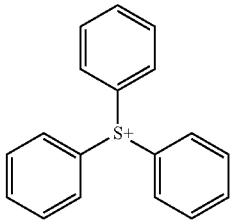
<Second Photoacid Generator>
Compounds shown below were used as the second photoacid generator.
PB-1
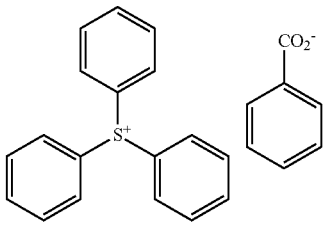
PB-2
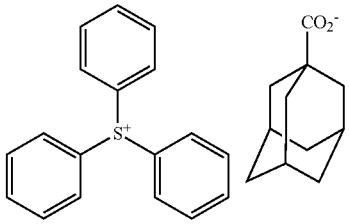
PB-3
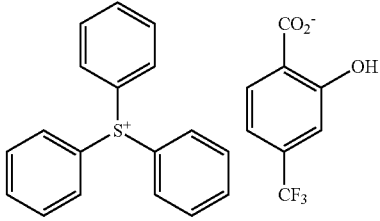

PB-4 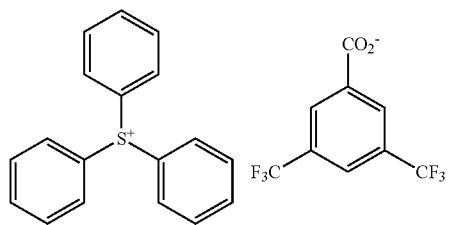
PB-5 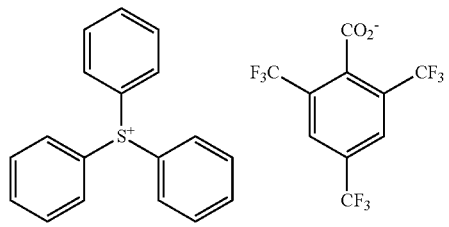
RPB-1 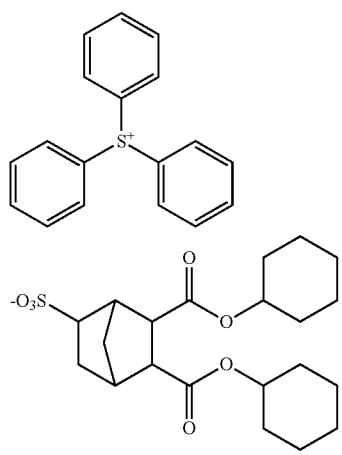
PB-6 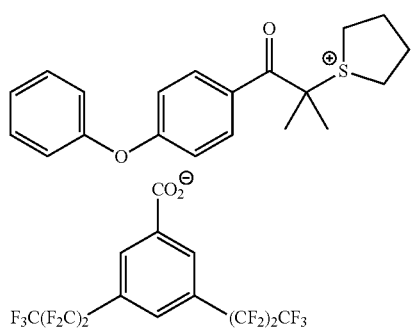
PB-7 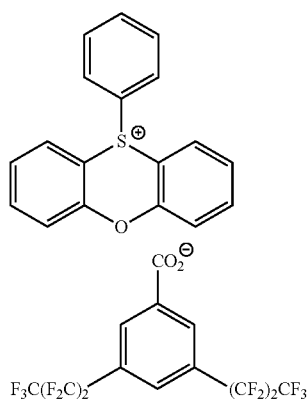
PB-8 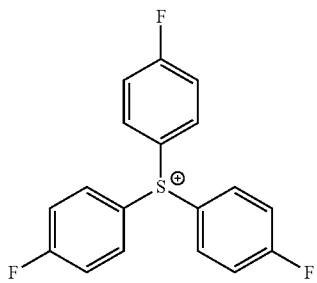
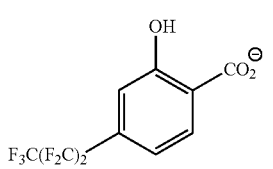
PB-9 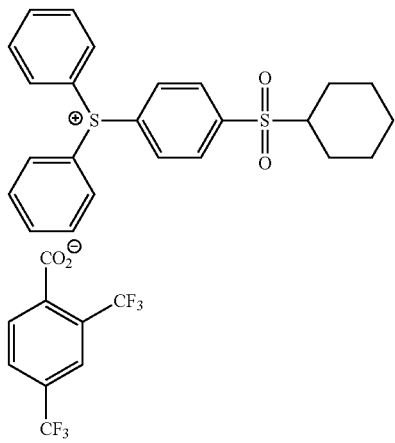
PB-10 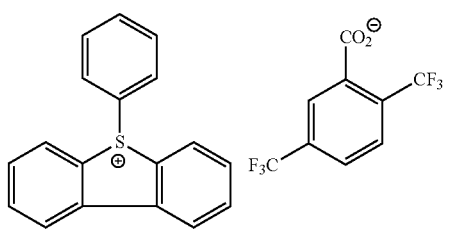
PB-11 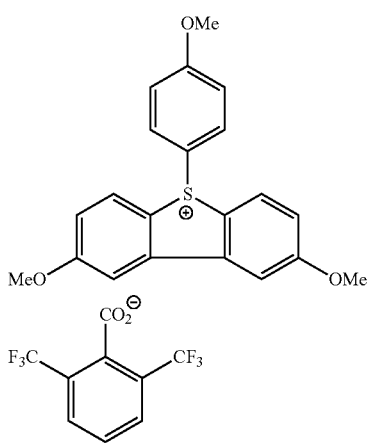

-continued

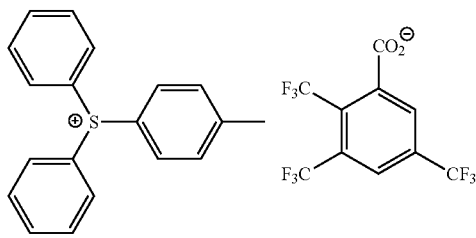
PB-12

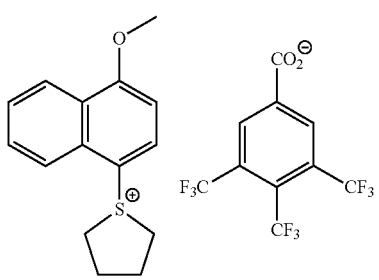
PB-13

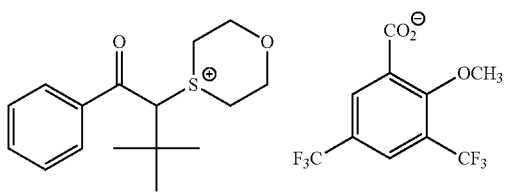
PB-14

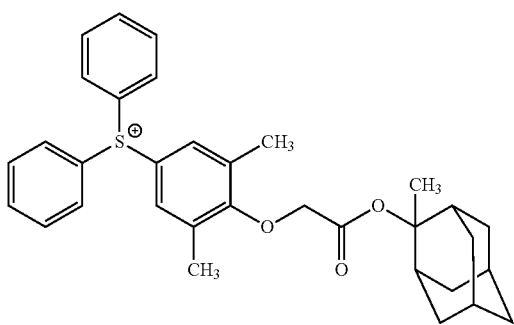
PB-15

PB-16

-continued

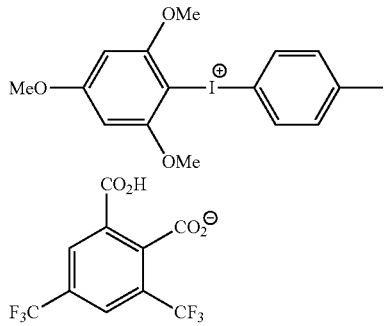
PB-17

Moreover, (PB-4) to (PB-17) in the second photoacid generator were synthesized as follows.

In addition, (PB-4) and (PB-5) in the obtained second photoacid generator were identified using $^1$H nuclear magnetic resonance (NMR) and $^{19}$F NMR. At this time, deuterochloroform (CDCl$_3$) was used as any of the solvents.

(PB-4)

3,5-Bis(trifluoromethyl)benzoic acid (manufactured by Tokyo Chemical Industry Co., Ltd.) (12.9 g), potassium carbonate (10 g), triphenylsulfonium bromide (18.8 g), chloroform (200 mL), and water (200 mL) were added to a flask, and the mixture was stirred at room temperature for 1 hour. The obtained mixed liquid was transferred to a separating funnel, the aqueous phase was removed, and the organic phase was washed with deionized water (200 mL) eight times. The obtained organic phase was concentrated under reduced pressure to obtain a compound (PB-4) (21.2 g).

The results as identified using $^1$H NMR and $^{19}$F NMR were as follows.

$^1$H NMR (CDCl$_3$): 7.58-7.80 (m, 16H), 8.88 (s, 2H).

$^{19}$F NMR (CDCl$_3$): −62.47 (s, 6F).

(PB-5)

1,3,5-Tris(trifluoromethyl)benzene (5.8 g) and diethyl ether (25 mL) were added to a flask and cooled to 0° C. under a nitrogen atmosphere. To this mixed liquid was added dropwise an n-butyllithium/hexane solution (1.6 M, 12.5 mL), and after the dropwise addition, the mixture was stirred for 2 hours. Thereafter, dry ice (5 g) was added to the mixed liquid. After settlement of foams, aqueous hydrochloric acid (1 M, 50 mL) was added to the mixed liquid. The mixture was extracted with chloroform and the collected organic phase was concentrated to obtain 2,4,6-tris(trifluoromethyl) benzoic acid (3.3 g).

2,4,6-Tris(trifluoromethyl)benzoic acid (3.3 g), potassium carbonate (0.7 g), triphenylsulfonium bromide (4.3 g), methylene chloride (50 mL), and water (50 mL) were added to a flask, and the mixture was stirred at room temperature for 1 hour. The mixed liquid was transferred to a separating funnel, the aqueous phase was removed, and the organic phase was washed with deionized water (100 mL) eight times. The obtained organic phase was concentrated under reduced pressure to obtain a compound (PB-5) (4.0 g).

The results as identified using $^1$H NMR and $^{19}$F NMR were as follows.

$^1$H NMR (CDCl$_3$): 7.58-7.80 (m, 15H), 7.97 (s, 2H).

$^{19}$F NMR (CDCl$_3$): −62.78 (s, 3F), −59.88 (s, 6F).

(PB-6)

3,5-Bis(tridecafluorohexyl)benzoic acid was synthesized from methyl 3,5-diiodobenzoate and tridecafluorohexyl iodide with reference to the synthesis method in literature (Tetrahedron, 2002, vol. 58, pp. 3999 to 4005). Thereafter, (PB-6) was synthesized by the same synthesis method, except that triphenylsulfonium bromide was changed to a corresponding sulfonium salt in the synthesis method for (PB-4).

(PB-7)

3,5-Bis(heptafluoropropyl)benzoic acid was synthesized from methyl 3,5-diiodobenzoate and heptafluoropropyl iodide with reference to the synthesis method in literature (Tetrahedron, 2002, vol. 58, pp. 3999 to 4005). Thereafter. (PB-7) was synthesized by the same synthesis method, except that triphenylsulfonium bromide was changed to a corresponding sulfonium salt in the synthesis method for (PB-4).

(PB-8)

4-(Heptafluoropropyl)salicylic acid was synthesized from 4-methyl iodosalicylate and heptafluoropropyl iodide with reference to the synthesis method in literature (Tetrahedron, 2002, vol. 58, pp. 3999 to 4005). Thereafter. (PB-8) was synthesized by the same synthesis method, except that triphenylsulfonium bromide was changed to a corresponding sulfonium salt in the synthesis method for (PB-4).

(PB-9)

1,3-Bis(trifluoromethyl)benzoic acid was obtained by performing the same reaction using 1-bromo-2,4-bis(trifluoromethyl)benzene instead of 1,3,5-tris(trifluoromethyl)benzene in the synthesis of a carboxylic acid serving as a raw material for (PB-5). Thereafter, (PB-9) was synthesized by the same synthesis method as the synthesis method for (PB-5), except that triphenylsulfonium bromide was changed to a corresponding sulfonium salt.

(PB-10)

1,4-Bis(trifluoromethyl)benzoic acid was obtained by performing the same reaction using 1-bromo-2,5-bis(trifluoromethyl)benzene instead of 1,3,5-tris(trifluoromethyl)benzene in the synthesis of a carboxylic acid serving as a raw material for (PB-5). Thereafter. (PB-10) was synthesized by the same synthesis method as the synthesis method for (PB-5), except that triphenylsulfonium bromide was changed to a corresponding sulfonium salt.

(PB-11)

2,6-Bis(trifluoromethyl)benzoic acid was obtained by performing the same reaction using 1,3-bis(trifluoromethyl)benzene instead of 1,3,5-tris(trifluoromethyl)benzene in the synthesis of a carboxylic acid serving as a raw material for (PB-5). Thereafter, (PB-11) was synthesized by the same synthesis method as the synthesis method for (PB-5), except that triphenylsulfonium bromide was changed to a corresponding sulfonium salt.

(PB-12)

2,3,5-Tris(trifluoromethyl)benzoic acid was obtained by the method described in literature (Chemistry-A European Journal, 1998, vol. 4, pp. 1281 to 1286). Thereafter, (PB-12) was synthesized by the same synthesis method as the synthesis method for (PB-4), except that triphenylsulfonium bromide was changed to a corresponding sulfonium salt.

(PB-13) 3,4,5-Tris(trifluoromethyl)benzoic acid was obtained by the method described in literature (Zhurnal Organicheskoi Khimii, 1977, vol. 13, pp. 2129 to 2135). Thereafter, (PB-13) was synthesized by the same synthesis method as the synthesis method for (PB-4), except that triphenylsulfonium bromide was changed to a corresponding sulfonium salt.

(PB-14)

2-Methoxy-3,4-bis(trifluoromethyl)benzoic acid was obtained by the method described in literature (Synthetic Communications, 1997, vol. 27, pp. 3581 to 3590). Thereafter, (PB-14) was synthesized by the same synthesis method as the synthesis method for (PB-4), except that triphenylsulfonium bromide was changed to a corresponding sulfonium salt.

(PB-15)

1,3,5-Trifluoro-2,4-bis(trifluoromethyl)benzoic acid was obtained by the method described in literature (Zhurnal Organicheskoi Khimii, 1991, vol. 27, pp. 2183 to 2191). Thereafter, (PB-15) was synthesized by the same synthesis method as the synthesis method for (PB-4), except that triphenylsulfonium bromide was changed to a corresponding sulfonium salt.

(PB-16)

2-Hydroxy-3,4-bis(trifluoromethyl)benzoic acid was obtained by the method described in literature (Synthetic Communications, 1997, vol. 27, pp. 3581 to 3590). Thereafter, (PB-16) was synthesized by the same synthesis method as the synthesis method for (PB-4), except that triphenylsulfonium bromide was changed to a corresponding sulfonium salt.

(PB-17)

2-Hydroxy-3,4-bis(trifluoromethyl)benzoic acid was obtained by the method described in literature (Zhurnal Organicheskoi Khimii, 1970, vol. 6, pp. 2498 to 2503). Thereafter. (PB-17) was synthesized by the same synthesis method as the synthesis method for (PB-4), except that triphenylsulfonium bromide was changed to a corresponding sulfonium salt.

<Basic Substance>

Basic substances used for comparative purposes are shown below.

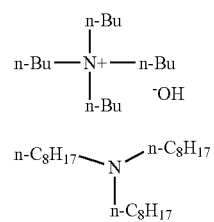

<Solvent>

As the solvent, a mixed solvent of propylene glycol monomethyl ether acetate (PGMEA) and propylene glycol monomethyl ether (PGME) was used.

(PGMEA/PGME=80/20 (mass ratio)).

<Preparation of Resist Composition>

The above-mentioned respective components were mixed such that the concentration of the solid content with respect to the total mass of the composition became 1.2% by mass and a ration of the solid content shown in Table 2 was met. The obtained mixed liquid was filtered through a polyethylene filter having a pore size of 0.03 μm to prepare each of resist compositions.

In addition, in the resist composition, the solid content means all the components excluding the solvent. The obtained resist compositions were used in Examples and Comparative Examples.

[Formation of Pattern]

<Formation of Resist Film>

AL412 (manufactured by Brewer Science) was applied onto a silicon wafer and heated at 200° C. for 60 seconds to form a underlayer film having a film thickness of 20 nm. Further, each of the resist compositions was applied thereonto and heated at 100° C. for 60 seconds to form a resist film with a film thickness of 30 nm.

<Exposure to Development>

The obtained resist film was subjected to exposure through a reflective mask with a pitch of 44 nm and a line width of 22 nm, using an EUV exposure machine (manufactured by ASML: NXE 3350, NA 0.33, Dipole 90°, outer sigma 0.87, inner sigma 0.35) (exposing step).

The exposed resist film was baked at 90° C. for 60 seconds (post-exposure baking step), then developed with a 2.38% aqueous tetramethylammonium hydroxide (TMAH) solution for 30 seconds (developing step), and further rinsed with water for 20 seconds to obtain a pattern. Furthermore, a time taken to initiation of the post-exposure baking step after the exposure was 1 minute or shorter. Immediately (within 1 minute) after performing the post-exposure baking step, development was performed.

[Evaluation]

<Sensitivity>

While changing an exposure dose in the above-mentioned exposing step, a line-and-space pattern was formed.

The line width of the pattern was measured, and the exposure dose (optimal exposure dose) at a point that the line width reached 22 nm was determined and used as a sensitivity (mJ/cm$^2$). A smaller value thereof indicates more excellent sensitivity of the resist film.

<Line Edge Roughness (LER)>

The line-and-space pattern resolved at the optimal exposure dose in the above-mentioned exposing step was observed from an upper part thereof using a critical dimension scanning electron microscope (SEM (CG-4100 manufactured by Hitachi High Technologies Corporation)). At this time, a distance from the center of the pattern to an edge was measured at any points (100 points) and a measurement deviation thereof was evaluated as 3σ. A smaller value thereof indicates better LER performance.

<Change in Line Width of Pattern by Post-Exposure Delay>

A pattern was formed in the same manner as described above, except that the resist film obtained in the above-mentioned exposing step was exposed at an optimal exposure dose, left to stand for 3 hours (post-exposure delay), and then subjected to a post-exposure baking step.

The obtained line-and-space pattern was observed with the critical dimension scanning electron microscope, and a change in the line width of the pattern between ones in the presence and the absence of the post-exposure delay was evaluated.

A smaller value of the change in the line width indicates further suppression of the change in the line width of the pattern by post-exposure delay.

The results are summarized in the following table.

In the table, the section of "pKa" shows the pKa of an acid generated by the photoacid generator.

In the table, in Comparative Example 3, a description of "Unresolved" in the section of "Evaluation" indicates that a pattern could not be formed in an example using the resist composition of Comparative Example 3.

TABLE 2

| | Resin | | First photoacid generator | | | Second photoacid generator (or basic substance) | | | Physical properties | | Evaluation | | |
|---|---|---|---|---|---|---|---|---|---|---|---|---|---|
| | | Blend | | | | | | | | | | | |
| | Type | Addition amount Parts by mass | Type | pKa | Addition amount Parts by mass | Type | pKa | Addition amount Parts by mass | A value | Resin Tg (° C.) | Sensitivity mJ/cm$^2$ | LER nm | Change in line width nm |
| Example 1 | P-1 | 10 | PAG-1 | -0.22 | 1.5 | PB-1 | 4.20 | 0.5 | 0.10 | 116 | 45.0 | 2.4 | 0.05 |
| Example 2 | P-2 | 10 | PAG-1 | -0.22 | 1.5 | PB-1 | 4.20 | 0.5 | 0.10 | 114 | 30.0 | 2.4 | 0.05 |
| Example 3 | P-3 | 10 | PAG-1 | -0.22 | 1.5 | PB-1 | 4.20 | 0.5 | 0.10 | 87 | 22.5 | 2.4 | 0.05 |
| Example 4 | P-4 | 10 | PAG-1 | -0.22 | 1.5 | PB-1 | 4.20 | 0.5 | 0.10 | 110 | 18.0 | 2.4 | 0.05 |
| Example 5 | P-5 | 10 | PAG-1 | -0.22 | 1.5 | PB-1 | 4.20 | 0.5 | 0.11 | 102 | 18.0 | 2.1 | 0.05 |
| Example 6 | P-6 | 10 | PAG-1 | -0.22 | 1.5 | PB-1 | 4.20 | 0.5 | 0.16 | 115 | 18.0 | 1.7 | 0.05 |
| Example 7 | P-7 | 10 | PAG-1 | -0.22 | 1.5 | PB-1 | 4.20 | 0.5 | 0.10 | 91 | 22.5 | 2.1 | 0.05 |
| Example 8 | P-8 | 10 | PAG-1 | -0.22 | 1.5 | PB-1 | 4.20 | 0.5 | 0.10 | 120 | 22.5 | 2.1 | 0.05 |
| Example 9 | P-9 | 10 | PAG-1 | -0.22 | 1.5 | PB-1 | 4.20 | 0.5 | 0.10 | 116 | 22.5 | 2.0 | 0.05 |
| Example 10 | P-10 | 10 | PAG-1 | -0.22 | 1.5 | PB-1 | 4.20 | 0.5 | 0.10 | 97 | 22.5 | 2.8 | 0.05 |
| Example 11 | P-11 | 10 | PAG-1 | -0.22 | 1.5 | PB-1 | 4.20 | 0.5 | 0.10 | 87 | 22.5 | 2.8 | 0.05 |
| Example 12 | P-12 | 10 | PAG-1 | -0.22 | 1.5 | PB-1 | 4.20 | 0.5 | 0.10 | 87 | 22.5 | 2.1 | 0.05 |
| Example 13 | P-3 | 10 | PAG-2 | 1.75 | 1.5 | PB-1 | 4.20 | 0.5 | 0.10 | 87 | 22.5 | 3.1 | 0.05 |
| Example 14 | P-3 | 10 | PAG-3 | 0.20 | 1.5 | PB-1 | 4.20 | 0.5 | 0.11 | 87 | 22.5 | 3.8 | 0.05 |
| Example 15 | P-3 | 10 | PAG-4 | -0.20 | 1.5 | PB-1 | 4.20 | 0.5 | 0.10 | 87 | 22.5 | 2.7 | 0.05 |
| Example 16 | P-3 | 10 | PAG-5 | -1.98 | 1.5 | PB-1 | 4.20 | 0.5 | 0.10 | 87 | 22.5 | 2.7 | 0.10 |
| Example 17 | P-3 | 10 | PAG-6 | -0.29 | 1.5 | PB-1 | 4.20 | 0.5 | 0.10 | 87 | 22.5 | 2.2 | 0.05 |
| Example 18 | P-3 | 10 | PAG-7 | 1.65 | 1.5 | PB-1 | 4.20 | 0.5 | 0.10 | 87 | 22.5 | 2.9 | 0.05 |
| Example 19 | P-3 | 10 | PAG-1 | -0.22 | 1.5 | PB-2 | 4.86 | 0.5 | 0.10 | 87 | 22.5 | 3.5 | 0.05 |
| Example 20 | P-3 | 10 | PAG-1 | -0.22 | 1.5 | PB-3 | 2.45 | 0.5 | 0.10 | 87 | 22.5 | 1.9 | 0.05 |
| Example 21 | P-3 | 10 | PAG-1 | -0.22 | 1.5 | PB-4 | 3.34 | 0.5 | 0.10 | 87 | 22.5 | 1.6 | 0.05 |
| Example 22 | P-3 | 10 | PAG-1 | -0.22 | 1.5 | PB-5 | 1.78 | 0.5 | 0.10 | 87 | 22.5 | 1.3 | 0.08 |
| Example 23 | P-3 | 10 | PAG-1 | -0.22 | 1.5 | PB-6 | 3.37 | 0.5 | 0.10 | 87 | 26.5 | 1.9 | 0.08 |
| Example 24 | P-3 | 10 | PAG-1 | -0.22 | 1.5 | PB-7 | 3.32 | 0.5 | 0.10 | 87 | 24.3 | 1.7 | 0.08 |
| Example 25 | P-3 | 10 | PAG-1 | -0.22 | 1.5 | PB-8 | 2.48 | 0.5 | 0.10 | 87 | 22.5 | 1.3 | 0.08 |
| Example 26 | P-3 | 10 | PAG-1 | -0.22 | 1.5 | PB-9 | 2.72 | 0.5 | 0.10 | 87 | 22.5 | 1.3 | 0.08 |
| Example 27 | P-3 | 10 | PAG-1 | -0.22 | 1.5 | PB-10 | 2.80 | 0.5 | 0.10 | 87 | 24.3 | 1.3 | 0.08 |
| Example 28 | P-3 | 10 | PAG-1 | -0.22 | 1.5 | PB-11 | 2.27 | 0.5 | 0.10 | 87 | 22.5 | 1.3 | 0.08 |
| Example 29 | P-3 | 10 | PAG-1 | -0.22 | 1.5 | PB-12 | 2.39 | 0.5 | 0.10 | 87 | 22.5 | 1.4 | 0.08 |
| Example 30 | P-3 | 10 | PAG-1 | -0.22 | 1.5 | PB-13 | 2.83 | 0.5 | 0.10 | 87 | 26.5 | 1.4 | 0.08 |
| Example 31 | P-3 | 10 | PAG-1 | -0.22 | 1.5 | PB-14 | 3.23 | 0.5 | 0.10 | 87 | 26.5 | 1.3 | 0.08 |

TABLE 2-continued

| | Blend | | | | | | | | Physical properties | | Evaluation | | |
|---|---|---|---|---|---|---|---|---|---|---|---|---|---|
| | Resin | | First photoacid generator | | | Second photoacid generator (or basic substance) | | | | | | | Change in line width nm |
| | Type | Addition amount Parts by mass | Type | pKa | Addition amount Parts by mass | Type | pKa | Addition amount Parts by mass | A value | Resin Tg (° C.) | Sensitivity mJ/cm$^2$ | LER nm | |
| Example 32 | P-3 | 10 | PAG-1 | −0.22 | 1.5 | PB-15 | 1.42 | 0.5 | 0.10 | 87 | 22.5 | 1.4 | 0.08 |
| Example 33 | P-3 | 10 | PAG-1 | −0.22 | 1.5 | PB-16 | 1.80 | 0.5 | 0.10 | 87 | 22.5 | 1.3 | 0.08 |
| Example 34 | P-3 | 10 | PAG-1 | −0.22 | 1.5 | PB-17 | 1.79 | 0.5 | 0.10 | 87 | 29.0 | 1.3 | 0.08 |
| Example 35 | P-13 | 10 | PAG-1 | −0.22 | 1.5 | PB-1 | 4.20 | 0.5 | 0.15 | 93 | 22.5 | 1.8 | 0.05 |
| Example 36 | P-13 | 10 | PAG-1 | −0.22 | 0.5 | PB-1 | 4.20 | 0.5 | 0.14 | 93 | 22.5 | 1.9 | 0.05 |
| Example 37 | P-13 | 10 | PAG-1 | −0.22 | 2.5 | PB-1 | 4.20 | 0.5 | 0.16 | 93 | 22.5 | 1.7 | 0.05 |
| Example 38 | P-14 | 10 | PAG-1 | −0.22 | 1.5 | PB-1 | 4.20 | 0.5 | 0.16 | 221 | 22.5 | 1.6 | 0.05 |
| Example 39 | P-15 | 10 | PAG-1 | −0.22 | 1.5 | PB-1 | 4.20 | 0.5 | 0.14 | 114 | 22.5 | 1.5 | 0.05 |
| Example 40 | P-16 | 10 | PAG-1 | −0.22 | 1.5 | PB-1 | 4.20 | 0.5 | 0.15 | 241 | 18.0 | 1.7 | 0.05 |
| Example 41 | P-17 | 10 | PAG-1 | −0.22 | 1.5 | PB-1 | 4.20 | 0.5 | 0.13 | 133 | 18.0 | 1.5 | 0.05 |
| Example 42 | P-18 | 10 | PAG-1 | −0.22 | 1.5 | PB-1 | 4.20 | 0.5 | 0.12 | 135 | 18.0 | 1.5 | 0.05 |
| Comparative Example 1 | RP-1 | 10 | PAG-1 | −0.22 | 1.5 | PB-1 | 4.20 | 0.5 | 0.10 | 117 | 90.0 | 5.0 | 0.05 |
| Comparative Example 2 | P-1 | 10 | RPAG-1 | −3.45 | 1.5 | PB-1 | 4.20 | 0.5 | 0.10 | 116 | 5.0 | 7.0 | 5.00 |
| Comparative Example 3 | P-1 | 10 | PAG-1 | −0.22 | 1.5 | RPB-1 | 1.75 | 0.5 | 0.10 | 116 | Unresolved | Unresolved | Unresolved |
| Comparative Example 4 | P-1 | 10 | PAG-1 | −0.22 | 1.5 | Q-1 | — | 0.5 | 0.10 | 116 | 45.0 | 6.0 | 0.05 |
| Comparative Example 5 | P-1 | 10 | PAG-1 | −0.22 | 1.5 | Q-2 | — | 0.5 | 0.10 | 116 | 45.0 | 6.0 | 0.30 |

As shown in the table, it was confirmed that a pattern having excellent LER performance is obtained and a change in the line width of a pattern by post-exposure delay can be suppressed by using the resist composition of the embodiment of the present invention.

Furthermore, it was confirmed that in a case where the resin has a repeating unit represented by General Formula (1), the sensitivity of the resist film is excellent (comparison of Examples 1 and 2 vs. the other Examples).

It was confirmed that in a case where the resin further had the repeating unit represented by General Formula (2), the sensitivity of the resist film was more excellent (comparison of Example 4 vs. Example 3, and the like).

It was confirmed that in a case where the resin used has a repeating unit having a fluorine atom, the LER performance of the pattern is more excellent (the results of Examples 5, 6, and 35 to 42).

It was confirmed that in a case where the resin used has a repeating unit having a fluorine atom and the repeating unit has a hexafluoroisopropanol group, the LER performance of the pattern is more excellent (comparison of Examples 6, and 35 to 42 vs. Example 5).

It was confirmed that in a case where the resin used has a repeating unit having a group having a lactone structure, the LER performance of the pattern is more excellent (the results of Examples 7 to 9, 38, 39, 41, and 42).

It was confirmed that in a case where the resin used has a repeating unit having a phenolic hydroxyl group and the content of the repeating unit having a phenolic hydroxyl group in the resin is 45% to 65% by mole with respect to all the repeating units of the resin, the LER performance of the pattern is more excellent (comparison of Example 3 vs. Example 10).

It was confirmed that in a case where the weight-average molecular weight (Mw) of the resin used is in the range of 4,000 to 8,000, the LER performance of the pattern is more excellent (comparison of Example 3 vs. Example 11).

It was confirmed that in a case where the dispersity (Mw/Mn) of the resin used is in the range of 1.0 to 1.4, the LER performance of the pattern is more excellent (comparison of Example 12 vs. Example 3).

It was confirmed that in a case where the A value of the resin used is 0.12 or more (more preferably 0.15 or more, and still more preferably 0.16 or more), the LER performance of the pattern is more excellent (the results of Examples 6, and 35 to 42).

It was confirmed that in a case where the Tg of the resin used is high, the LER performance of the pattern tends to be more excellent (for example, comparison of Example 37 vs. Example 38, comparison of Example 36 vs. Example 39, and comparison of Example 35 vs. Example 40).

It was confirmed that in a case where the acid generated by the first photoacid generator used is benzenesulfonic acid, the LER performance of the pattern is more excellent (for example, comparison of Examples 13, 14, and 18 vs. Examples 3, 15, 16, and 17).

It was confirmed that in a case where the anion of the first photoacid generator used has a cyclic acetal structure, the LER performance of the pattern is more excellent (comparison of Example 17 vs. Examples 3, 15, and 16, and comparison of Example 18 vs. Examples 13 and 14).

In a case where the acid generated by the second photoacid generator used is benzenecarboxylic acid, it was confirmed that the LER performance of the pattern is more excellent (comparison of Example 19 vs. Examples 3, and 20 to 34).

It was confirmed that in a case where the benzenecarboxylic acid of the second photoacid generator used has a fluorine atom, the LER performance of the pattern is more excellent (comparison of Examples 20 to 34 vs. Examples 3 and 19).

In addition, it was confirmed that in a case where the second photoacid generator used is the compound represented by General Formula (F), the LER performance of the pattern is more excellent (comparison of Example 20 vs. Examples 21 to 34).

It was confirmed that in a case where the number of fluorine atoms contained in the anion of the compound represented by General Formula (F) is 6 to 9, the LER performance of the pattern is more excellent (comparison of Examples 23 and 24 vs. Examples 21, 22, and 25 to 34).

It was confirmed that in a case where the cation of the compound represented by General Formula (F) is a triarylsulfonium cation, the sensitivity of the resist film is more excellent (comparison of Examples 21, 22, 24 to 29, 32, and 33 vs. Examples 23, 30, 31, and 34).

Example Y

The resist composition of the embodiment of the present invention was tested as follows and evaluated. Examples and Comparative Examples which will be described later are collectively referred to as Example Y.

[Resist Composition]

Various components included in the resist compositions used in Examples or Comparative Examples of Example Y are shown below.

<Resin>

The following resins were used as the resin having an acid-decomposable group.

(Resin (A2-1))

A ratio (70/30) described in the following structural formula indicates a compositional ratio (molar ratio) of the respective repeating units.

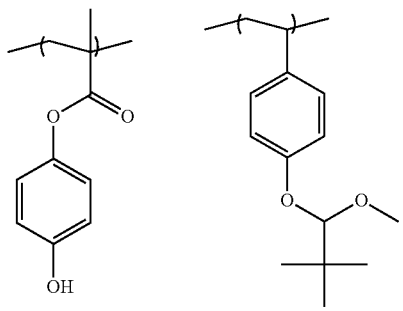

A2-1

70/30
Mw = 6500
Mw/Mn = 1.59

<First Photoacid Generator>

The same first photoacid generator as the first photoacid generator shown in Example X was used.

<Second Photoacid Generator>

The same second photoacid generator as the second photoacid generator shown in Example X was used.

<Basic Compound>

The same basic compound as the basic compound shown in Example X was used.

<Crosslinking Agent>

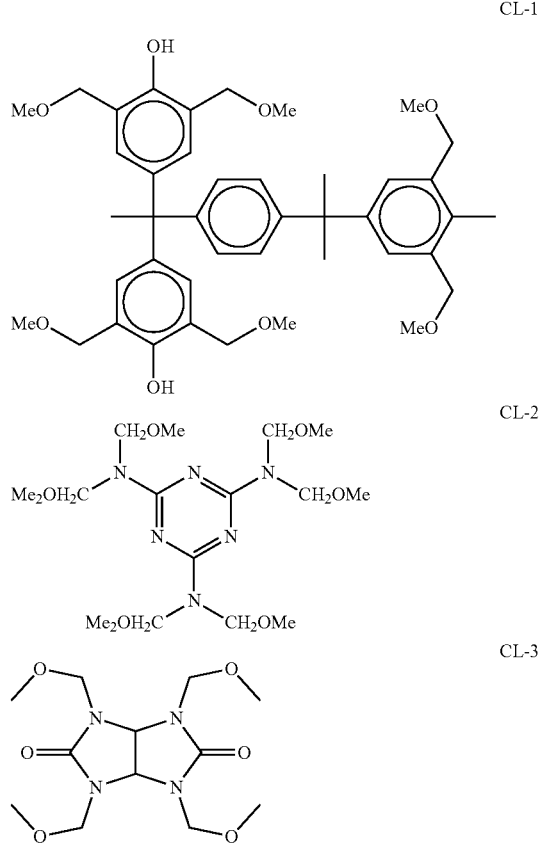

CL-1

CL-2

CL-3

<Surfactant>
W-1: MEGAFACE F176 (manufactured by DIC Corp.) (fluorine-based)
W-2: MEGAFACE R08 (manufactured by DIC Corp.) (fluorine-based and silicon-based)
W-3: PF6320 (manufactured by OMNOVA Solutions Inc.: fluorine-based)
W-4: TROYSOL S-366 (manufactured by Troy Chemical Corp.) (silicon-based)
W-5: Polysiloxane Polymer KP-341 (manufactured by Shin-Etsu Chemical Co., Ltd.) (silicon-based)
<Solvent>
S: Propylene glycol monomethyl ether acetate (PGMEA)
S2: Cyclohexanone
S3: γ-Butyrolactone
B1: Propylene glycol monomethyl ether (PGME)
B2: Ethyl lactate
<Preparation of Resist Composition>

The respective components shown in the table described in the next section were dissolved in a solvent to prepare a solution having a concentration of the solid content of 4.0% by mass. Subsequently, the obtained solution was filtered through a polytetrafluoroethylene filter having a pore size of 0.05 μm to prepare a resist composition.

With regard to the respective components in the table, a ratio thereof in a case of using a plurality of the components is a "mass ratio".

The contents of the respective components in the resist composition are as described in the section following the section describing the classification of the respective components.

In addition, "*1" described as the content of the solvent is intended to indicate that the resist composition includes a solvent in an amount such that the concentration of the solid content (4.0% by mass) is obtained.

With regard to the obtained resist composition, the performance was evaluated by various methods shown below and the results are shown below.

Examples 1 to 15 and Comparative Examples 1 to 3

(Exposure Condition: Exposure of Electron Beams (EB), Alkali Development, and Negative-Tone Pattern)

The prepared resist composition was uniformly applied onto a silicon substrate which had been in the state where the substrate was stopped, which had been subjected to a hexamethyldisilazane treatment, using a spin coater. Subsequently, drying under heating was performed on a hot plate at 120° C. for 90 seconds to form a resist film having a film thickness of 60 nm. The obtained resist film was irradiated with electron beams through a 6% half-tone mask having a 1:1 line-and-space pattern with a line width of 50 nm, using an electron beam irradiating apparatus (HL750 manufactured by Hitachi High Technologies Corporation, accelerating voltage of 50 keV). After the irradiation, the resist film was heated at 11 (PC for 60 seconds on a hot plate. In addition, the resist film was developed with an aqueous tetramethylammonium hydroxide solution at a concentration of 2.38% by mass at 23° C. for 60 seconds, rinsed with pure water for 30 seconds, and then spin-dried to form a negative-tone pattern.

<Sensitivity>

The cross-sectional shape of the obtained pattern was observed using a scanning electron microscope (S-4300 manufactured by Hitachi High Technologies Corporation). The exposure dose (amount of electron beams irradiated) upon resolution of a 1:1 line-and-space resist pattern with a line width of 50 nm was taken as a sensitivity. A smaller value thereof indicates a higher sensitivity.

Moreover, the LER performance and the change in the line width of a pattern by post-exposure delay were evaluated by the same method as shown in Example X.

The test results of Examples 1 to 15 and Comparative Examples 1 to 3 are shown in the following table.

TABLE 3

EB exposure/alkali development/evaluation results at negative tone

| | Resist composition | | | | | | Evaluation | | |
|---|---|---|---|---|---|---|---|---|---|
| | First photoacid generator 1 g | Resin 10 g | Second photoacid generator (or basic substance) 0.2 g | Crosslinking agent 3.0 g | Solvent *1 | Surfactant 10 mg | Sensitivity (mJ/cm$^2$) | LER (nm) | Change in line width (nm |
| Example 1 | PAG-1 | A2-1 | PB-4 | CL-1 | S1/S2 (7/3) | W-1 | 32.3 | 2.7 | 0.10 |
| Example 2 | PAG-1 | A2-1 | PB-5 | CL-2 | S1/S2 (7/3) | W-2 | 33.3 | 2.5 | 0.10 |
| Example 3 | PAG-3 | A2-1 | PB-6 | CL-1 | S1/S2 (7/3) | W-1 | 38.0 | 3.7 | 0.10 |
| Example 4 | PAG-1 | A2-1 | PB-7 | CL-1 | S1/S2/S3 (7/2/1) | W-1 | 33.3 | 3.5 | 0.10 |
| Example 5 | PAG-1 | A2-1 | PB-8 | CL-2 | S1/S3 (7/3) | W-1 | 34.3 | 2.8 | 0.10 |
| Example 6 | PAG-1 | A2-1 | PB-9 | CL-1/CL-3 (1/1) | S1/S2 (7/3) | W-1 | 33.3 | 2.9 | 0.10 |
| Example 7 | PAG-5 | A2-1 | PB-10 | CL-1 | S1/S2 (7/3) | W-1 | 33.1 | 2.6 | 0.10 |
| Example 8 | PAG-6 | A2-1 | PB-11 | CL-1 | S1/B2 (6/4) | — | 33.1 | 2.5 | 0.10 |
| Example 9 | PAG-1 | A2-1 | PB-12 | CL-1 | S1/S2 (7/3) | W-2 | 33.4 | 2.6 | 0.10 |
| Example 10 | PAG-1 | A2-1 | PB-13 | CL-1 | S1/S2 (7/3) | W-4 | 38.1 | 2.8 | 0.10 |
| Example 11 | PAG-1 | A2-1 | PB-14 | CL-1 | S1/S2 (7/3) | W-2 | 37.1 | 2.6 | 0.10 |
| Example 12 | PAG-1 | A2-1 | PB-15 | CL-1 | S1/S2 (7/3) | W-1 | 34.2 | 2.7 | 0.10 |
| Example 13 | PAG-1 | A2-1 | PB-16 | CL-2 | S1/B1 (7/3) | W-3 | 33.3 | 2.7 | 0.10 |
| Example 14 | PAG-1 | A2-1 | PB-17 | CL-3 | S1/S2 (7/3) | W-5 | 37.2 | 3.0 | 0.20 |
| Example 15 | PAG-1 | A2-1 | PB-4/PB-5 (1/1) | CL-1 | SI/S2 (7/3) | W-1 | 33.3 | 2.6 | 0.10 |
| Comparative Example 1 | PAG-1 | A1-1 | RPB-1 | CL-1 | S1/S2 (7/3) | W-1 | — | — | — |
| Comparative Example 2 | RPAG-1 | A2-1 | PB-4 | CL-1 | S1/S2 (7/3) | W-1 | 34.0 | 5.4 | 6.00 |
| Comparative Example 3 | PAG-1 | A2-1 | Q-2 | CL-1 | S1/S2 (7/3) | W-1 | 49.1 | 6.2 | 0.20 |

From the results shown in able 3, it was confirmed that even in a case where a negative-tone pattern is formed through exposure with electron beams, the resist composition of the embodiment of the present invention provides a pattern having excellent LER performance and is capable of suppressing a change in the line width of a pattern by post-exposure delay.

It was confirmed that the second photoacid generator used is the compound represented by General Formula (F) and the number of fluorine atoms contained in the anion of the compound represented by General Formula (F) is 6 to 9, the LER performance of the pattern is more excellent (comparison of Examples 3 and 4 vs. other Examples).

It was confirmed that in a case where the cation of the compound represented by General Formula (F) is a triarylsulfonium cation, the sensitivity of the resist film is more excellent (comparison of Examples 3, 10, 11, and 14 vs. other Examples).

What is claimed is:

1. An actinic ray-sensitive or radiation-sensitive resin composition comprising:
    a resin having a repeating unit having a group in which a phenolic hydroxyl group is protected with an acid-leaving group and a repeating unit having a lactone structure;
    a first photoacid generator that generates an acid having a pKa of −2.00 to 2.00, in which in a case where the acid thus generated is a carboxylic acid, a pKa of the carboxylic acid is −2.00 or more and less than 1.00;
    a second photoacid generator that generates a carboxylic acid having a pKa of 1.00 or more,
    wherein the second photoacid generator is a photoacid generator that generates benzenecarboxylic acid having a substituent which is a fluorine atom or a group including a fluorine atom, and
    the first photoacid generator is formed of an anion and a cation, and the anion has a cyclic acetal structure.

2. The actinic ray-sensitive or radiation-sensitive resin composition according to claim 1,
    wherein the repeating unit having a group in which a phenolic hydroxyl group is protected with an acid-leaving group is a repeating unit represented by General Formula (1),

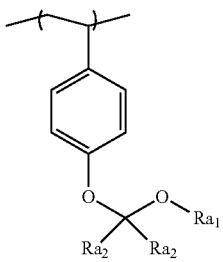

(1)

in General Formula (1), $Ra_1$ represents an alkyl group which may have a substituent, and
$Ra_2$'s each independently represent a hydrogen atom or an alkyl group which may have a substituent.

3. The actinic ray-sensitive or radiation-sensitive resin composition according to claim 1,
    wherein the repeating unit having a group in which a phenolic hydroxyl group is protected with an acid-leaving group is a repeating unit represented by General Formula (2),

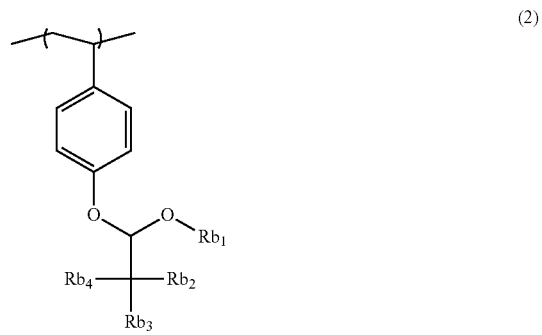

(2)

in General Formula (2), $R_{b1}$ to $R_{b4}$ each independently represent an alkyl group which may have a substituent.

4. The actinic ray-sensitive or radiation-sensitive resin composition according to claim 1,
    wherein the resin further has a repeating unit having a fluorine atom.

5. The actinic ray-sensitive or radiation-sensitive resin composition according to claim 4,
    wherein the repeating unit having a fluorine atom has a hexafluoroisopropanol group.

6. The actinic ray-sensitive or radiation-sensitive resin composition according to claim 1,
    wherein the first photoacid generator is a photoacid generator that generates benzenesulfonic acid which may have a substituent.

7. The actinic ray-sensitive or radiation-sensitive resin composition according to claim 1,
    wherein the second photoacid generator is a compound represented by General Formula (F), formed of an anion and a cation,

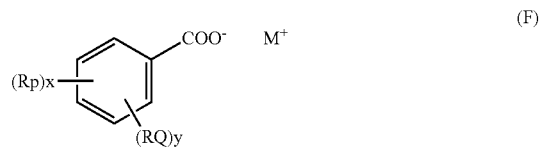

(F)

in General Formula (F), Rp represents a fluorine atom or a group including a fluorine atom, and in a case where there are a plurality of Rp's, Rp's may be the same as or different from each other,
Rq represents a group having no fluorine atom, and in a case where there are a plurality of Rq's, Rq's may be the same as or different from each other,
x represents an integer of 1 to 5,
y represents an integer of 0 to (5-x),
$M^+$ represents a cation, and
a total number of fluorine atoms contained in the anion in the compound represented by General Formula (F) is 6 or more.

8. The actinic ray-sensitive or radiation-sensitive resin composition according to claim 7,
    wherein $M^+$ is a sulfonium cation or an iodonium cation.

9. The actinic ray-sensitive or radiation-sensitive resin composition according to claim 8,
    wherein $M^+$ is a triarylsulfonium cation.

10. The actinic ray-sensitive or radiation-sensitive resin composition according to claim 7,
    wherein Rp represents a fluorine atom or a perfluoroalkyl group, and Rq represents an alkyl group having 1 to 20 carbon atoms, an alkoxy group having 1 to 20 carbon atoms, a carboxyl group, a hydroxyl group, or a halogen atom other than a fluorine atom.

11. A resist film formed with the actinic ray-sensitive or radiation-sensitive resin composition according to claim 1.

12. A pattern forming method comprising:
   forming a resist film with the actinic ray-sensitive or radiation-sensitive resin composition according to claim 1;
   exposing the resist film;
   heating the exposed resist film; and
   developing the heated resist film with a developer.

13. A method for manufacturing an electronic device, the method comprising the pattern forming method according to claim 12.

* * * * *